US011417720B2

(12) United States Patent
Kimura

(10) Patent No.: US 11,417,720 B2
(45) Date of Patent: Aug. 16, 2022

(54) DISPLAY DEVICE INCLUDING N-CHANNEL TRANSISTOR INCLUDING POLYSILICON

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/926,878

(22) Filed: Jul. 13, 2020

(65) Prior Publication Data
US 2020/0350391 A1    Nov. 5, 2020

Related U.S. Application Data

(63) Continuation of application No. 15/996,704, filed on Jun. 4, 2018, now abandoned, which is a continuation
(Continued)

(30) Foreign Application Priority Data

Dec. 2, 2005 (JP) ............................ 2005-349165

(51) Int. Cl.
*H01L 27/32* (2006.01)
*G09G 3/3233* (2016.01)
(Continued)

(52) U.S. Cl.
CPC ....... *H01L 27/3276* (2013.01); *G09G 3/3233* (2013.01); *H01L 27/1255* (2013.01);
(Continued)

(58) Field of Classification Search
CPC ............. H01L 27/3276; H01L 27/1255; H01L 29/78669; H01L 29/78678; H01L 27/15;
(Continued)

(56) References Cited

U.S. PATENT DOCUMENTS 5,684,365 A    11/1997 Tang et al.
5,956,011 A    9/1999 Koyama et al.
(Continued)

FOREIGN PATENT DOCUMENTS

CN    001573886 A    2/2005
EP    0717446 A    6/1996
(Continued)

OTHER PUBLICATIONS

Jung.J et al., "A 14.1 inch Full color AMOLED Display With Top Emission Structure and a-Si TFT Backplane", SID Digest '05 : SID International Symposium Digest of Technical Papers, 2005, vol. 36, pp. 1538-1541.
(Continued)

*Primary Examiner* — Mohammad M Hoque
(74) *Attorney, Agent, or Firm* — Fish & Richardson P.C.

(57) ABSTRACT

A load, a transistor which controls a current value supplied to the load, a capacitor, a power supply line, and first to third switches are provided. After a threshold voltage of the transistor is held by the capacitor, a potential in accordance with a video signal is inputted and a voltage that is the sum of the threshold voltage and the potential is held. Accordingly, variation in current value caused by variation in threshold voltage of the transistor can be suppressed. Therefore, a desired current can be supplied to a load such as a light emitting element. In addition, a display device with a high duty ratio can be provided by changing a potential of the power supply line.

11 Claims, 49 Drawing Sheets

Related U.S. Application Data of application No. 14/541,255, filed on Nov. 14, 2014, now Pat. No. 9,997,584, which is a continuation of application No. 13/691,286, filed on Nov. 30, 2012, now Pat. No. 8,890,180, which is a continuation of application No. 11/562,678, filed on Nov. 22, 2006, now Pat. No. 8,325,111.

(51) Int. Cl.
  *H01L 27/15* (2006.01)
  *H01L 27/12* (2006.01)
  *H01L 29/786* (2006.01)
  *G09G 3/20* (2006.01)

(52) U.S. Cl.
  CPC ........ *H01L 27/15* (2013.01); *H01L 29/78669* (2013.01); *H01L 29/78678* (2013.01); *G09G 3/2022* (2013.01); *G09G 2300/0819* (2013.01); *G09G 2300/0842* (2013.01); *G09G 2300/0861* (2013.01); *G09G 2300/0866* (2013.01); *G09G 2310/0251* (2013.01); *G09G 2310/0256* (2013.01); *G09G 2320/02* (2013.01); *G09G 2320/0219* (2013.01); *G09G 2320/0233* (2013.01); *G09G 2320/0261* (2013.01); *G09G 2320/043* (2013.01); *H01L 27/3244* (2013.01)

(58) Field of Classification Search
  CPC .............. H01L 27/3244; G09G 3/3233; G09G 2320/0233; G09G 3/2022; G09G 2300/0819; G09G 2300/0842; G09G 2300/0861; G09G 2300/0866; G09G 2310/0251; G09G 2310/0256; G09G 2320/02; G09G 2320/0219; G09G 2320/0261; G09G 2320/043
  USPC .................................................... 257/88, 99
  See application file for complete search history.

(56) References Cited

U.S. PATENT DOCUMENTS

| | | | |
|---|---|---|---|
| 6,037,924 A | 3/2000 | Koyama et al. | |
| 6,229,508 B1 | 5/2001 | Kane | |
| 6,310,598 B1 | 10/2001 | Koyama et al. | |
| 6,587,086 B1* | 7/2003 | Koyama | G09G 3/2077 |
| | | | 345/77 |
| 6,608,613 B2 | 8/2003 | Koyama et al. | |
| 6,611,107 B2 | 8/2003 | Mikami et al. | |
| 6,693,257 B1* | 2/2004 | Tanaka | B23K 26/0608 |
| | | | 219/121.76 |
| 6,693,383 B2 | 2/2004 | Bae et al. | |
| 6,714,178 B2 | 3/2004 | Koyama et al. | |
| 6,737,813 B2 | 5/2004 | Kawasaki et al. | |
| 6,765,549 B1* | 7/2004 | Yamazaki | G09G 3/3266 |
| | | | 345/80 |
| 6,839,057 B2 | 1/2005 | Iguchi | |
| 6,872,973 B1* | 3/2005 | Koyama | G09G 3/2022 |
| | | | 257/59 |
| 6,897,482 B2 | 5/2005 | Morita et al. | |
| 6,928,136 B2 | 8/2005 | Nagao et al. | |
| 6,958,750 B2 | 10/2005 | Azami et al. | |
| 6,975,142 B2 | 12/2005 | Azami et al. | |
| 7,042,426 B2 | 5/2006 | Shin | |
| 7,068,076 B2 | 6/2006 | Azami | |
| 7,091,667 B2 | 8/2006 | Sakaguchi et al. | |
| 7,129,917 B2 | 10/2006 | Yamazaki et al. | |
| 7,133,012 B2 | 11/2006 | Abe | |
| 7,148,884 B2 | 12/2006 | Kasai | |
| 7,151,278 B2 | 12/2006 | Nagao et al. | |
| 7,173,590 B2 | 2/2007 | Uchino et al. | |
| 7,205,965 B2 | 4/2007 | Mikami et al. | |
| 7,230,591 B2 | 6/2007 | Inukai | |
| 7,242,376 B2 | 7/2007 | Yamashita et al. | |
| 7,274,345 B2 | 9/2007 | Imamura et al. | |
| 7,319,443 B2 | 1/2008 | Kimura et al. | |
| 7,327,357 B2 | 2/2008 | Jeong | |
| 7,332,385 B2 | 2/2008 | Nakazawa et al. | |
| 7,365,742 B2 | 4/2008 | Kim et al. | |
| 7,382,342 B2 | 6/2008 | Uchino et al. | |
| 7,411,318 B2 | 8/2008 | Kimura | |
| 7,443,367 B2 | 10/2008 | Numao | |
| 7,502,001 B2 | 3/2009 | Fish et al. | |
| 7,532,209 B2 | 5/2009 | Kimura | |
| 7,564,433 B2 | 7/2009 | Hector et al. | |
| 7,605,789 B2 | 10/2009 | Uchino et al. | |
| 7,626,199 B2 | 12/2009 | Kim | |
| 7,714,813 B2 | 5/2010 | Uchino et al. | |
| 7,714,815 B2 | 5/2010 | Kim et al. | |
| 7,738,014 B2 | 6/2010 | Kwak et al. | |
| 7,817,117 B2 | 10/2010 | Kimura | |
| 7,821,008 B2 | 10/2010 | Nakazawa | |
| 7,843,408 B2 | 11/2010 | Yamazaki et al. | |
| 7,876,294 B2 | 1/2011 | Sasaki et al. | |
| 7,924,244 B2 | 4/2011 | Kimura et al. | |
| 7,982,696 B2 | 7/2011 | Kimura | |
| 8,049,743 B2 | 11/2011 | Kang | |
| 8,077,266 B2 | 12/2011 | Nakamura et al. | |
| 8,159,479 B2 | 4/2012 | Uchino et al. | |
| 8,164,547 B2 | 4/2012 | Kimura | |
| 8,242,988 B2 | 8/2012 | Yamazaki et al. | |
| 8,289,472 B2 | 10/2012 | Chung et al. | |
| 8,314,514 B2 | 11/2012 | Kimura | |
| 8,441,417 B2 | 5/2013 | Uchino et al. | |
| 8,497,823 B2 | 7/2013 | Kimura et al. | |
| 8,519,918 B2 | 8/2013 | Sasaki et al. | |
| 8,570,256 B2 | 10/2013 | Yamazaki et al. | |
| 8,698,356 B2 | 4/2014 | Kimura | |
| 8,994,622 B2 | 3/2015 | Kimura et al. | |
| 9,368,526 B2 | 6/2016 | Kimura | |
| 9,450,036 B2 | 9/2016 | Kimura et al. | |
| 9,741,749 B2 | 8/2017 | Kimura | |
| 10,355,068 B2 | 7/2019 | Kimura et al. | |
| 10,535,684 B2 | 1/2020 | Kimura | |
| 2001/0002703 A1* | 6/2001 | Koyama | H01L 27/1214 |
| | | | 257/40 |
| 2001/0024186 A1 | 9/2001 | Kane et al. | |
| 2001/0028060 A1* | 10/2001 | Yamazaki | G09G 3/3233 |
| | | | 257/72 |
| 2001/0038098 A1* | 11/2001 | Yamazaki | H01L 27/3211 |
| | | | 257/72 |
| 2001/0048408 A1* | 12/2001 | Koyama | G09G 3/3648 |
| | | | 345/76 |
| 2002/0000551 A1 | 1/2002 | Yamazaki et al. | |
| 2003/0057895 A1 | 3/2003 | Kimura | |
| 2003/0090481 A1 | 5/2003 | Kimura | |
| 2003/0103022 A1 | 6/2003 | Noguchi et al. | |
| 2003/0112205 A1 | 6/2003 | Yamada | |
| 2003/0117352 A1 | 6/2003 | Kimura | |
| 2003/0132931 A1 | 7/2003 | Kimura et al. | |
| 2003/0137503 A1 | 7/2003 | Kimura et al. | |
| 2003/0156084 A1 | 8/2003 | Tsuchiya et al. | |
| 2003/0173564 A1 | 9/2003 | Ko et al. | |
| 2003/0214245 A1 | 11/2003 | Yamazaki et al. | |
| 2004/0051690 A1 | 3/2004 | Chang | |
| 2004/0080474 A1 | 4/2004 | Kimura | |
| 2004/0095305 A1 | 5/2004 | Kimura et al. | |
| 2004/0150351 A1 | 8/2004 | Komiya et al. | |
| 2004/0174349 A1 | 9/2004 | Libsch et al. | |
| 2004/0174354 A1 | 9/2004 | Ono et al. | |
| 2004/0263506 A1* | 12/2004 | Koyama | G09G 3/3225 |
| | | | 345/204 |
| 2005/0007316 A1 | 1/2005 | Akimoto et al. | |
| 2005/0007318 A1 | 1/2005 | Kasai et al. | |
| 2005/0035415 A1 | 2/2005 | Yeo et al. | |
| 2005/0067970 A1 | 3/2005 | Libsch et al. | |
| 2005/0093804 A1 | 5/2005 | Yamazaki et al. | |
| 2005/0121703 A1 | 6/2005 | Hieda et al. | |
| 2005/0134189 A1 | 6/2005 | Osame et al. | |
| 2005/0243079 A1 | 11/2005 | Ozaki | |
| 2005/0259093 A1 | 11/2005 | Osame et al. | |
| 2006/0077134 A1 | 4/2006 | Hector et al. | |
| 2006/0082528 A1 | 4/2006 | Guo et al. | |

(56) References Cited

U.S. PATENT DOCUMENTS

| | | |
|---|---|---|
| 2006/0103324 A1 | 5/2006 | Kim et al. |
| 2006/0109225 A1 | 5/2006 | Haga et al. |
| 2006/0139253 A1 | 6/2006 | Choi et al. |
| 2006/0170628 A1 | 8/2006 | Yamashita et al. |
| 2006/0202934 A1* | 9/2006 | Shin .................. H01L 27/3276 345/95 |
| 2006/0244688 A1 | 11/2006 | Ahn et al. |
| 2006/0290613 A1 | 12/2006 | Hong et al. |
| 2007/0018206 A1 | 1/2007 | Forbes |
| 2007/0091029 A1 | 4/2007 | Uchino et al. |
| 2007/0103419 A1 | 5/2007 | Uchino et al. |
| 2007/0120810 A1 | 5/2007 | You et al. |
| 2007/0126664 A1 | 6/2007 | Kimura |
| 2007/0126665 A1 | 6/2007 | Kimura |
| 2007/0132694 A1 | 6/2007 | Uchino et al. |
| 2007/0164962 A1 | 7/2007 | Uchino et al. |
| 2007/0236424 A1 | 10/2007 | Kimura |
| 2007/0279403 A1 | 12/2007 | Uchino et al. |
| 2007/0296652 A1 | 12/2007 | Imamura et al. |
| 2008/0278425 A1 | 11/2008 | Koyama |
| 2009/0051674 A1 | 2/2009 | Kimura et al. |
| 2009/0140981 A1 | 6/2009 | Kwak et al. |
| 2010/0001983 A1 | 1/2010 | Abe |
| 2010/0073267 A1 | 3/2010 | Akimoto et al. |
| 2010/0328294 A1 | 12/2010 | Sasaki et al. |
| 2011/0024760 A1 | 2/2011 | Kimura |
| 2011/0063275 A1 | 3/2011 | Imamura et al. |
| 2011/0260170 A1 | 10/2011 | Kimura |
| 2012/0162164 A1 | 6/2012 | Uchino et al. |
| 2012/0188466 A1 | 7/2012 | Kimura |
| 2012/0327142 A1 | 12/2012 | Kimura |
| 2020/0013847 A1 | 1/2020 | Kimura et al. |
| 2020/0127019 A1 | 4/2020 | Kimura |

FOREIGN PATENT DOCUMENTS

| | | |
|---|---|---|
| EP | 1326281 A | 7/2003 |
| EP | 1331627 A | 7/2003 |
| EP | 1632930 A | 3/2006 |
| EP | 1646032 A | 4/2006 |
| EP | 1708162 A | 10/2006 |
| EP | 1793366 A | 6/2007 |
| EP | 2348502 A | 7/2011 |
| JP | 03-233431 A | 10/1991 |
| JP | 08-234683 A | 9/1996 |
| JP | 2002-190605 A | 7/2002 |
| JP | 2002-358048 A | 12/2002 |
| JP | 2003-186437 A | 7/2003 |
| JP | 2003-186438 A | 7/2003 |
| JP | 2003-224437 A | 8/2003 |
| JP | 2003-271095 A | 9/2003 |
| JP | 2003-288049 A | 10/2003 |
| JP | 2004-101767 A | 4/2004 |
| JP | 2004-280059 A | 10/2004 |
| JP | 2004-295131 A | 10/2004 |
| JP | 2004-361424 A | 12/2004 |
| JP | 2005-004173 A | 1/2005 |
| JP | 2005-017485 A | 1/2005 |
| JP | 2005-084416 A | 3/2005 |
| JP | 2005-107129 A | 4/2005 |
| JP | 2005-121843 A | 5/2005 |
| JP | 2005-164893 A | 6/2005 |
| JP | 2005-164894 A | 6/2005 |
| JP | 2005-189643 A | 7/2005 |
| JP | 2005-195756 A | 7/2005 |
| JP | 2005-202255 A | 7/2005 |
| JP | 2005189643 A * | 7/2005 |
| JP | 2005-345722 A | 12/2005 |
| JP | 2005-345723 A | 12/2005 |
| JP | 2006-113586 A | 4/2006 |
| JP | 2006-516745 | 7/2006 |
| JP | 2006-215213 A | 8/2006 |
| JP | 2006-215275 A | 8/2006 |
| JP | 2006-227237 A | 8/2006 |
| JP | 2006-227238 A | 8/2006 |
| JP | 2006-227239 A | 8/2006 |
| JP | 2006-243525 A | 9/2006 |
| JP | 2006-243526 A | 9/2006 |
| JP | 2006-251631 A | 9/2006 |
| JP | 2006-325736 A | 12/2006 |
| JP | 2007-108380 A | 4/2007 |
| JP | 2007-140318 A | 6/2007 |
| JP | 2007-179041 A | 7/2007 |
| JP | 2007-206590 A | 8/2007 |
| JP | 2008-176287 A | 7/2008 |
| KR | 2003-0094721 A | 12/2003 |
| TW | I237913 | 8/2005 |
| WO | WO-2004/021326 | 3/2004 |
| WO | WO-2004/059843 | 7/2004 |
| WO | WO-2004/066249 | 8/2004 |
| WO | WO-2004/109639 | 12/2004 |
| WO | WO-2005/055184 | 6/2005 |
| WO | WO-2008/075697 | 6/2008 |

OTHER PUBLICATIONS

Search Report (Application No. 06023935.7) dated Oct. 1, 2009.
Office Action (Application No. 200610163620.2) dated Oct. 23, 2009.
Taiwanese Office Action (Application No. 95144860) dated Feb. 4, 2013.
Chinese Office Action (Application No. 201210109159.8) dated Dec. 6, 2013.
European Office Action (Application No. 06023935.7) dated Dec. 11, 2018.
European Office Action (Application No. 06023935.7) dated May 13, 2019.

* cited by examiner

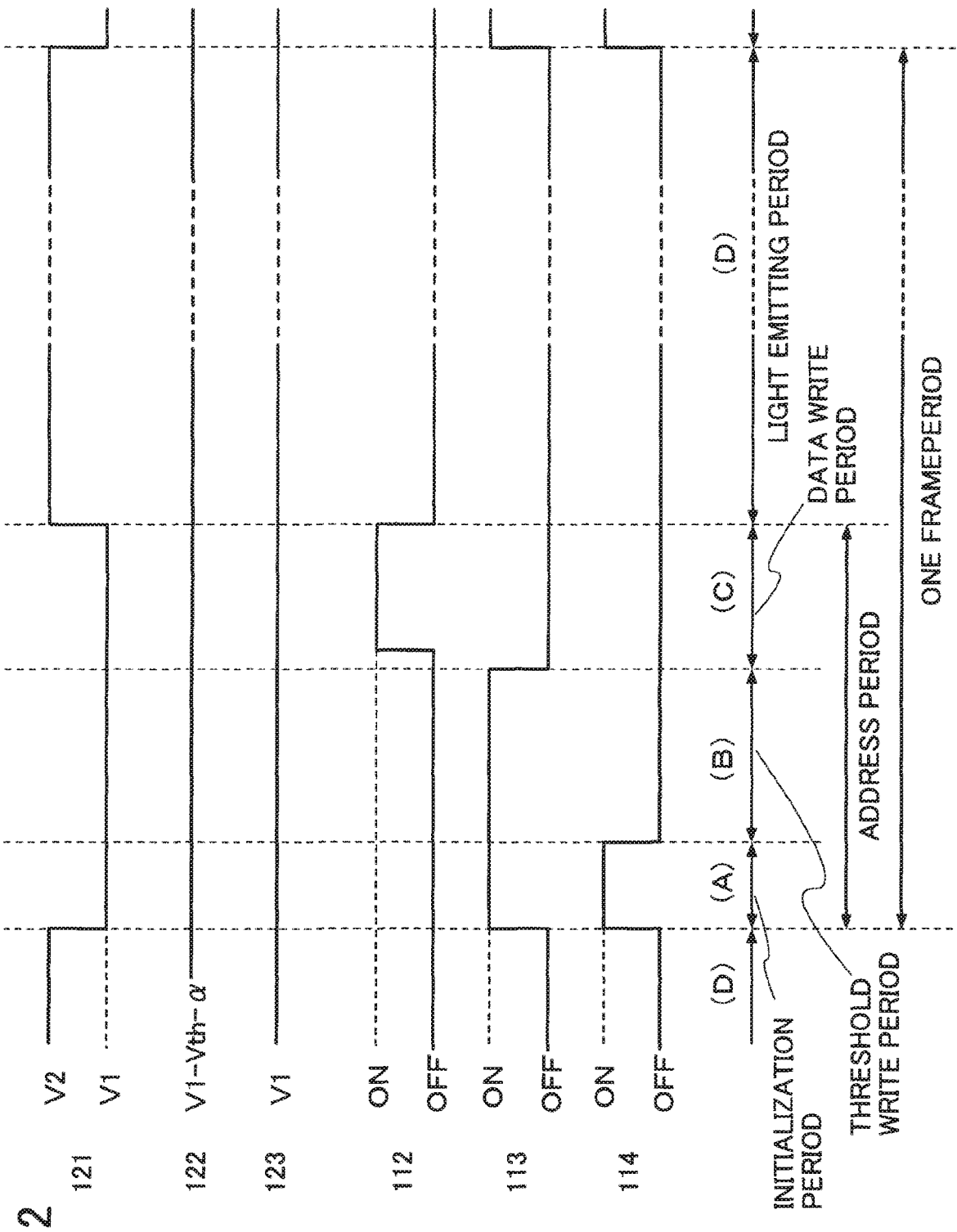

INITIALIZATION

THRESHOLD WRITE

DATA WRITE

LIGHT EMITTING

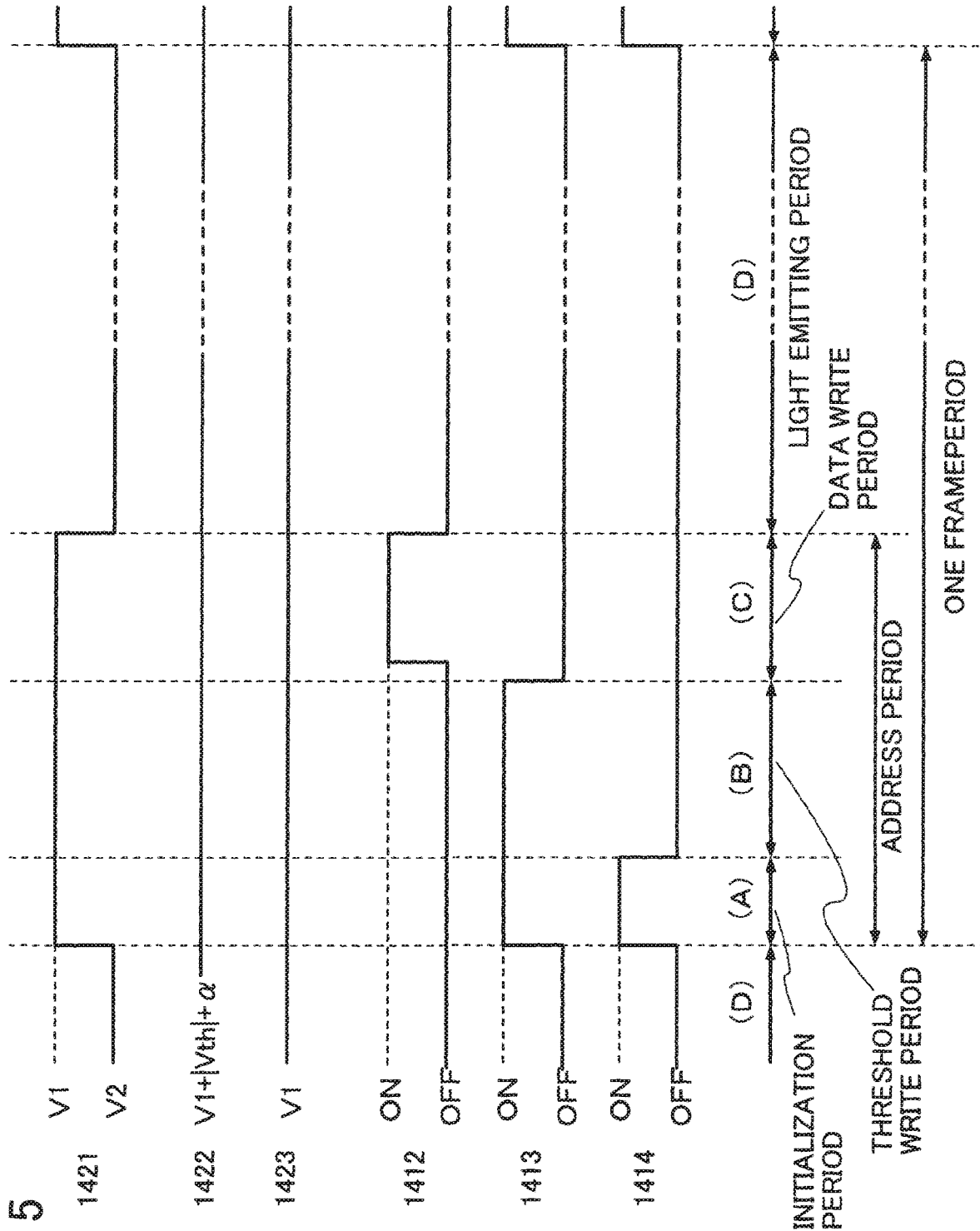

INITIALIZATION

THRESHOLD WRITE

DATA WRITE

LIGHT EMITTING

DIRECTION OF LIGHT EMISSION

DIRECTION OF LIGHT EMISSION

DIRECTION OF LIGHT EMISSION

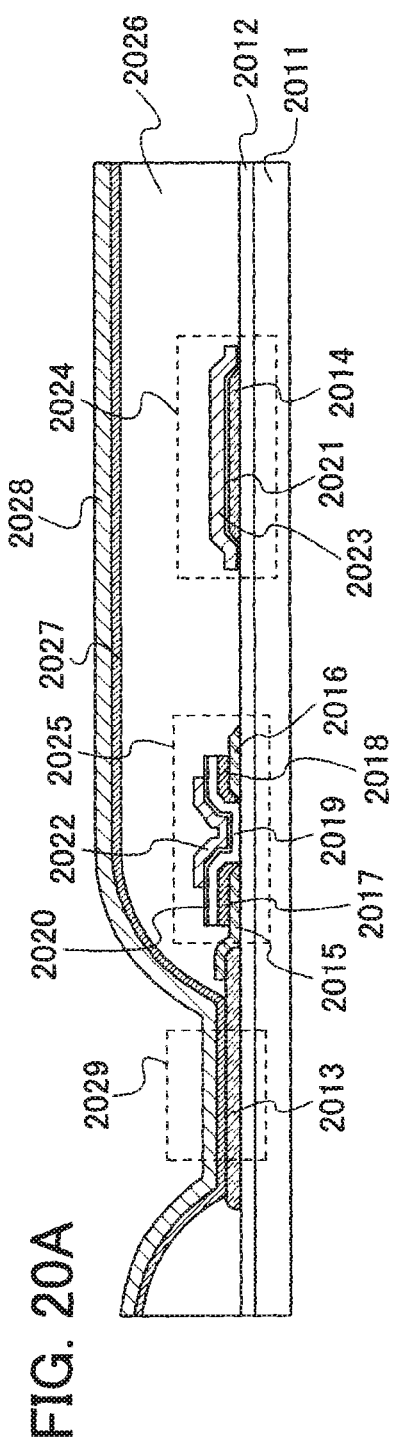
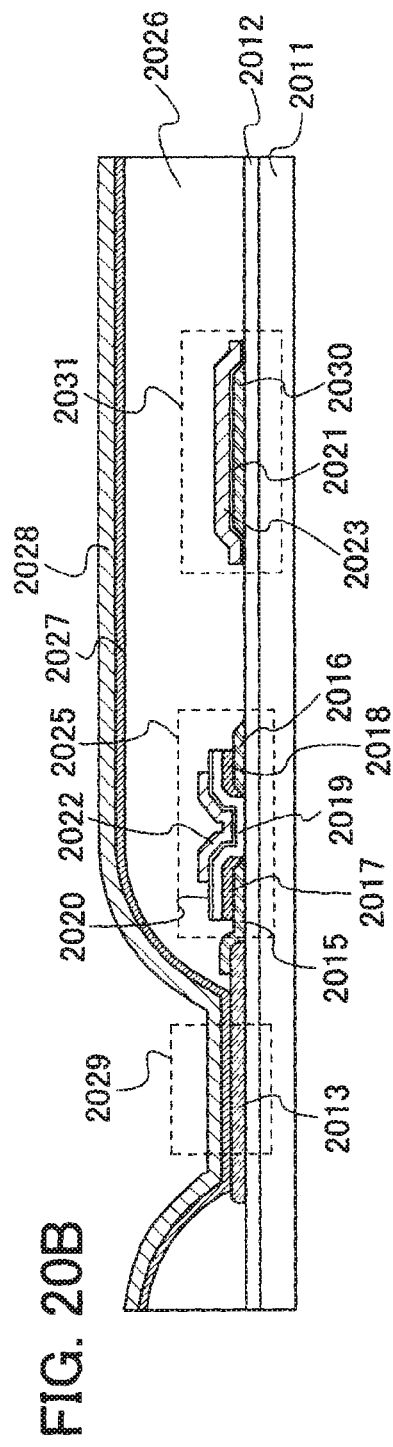

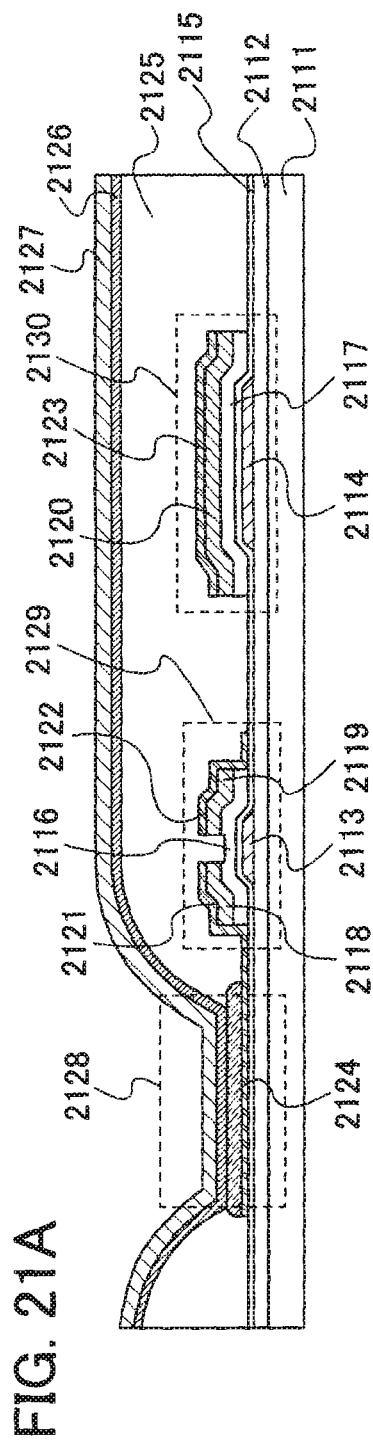
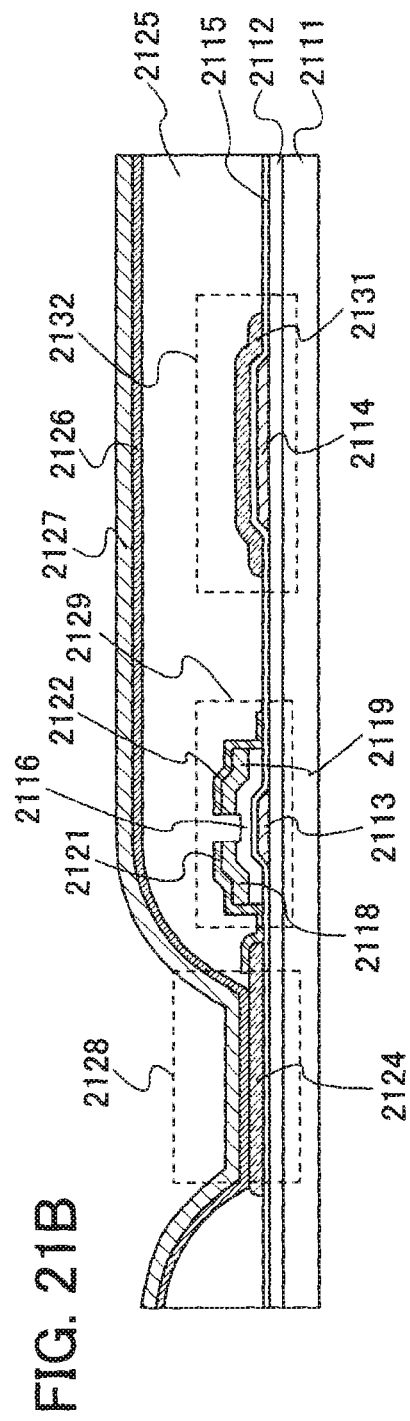

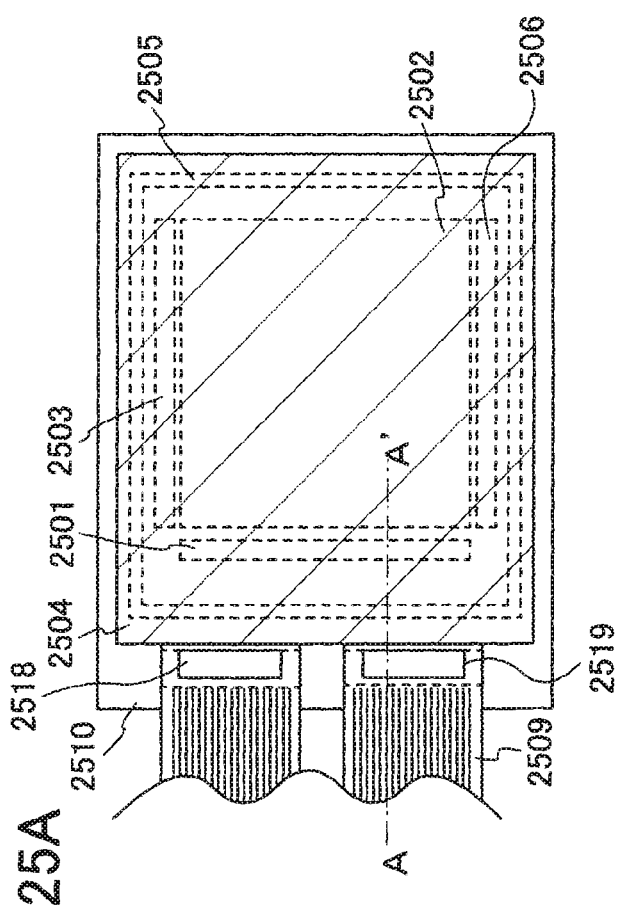
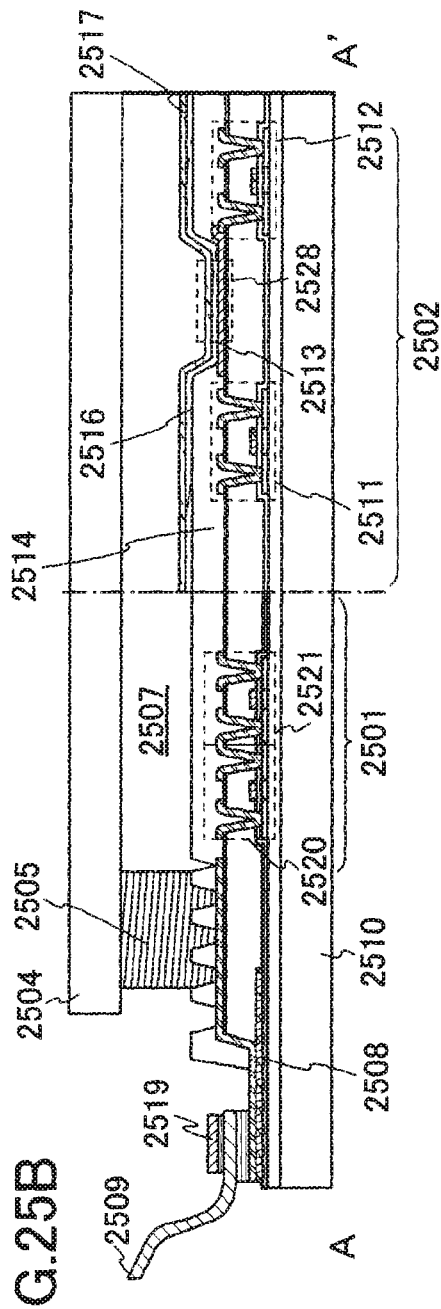
FIG.25A
FIG.25B

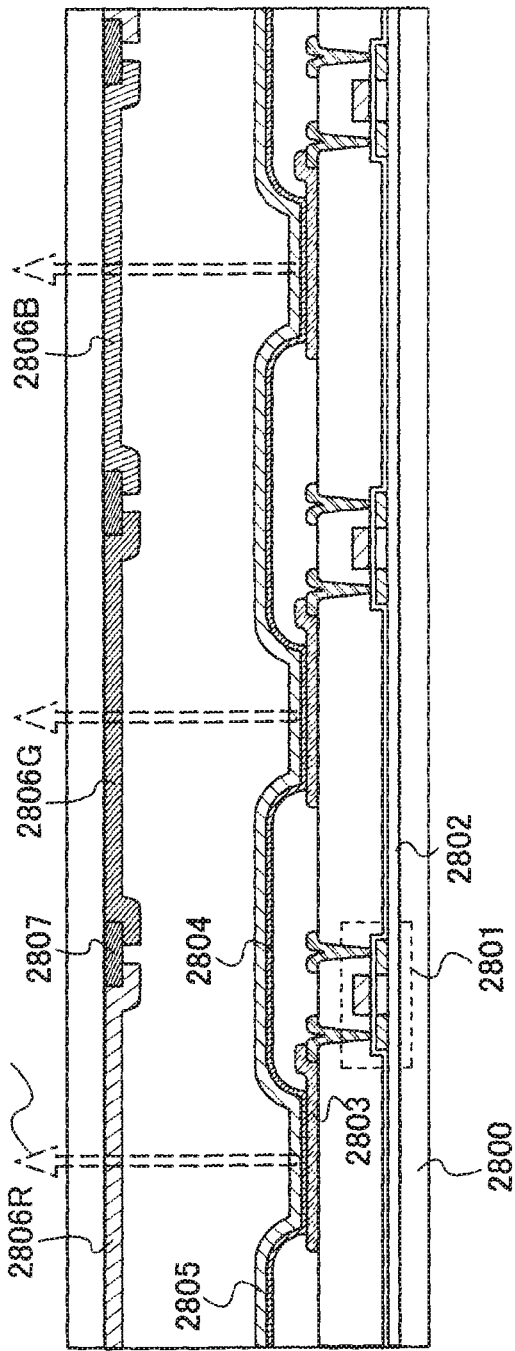

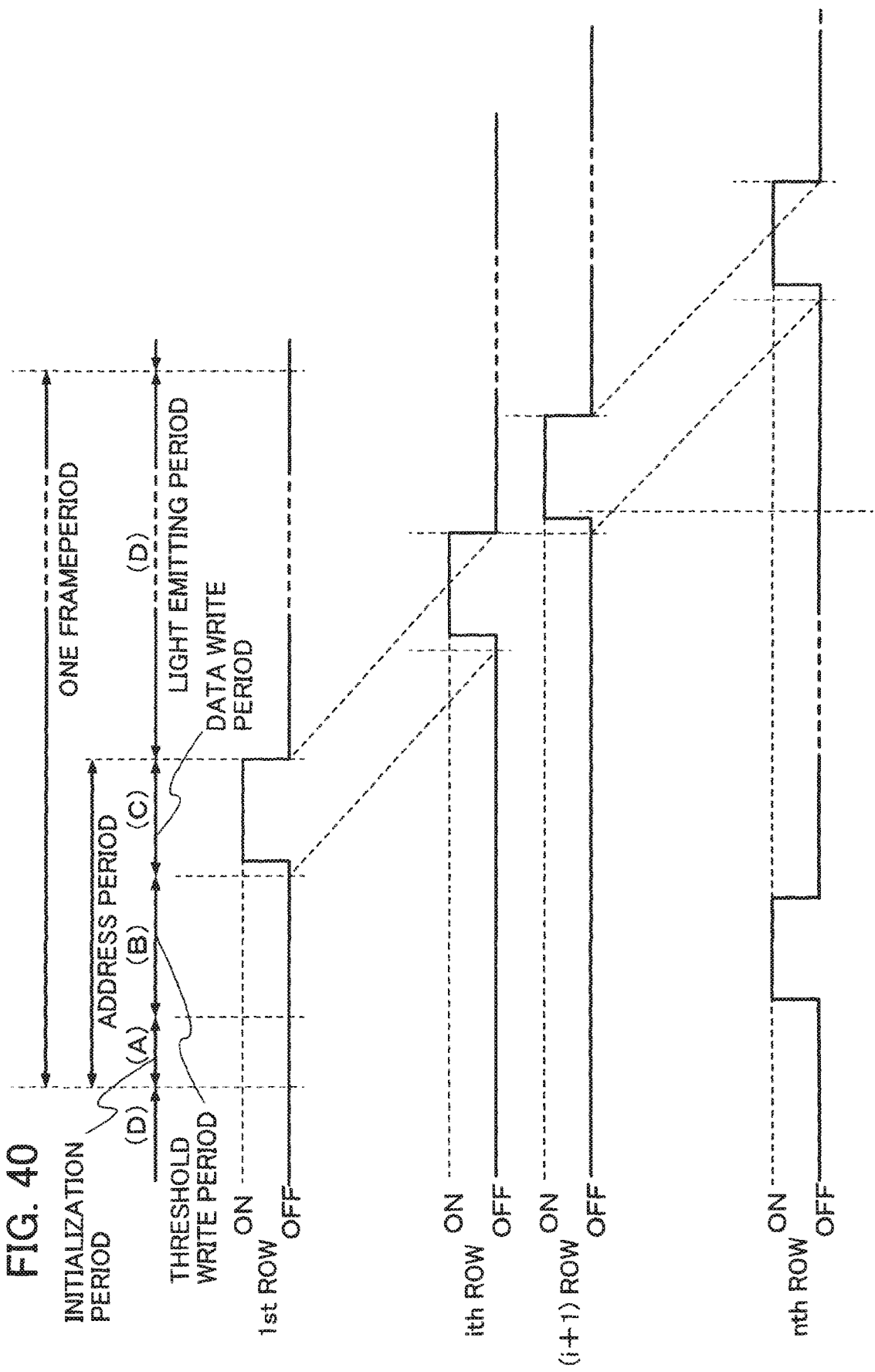

DISPLAY DEVICE INCLUDING N-CHANNEL TRANSISTOR INCLUDING POLYSILICON

CROSS-REFERENCE TO RELATED APPLICATIONS

This application is a continuation of U.S. application Ser. No. 15/996,704, filed Jun. 4, 2018 now pending, which is a continuation of U.S. application Ser. No. 14/541,255, filed Nov. 14, 2014, now U.S. Pat. No. 9,997,584, which is a continuation of U.S. application Ser. No. 13/691,286, filed Nov. 30, 2012, now U.S. Pat. No. 8,890,180, which is a continuation of U.S. application Ser. No. 11/562,678, filed Nov. 22, 2006, now U.S. Pat. No. 8,325,111, which claims the benefit of a foreign priority application filed in Japan as Serial No. 2005-349165 on Dec. 2, 2005, all of which are incorporated by reference.

BACKGROUND OF THE INVENTION

1. Field of the Invention

The present invention relates to a semiconductor device functioning to control a current supplied to a load by a transistor, and a display device including a pixel formed using a current-drive display element of which luminance changes in accordance with a signal, and a signal line driver circuit and a scan line driver circuit which drive the pixel. The present invention also relates to a driving method thereof. Further, the present invention relates to an electronic device having the display device in a display portion.

2. Description of the Related Art

In recent years, a self-luminous display device using a light emitting element such as an electroluminescent (EL) element in a pixel, a so-called light emitting device has attracted attention. As a light emitting element used for such a self-luminous display device, an organic light emitting diode (OLED) and an EL element have attracted attention, and have been used for an EL display or the like. Since these light emitting elements emit light by themselves, they have advantages such as higher pixel visibility, no backlight required, and higher response speed, over a liquid crystal display. Note that the luminance of many of light emitting elements is controlled by the value of current flowing to the light emitting element.

In addition, development of an active matrix display device in which each pixel is provided with a transistor that controls light emission of a light emitting element has been advanced. The active matrix display device is expected to be put into practical use because not only can it achieve high-definition and large-screen display that is difficult for a passive matrix display device, but also it operates with less power consumption than a passive matrix display device.

A structure of a pixel of a conventional active matrix display device is shown in FIG. 46 (Reference 1: Japanese Published Patent Application No. H8-234683). The pixel shown in FIG. 46 includes thin film transistors (TFTs) 11 and 12, a capacitor 13, and a light emitting element 14, and is connected to a signal line 15 and a scan line 16. Note that either a source electrode or a drain electrode of the TFT 12 and one electrode of the capacitor 13 are supplied with a power supply potential Vdd, and an opposite electrode of the light emitting element 14 is supplied with a ground potential.

At this time, when using amorphous silicon for a semiconductor layer of the TFT 12 which controls a current value supplied to the light emitting element, that is, a drive TFT, a change in threshold voltage (Vth) is caused by deterioration or the like. In this case, although the same potential is applied to different pixels through the signal line 15, current flowing to the light emitting element 14 differs from pixel to pixel and display luminance becomes nonuniform among pixels. Note that also in the case of using polysilicon for a semiconductor layer of a drive TFT, characteristics of the transistor are deteriorated or varied likewise.

An operating method using a pixel of FIG. 47 is proposed in Reference 2 to improve the above problem (Reference 2: Japanese Published Patent Application No. 2004-295131). The pixel shown in FIG. 47 includes a transistor 21, a drive transistor 22 which controls a current value supplied to a light emitting element 24, a capacitor 23, and the light emitting element 24, and the pixel is connected to a signal line 25 and a scan line 26. Note that the drive transistor 22 is an NMOS transistor; either a source electrode or a drain electrode of the drive transistor 22 is supplied with a ground potential; and an opposite electrode of the light emitting element 24 is supplied with Vca.

A timing chart showing the operation of this pixel is shown in FIG. 48. In FIG. 48, one frame period is divided into an initialization period 31, a threshold (Vth) write period 32, a data write period 33, and a light emitting period 34. Note that the one frame period corresponds to a period for displaying an image for one screen, and the initialization period, the threshold (Vth) write period, and the data write period are collectively referred to as an address period.

First, in the threshold write period 32, a threshold voltage of the drive transistor 22 is written into the capacitor. After that, in the data write period 33, a data voltage (Vdata) showing a luminance of the pixel is written into the capacitor, and thus Vdata+Vth is accumulated in the capacitor. Then, in the light emitting period 34, the drive transistor 22 is turned on, so that the light emitting element 24 emits light at a luminance specified by the data voltage by changing Vca. Such operation reduces a variation in luminance due to fluctuation in threshold voltage of a drive transistor.

Reference 3 also discloses that a voltage corresponding to the sum of a data potential and a threshold voltage of a drive TFT is a gate-source voltage and current flowing to the TFT does not change even when the threshold voltage of the TFT is changed (Reference 3: Japanese Published Patent Application No. 2004-280059).

In either of the operating methods described in References 2 and 3, the initialization, the writing of a threshold voltage, and the light emission described above are performed by changing a potential Vca several times in each one frame period. In these pixels, one electrode of a light emitting element to which Vca is supplied, that is, an opposite electrode is formed entirely over a pixel region. Therefore, the light emitting element cannot emit light if there is even a single pixel which performs data writing operation besides initialization and writing of a threshold voltage. Thus, a ratio of a light emitting period to one frame period (i.e. a duty ratio) is lowered as shown in FIG. 49.

A low duty ratio requires a high current value supplied to the light emitting element or a drive transistor, which results in increases of a voltage applied to the light emitting element and power consumption. In addition, the light emitting element or the drive transistor becomes easily deteriorated; therefore, much more power is required to obtain a luminance equivalent to that before deterioration.

Further, since the opposite electrode is connected to all pixels, the light emitting element functions as an element with large capacitance. Therefore, more power needs to be consumed to change the potential of the opposite electrode.

SUMMARY OF THE INVENTION

In view of the above problems, it is an object of the present invention to provide a display device which consumes less power and has a high duty ratio. It is another object of the present invention to obtain a pixel structure, a semiconductor device, and a display device with little deviation of luminance from that specified by a data potential.

Note that the scope of the present invention is not limited only to a display device having a light emitting element, and it is an object of the present invention to suppress variation in current value caused by variation in threshold voltage of a transistor. Therefore, a destination supplied with current controlled by a drive transistor is not limited to the light emitting element.

One aspect of the present invention provides a semiconductor device having a pixel including a transistor, a first switch, and a second switch, in which one of either a source electrode or a drain electrode of the transistor is electrically connected to a gate electrode of the transistor through the first switch, the other of either the source electrode or the drain electrode of the transistor is electrically connected to a pixel electrode, the other of either the source electrode or the drain electrode of the transistor is electrically connected to the second switch, and a signal in accordance with a gray scale level of the pixel is inputted to the gate electrode of the transistor.

One aspect of the present invention provides a semiconductor device including a storage capacitor, a transistor, a first switch, a second switch, and a third switch, in which one of either a source electrode or a drain electrode of the transistor is electrically connected to a first wiring, the other of either the source electrode or the drain electrode of the transistor is electrically connected to a pixel electrode, the other of either the source electrode or the drain electrode of the transistor is electrically connected to a second wiring through the third switch, a gate electrode of the transistor is electrically connected to a third wiring through the first switch, the gate electrode of the transistor is electrically connected to the first wiring through the second switch, and the other of either the source electrode or the drain electrode of the transistor is electrically connected to the gate electrode through the storage capacitor.

One aspect of the present invention provides a semiconductor device including a capacitor, a transistor, a first switch, a second switch, and a third switch, in which one of either a source electrode or a drain electrode of the transistor is electrically connected to a first wiring, the other of either the source electrode or the drain electrode of the transistor is electrically connected to a pixel electrode, the other of either the source electrode or the drain electrode of the transistor is electrically connected to a second wiring through the third switch, a gate electrode of the transistor is electrically connected to a third wiring through the first switch, the gate electrode of the transistor is electrically connected to the first wiring through the second switch, and the other of either the source electrode or the drain electrode of the transistor is electrically connected to the gate electrode through the capacitor.

One aspect of the present invention provides a semiconductor device including a transistor, a capacitor, a first switch, a second switch, a third switch, and a fourth switch, in which one of either a source electrode or a drain electrode of the transistor is electrically connected to a first wiring through the fourth switch, the other of either the source electrode or the drain electrode of the transistor is electrically connected to a pixel electrode, the other of either the source electrode or the drain electrode of the transistor is electrically connected to a second wiring through the third switch, a gate electrode of the transistor is electrically connected to a third wiring through the first switch, the gate electrode of the transistor is electrically connected to the first wiring through the second switch, and the other of either the source electrode or the drain electrode of the transistor is electrically connected to the gate electrode through the capacitor.

One aspect of the present invention provides a semiconductor device including a transistor, a capacitor, a first switch, a second switch, a third switch, and a fourth switch, in which one of either a source electrode or a drain electrode of the transistor is electrically connected to a first wiring, the other of either the source electrode or the drain electrode of the transistor is electrically connected to a pixel electrode through the fourth switch, the other of either the source electrode or the drain electrode of the transistor is electrically connected to a second wiring through the fourth switch and the third switch, a gate electrode of the transistor is electrically connected to a third wiring through the first switch, the gate electrode of the transistor is electrically connected to the first wiring through the second switch, and the other of either the source electrode or the drain electrode of the transistor is electrically connected to the gate electrode through the fourth switch and the capacitor.

The second wiring may be the same as a wiring which controls the third switch.

The second wiring may be any of scan lines which control first to third switches of a preceding row or a subsequent row.

The transistor may be an n-channel transistor. Further, a semiconductor layer of the transistor may be formed of a non-crystalline semiconductor film. Furthermore, the semiconductor layer of the transistor may be formed of amorphous silicon.

The semiconductor layer of the transistor may be formed of a crystalline semiconductor film.

In the above invention, a potential inputted to the first wiring may have two values V1 and V2, the potential may be V2 when the first to third switches are in an off state, V1 may be a potential higher than a potential inputted to the second wiring, the difference between V1 and V2 may be larger than a threshold voltage of the transistor, and V2 may be higher than V1.

In addition, the transistor may be a p-channel transistor. In that case, in the above invention, a potential inputted to the first wiring may have two values V1 and V2, the potential may be V2 when the first to third switches are in an off state, V1 may be a potential lower than a potential inputted to the second wiring, the difference between V1 and V2 may be larger than an absolute value of a threshold voltage of the transistor, and V2 may be lower than V1.

One aspect of the present invention provides a semiconductor device including a transistor of which one of either a source electrode or a drain electrode is electrically connected to a first wiring and the other of either the source electrode or the drain electrode is electrically connected to a second wiring, a storage capacitor which holds a gate-source voltage of the transistor, a means to hold a first voltage in the storage capacitor by applying a first potential which is inputted to the first wiring to a gate electrode of the transistor and applying a second potential which is inputted to the second wiring to the source electrode of the transistor, a means to discharge a voltage of the storage capacitor down to a second voltage, a means to hold a fifth voltage that is the sum of the second voltage and a fourth voltage in the storage capacitor by applying a potential that is the sum of the first potential and a third voltage to the gate electrode of the transistor, and a means to supply current set for the transistor to a load by inputting a third potential that is different from the first potential to the first wiring.

One aspect of the present invention provides a semiconductor device including a transistor in which one of either a source electrode or a drain electrode is electrically connected to a first wiring and the other of either the source electrode or the drain electrode is electrically connected to a second wiring, a storage capacitor which holds a gate-source voltage of the transistor, a means to hold a first voltage in the storage capacitor by applying a first potential which is inputted to the first wiring to a gate electrode of the transistor and applying a second potential inputted to the second wiring to the source electrode of the transistor, a means to discharge a voltage of the storage capacitor down to a threshold voltage of the transistor, a means to hold a fourth voltage that is the sum of the threshold voltage of the transistor and a third voltage by applying a potential that is the sum of the first potential and a second voltage to the gate electrode of the transistor, and a means to supply current set for the transistor to a load by inputting a third potential that is different from the first potential to the first wiring.

The transistor may be an n-channel transistor. Further, a semiconductor layer of the transistor may be formed of a non-crystalline semiconductor film. Furthermore, the semiconductor layer of the transistor may be formed of amorphous silicon.

Alternatively, the semiconductor layer of the transistor may be formed of a crystalline semiconductor film.

In the above invention, the first potential may be a potential higher than the second potential, the difference between the first potential and the second potential may be larger than a threshold voltage of the transistor, and the first potential may be lower than the third potential.

Furthermore, the transistor may be a p-channel transistor. In this case, in the present invention, the first potential may be a potential lower than the second potential, the difference between the first potential and the second potential may be larger than the absolute value of the threshold voltage of the transistor, and the first potential may be higher than the third potential.

One aspect of the present invention provides a display device including the above-described semiconductor device. In addition, it also provides an electronic device having the display device in a display portion.

Note that the switch described in this specification is not particularly limited and may be an electrical switch or a mechanical switch as long as it can control current flow. The switch may be a transistor, a diode, or a logic circuit that is a combination thereof. In the case of using a transistor as the switch, the transistor operates as a mere switch. Therefore, the polarity (conductivity type) of the transistor is not particularly limited. However, it is desirable to use a transistor having a polarity with lower off-current. As the transistor with low off-current, a transistor provided with an LDD region, a transistor having a multi-gate structure, or the like can be used. In addition, it is desirable to use an n-channel transistor when a transistor to be operated as a switch operates in a state where the potential of a source electrode thereof is close to a lower potential side power source (such as Vss, GND, or 0 V), whereas it is desirable to use a p-channel transistor when the transistor operates in a state where the potential of a source electrode thereof is close to a higher potential side power source (such as Vdd). This is because the absolute value of a gate-source voltage can be increased, so that the transistor easily operates as a switch. Note that the switch may be of CMOS type using both an n-channel transistor and a p-channel transistor.

Note that the phrase "being connected" in the present invention is synonymous with being electrically connected. Thus, another element, switch, or the like may be interposed.

Note that the load may be anything. For example, a display medium of which contrast varies by an electromagnetic action, such as a liquid crystal element or electronic ink can be used as well as a light emitting element such as an EL element (an organic EL element, an inorganic EL element, or an EL element containing an organic material and an inorganic material) or an electron emitting element. Note that a field emission display (FED), an SED flat-panel display (SED: Surface-conduction Electron-emitter Display), or the like can be given as an example of a display device using an electron emitting element. In addition, electronic paper can be given as a display device using electronic ink.

In the present invention, there is no limitation on the kind of applicable transistors, and a thin film transistor (TFT) using a non-single crystal semiconductor film typified by an amorphous silicon film or a polycrystalline silicon film, a transistor formed using a semiconductor substrate or an SOI substrate, a MOS transistor, a junction transistor, or a bipolar transistor, a transistor using an organic semiconductor or a carbon nanotube, or another transistor can be used. In addition, there is no limitation on the kind of substrate where the transistor is located, and the transistor can be located over a single crystalline substrate, an SOI substrate, a glass substrate, a plastic substrate, or the like.

Note that as described above, the transistor in the present invention may be of any type and may be formed over any type of substrate. Accordingly, all circuits may be formed over a glass substrate, a plastic substrate, a single crystalline substrate, an SOI substrate, or any other substrates. Alternatively, a part of the circuits may be formed over a substrate, and another part of the circuits may be formed over another substrate. In other words, all of the circuits are not necessarily formed over the same substrate. For example, a part of the circuits may be formed over a glass substrate using TFTs, another part of the circuits may be formed as an IC chip over a single crystalline substrate, and the IC chip may be connected onto the glass substrate by COG (Chip On Glass). Alternatively, the IC chip may be connected to the glass substrate by TAB (Tape Automated Bonding) or using a printed circuit board.

In this specification, one pixel means a color element. Accordingly, in the case of a full-color display device including R (red), G (green), and B (blue) color elements, one pixel means any one of R, G, and B color elements.

Note that the phrase "pixels are arranged in matrix" in this specification includes the case where when full-color display is performed with three color elements (e.g. RGB), pixels of three color elements constituting the smallest unit of an image are arranged in a so-called delta pattern as well as the case where pixels are arranged in a grid pattern formed by a combination of vertical stripes and horizontal stripes. In addition, the sizes of the pixels may be different from color element to color element.

Note that the term "semiconductor device" in this specification means a device including a circuit including a semiconductor element (such as a transistor or a diode). In addition, the term "display device" includes not only a main body of a display panel in which a plurality of pixels including a load and a peripheral driver circuit for driving the pixels are formed over a substrate but also a display panel with a flexible printed circuit (FPC) or a printed wiring board (PWB) attached thereto.

According to the present invention, variation in current value caused by variation in threshold voltage of a transistor can be suppressed. Therefore, a desired current can be supplied to a load such as a light emitting element. In particular, when a light emitting element is used as a load, a display device with less luminance variation and a high duty ratio can be provided.

BRIEF DESCRIPTION OF DRAWINGS

FIG. 2 is a timing chart for explaining operation of the pixel shown in FIG. 1.

FIG. 15 is a timing chart for explaining operation of the pixel shown in FIG. 14.

FIGS. 20A and 20B are fragmentary sectional views of pixels described in Embodiment Mode 8.

FIGS. 21A and 21B are fragmentary sectional views of pixels described in Embodiment Mode 8.

FIGS. 25A and 25B are diagrams illustrating a display device described in Embodiment Mode 9.

FIG. 28 is a fragmentary sectional view of a pixel described in Embodiment 15 Mode 9.

FIG. 40 is a diagram illustrating write operation of a display device described in Embodiment Mode 1.

DETAILED DESCRIPTION OF THE INVENTION

Figure 1:
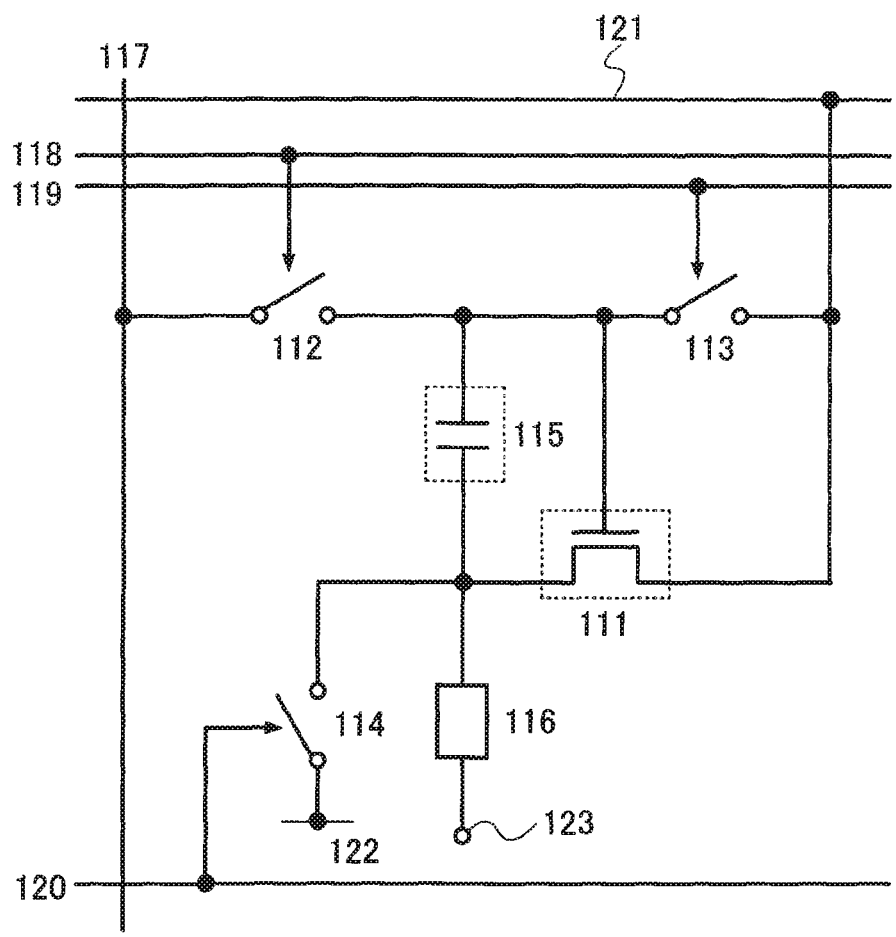
FIG. 1 is a diagram illustrating a pixel structure described in Embodiment Mode 1.

Hereinafter, modes of the present invention are explained. Note that it is easily understood by a person skilled in the art that the present invention can be embodied in many different modes and the modes and detail of the present invention can be variously changed without deviating from the spirit and the scope of the present invention. Therefore, the present invention is not interpreted as being limited to the description of the mode. Note that the same reference numeral is used to denote the same component among the different drawings in the structure of the present invention to be described below.

Embodiment Mode 1

A basic structure of a pixel of the present invention is explained with reference to FIG. 1. The pixel shown in FIG. 1 includes a transistor 111, a first switch 112, a second switch 113, a third switch 114, a capacitor 115, and a light emitting element 116. Note that the pixel is connected to a signal line 117, a first scan line 118, a second scan line 119, a third scan line 120, a power supply line 121, and a potential supply line 122. In this embodiment mode, the transistor 111 is an n-channel transistor and is turned on when a gate-source voltage (Vgs) thereof exceeds a threshold voltage (Vth). In addition, a pixel electrode of the light emitting element 116 is an anode and an opposite electrode 123 is a cathode. Note that the gate-source voltage of the transistor is referred to as Vgs; a drain-source voltage, Vds; a threshold voltage, Vth; a voltage accumulated in the capacitor, Vcs; and the power supply line 121, the potential supply line 122, and the signal line 117 are also referred to as a first wiring, a second wiring, and a third wiring, respectively.

A first electrode (one of either a source electrode or a drain electrode) of the transistor 111 is connected to the pixel electrode of the light emitting element 116; a second electrode (the other of either the source electrode or the drain electrode) thereof is connected to the power supply line 121; and a gate electrode thereof is connected to the power supply line 121 through the second switch 113. In addition, the gate electrode of the transistor 111 is also connected to the signal line 117 through the first switch 112, and the first electrode thereof is also connected to the potential supply line 122 through the third switch 114.

Further, the capacitor 115 is connected between the gate electrode and the first electrode of the transistor 111. In other words, a first electrode of the capacitor 115 is connected to the gate electrode of the transistor 111, and a second electrode of the capacitor 115 is connected to the first electrode of the transistor 111. The capacitor 115 may be formed by sandwiching an insulating film between a wiring, a semiconductor layer, and an electrode or can be omitted by using a gate capacitance of the transistor 111. Such a means to hold a voltage is referred to as a storage capacitor.

Note that the first switch 112, the second switch 113, and the third switch 114 are controlled to be turned on and off by inputting signals to the first scan line 118, the second scan line 119, and the third scan line 120, respectively.

A signal in accordance with a gray scale level of the pixel which corresponds to a video signal, that is, a potential in accordance with luminance data is inputted to the signal line 117.

Next, operation of the pixel shown in FIG. 1 is explained with reference to a timing chart in FIG. 2 and FIGS. 3A to 3D. Note that one frame period corresponding to a period for displaying an image for one screen is divided into an initialization period, a threshold write period, a data write period, and a light emitting period in FIG. 2. The initialization period, the threshold write period, and the data write period are collectively referred to as an address period. The length of one frame period is not particularly limited, but is preferably 1/60 second or less so that an image viewer does not perceive flicker.

Note that a potential V1 is inputted to the opposite electrode 123 of the light emitting element 116 and a potential V1-Vth-α (α: an arbitrary positive number) is inputted to the potential supply line 122. In addition, to the power supply line 121, the potential V1 is inputted in the address period and a potential V2 is inputted in the light emitting period. Note that V2>V1.

Here, the potential of the opposite electrode 123 of the light emitting element 116 is equal to the potential of the power supply line 121 in the address period for the purpose of explaining operation. However, when the minimum potential difference which is necessary for the light emitting element 116 to emit light is referred to as $V_{EL}$, it is acceptable as long as the potential of the opposite electrode 123 is higher than a potential V1-Vth-α-$V_{EL}$. In addition, it is acceptable as long as the potential V2 of the power supply line 121 in the light emitting period is higher than the sum of the potential of the opposite electrode 123 and the minimum potential difference ($V_{EL}$) which is necessary for the light emitting element 116 to emit light. However, since the potential of the opposite electrode 123 is V1 here for the purpose of explanation, it is acceptable as long as V2 is higher than V1+$V_{EL}$.

Figure 3A:
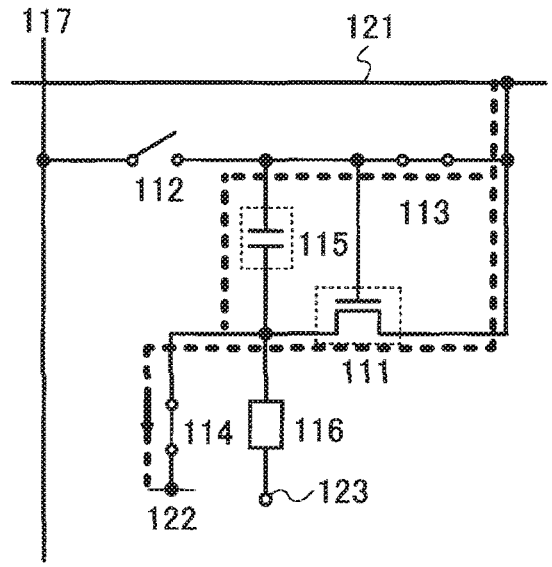
FIGS. 3A to 3D are diagrams illustrating operation of the pixel shown in FIG. 1.

First, the first switch 112 is turned off and the second switch 113 and the third switch 114 are turned on in the initialization period as shown in (A) in FIG. 2 and FIG. 3A. At this time, the first electrode of the transistor 111 serves as a source electrode, and a potential thereof is equal to that of the potential supply line 122, which is V1-Vth-α. On the other hand, a potential of the gate electrode of the transistor 111 is V1. Thus, the gate-source voltage Vgs of the transistor 111 is Vth+a and thus the transistor 111 is turned on. Then, Vth+a is held by the capacitor 115 provided between the gate electrode and the first electrode of the transistor 111. In other words, it is acceptable as long as the potential supply line 122 has such a potential as to turn on the transistor 111 and the third switch 114 functions to select whether or not to supply such a potential as to turn on the transistor 111 to the first electrode.

Figure 3B:
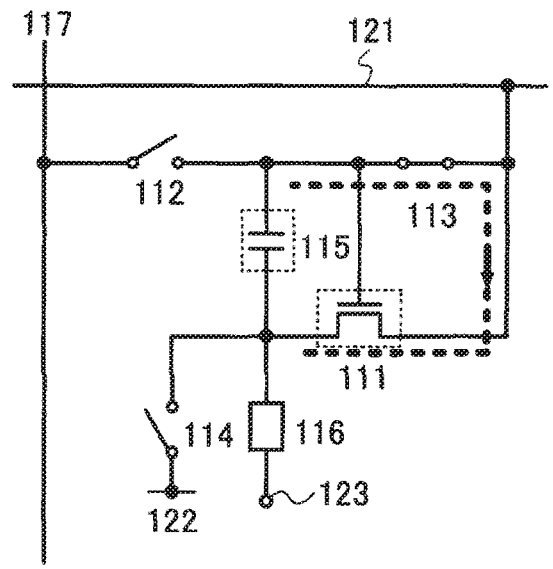

Next, the third switch 114 is turned off in the threshold write period shown in (B) in FIG. 2 and FIG. 3B. Therefore, the potential of the first electrode, i.e. the source electrode of the transistor 111 rises gradually and when it reaches V1-Vth, in other words, when the gate-source voltage Vgs of the transistor 111 reaches the threshold voltage (Vth), the transistor 111 is turned off. Thus, a voltage held by the capacitor 115 is Vth.

Figure 3C:
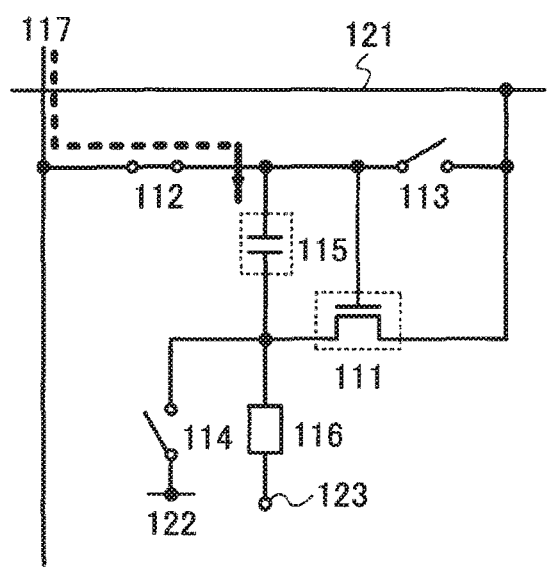

In the subsequent data write period shown in (C) in FIG. 2 and FIG. 3C, the first switch 112 is turned on and a potential (V1+Vdata) in accordance with luminance data is inputted from the signal line 117 after turning off the second switch 113. At this time, the voltage Vcs held by the capacitor 115 can be represented by Formula (1) where capacitances of the capacitor 115 and the light emitting element 116 are referred to as C1 and C2, respectively.

$$Vcs = Vth + Vdata \times \frac{C2}{C1+C2} \quad (1)$$

Note that C2>>C1 because the light emitting element 116 is thinner and has a larger electrode area than the capacitor 115. Thus, from C2/(C1+C2)≈1, the voltage Vcs held by the capacitor 115 is represented by Formula (2), and the transistor 111 is turned on. Note that when a potential Vdata≤0 is inputted, the transistor 111 can be turned off so that the light emitting element 116 does not emit light.

$$Vcs = Vth + Vdata \quad (2)$$

Figure 3D:
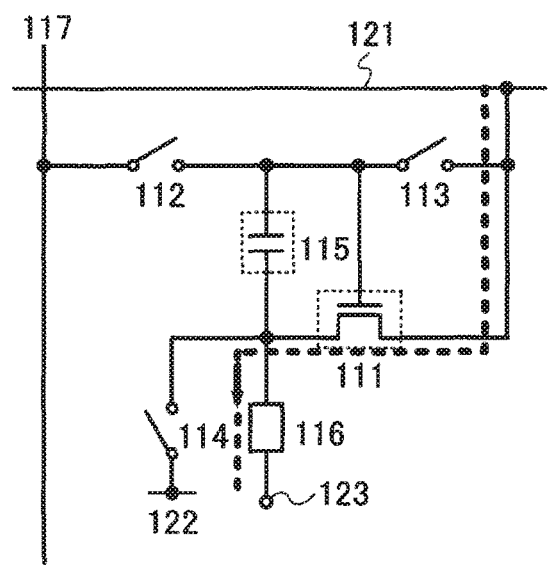

Next, in the light emitting period shown in (D) in FIG. 2 and FIG. 3D, the first switch 112 is turned off and the potential of the power supply line 121 is set to V2. At this time, the gate-source voltage Vgs of the transistor 111 is equal to Vth+Vdata, and current in accordance with this Vgs flows to the transistor 111 and the light emitting element 116, so that the light emitting element 116 emits light.

Note that a current I flowing to the light emitting element is represented by Formula (3) when the transistor 111 is operated in the saturation region.

$$I = \frac{1}{2}\left(\frac{W}{L}\right)\mu Cox(Vgs - Vth)^2 \quad (3)$$
$$= \frac{1}{2}\left(\frac{W}{L}\right)\mu Cox(Vth + Vdata - Vth)^2$$
$$= \frac{1}{2}\left(\frac{W}{L}\right)\mu Cox(Vdata)^2$$

A current I flowing to the light emitting element when the transistor 111 is operated in the linear region is represented by Formula (4).

$$I = \left(\frac{W}{L}\right)\mu Cox\left[(Vgs - Vth)Vds - \frac{1}{2}Vds^2\right] \quad (4)$$
$$= \left(\frac{W}{L}\right)\mu Cox\left[(Vth + Vdata - Vth)Vds - \frac{1}{2}Vds^2\right]$$
$$= \left(\frac{W}{L}\right)\mu Cox\left[(Vdata)Vds - \frac{1}{2}Vds^2\right]$$

Here, W denotes a channel width of the transistor 111; L, a channel length; p, a mobility; and Cox, a storage capacitance.

According to Formulas (3) and (4), the current flowing to the light emitting element 116 does not depend on the threshold voltage (Vth) of the transistor 111 regardless of whether the operation region of the transistor 111 is either the saturation region or the linear region. Therefore, variation in current value caused by variation in threshold voltage of the transistor 111 can be suppressed and a current value in accordance with luminance data can be supplied to the light emitting element 116.

Accordingly, variation in luminance caused by variation in the threshold voltage of the transistor 111 can be suppressed. In addition, power consumption can be reduced because operation is performed with the opposite electrode fixed at a constant potential.

Furthermore, when the transistor 111 is operated in the saturation region, variation in luminance due to deterioration of the light emitting element 116 can also be suppressed. When the light emitting element 116 is deteriorated, $V_{EL}$ of the light emitting element 116 increases and the potential of the first electrode, that is, the source electrode of the transistor 111 rises. At this time, the source electrode of the transistor 111 is connected to the second electrode of the capacitor 115; the gate electrode of the transistor 111 is connected to the first electrode of the capacitor 115; and the gate electrode side is in a floating state. Therefore, in accordance with the rise in the source potential, the gate potential of the transistor 111 also increases by the same amount as the rise in the source potential. Thus, Vgs of the transistor 111 does not change. Therefore, the current flowing to the transistor 111 and the light emitting element 116 is not affected even if the light emitting element is deteriorated. Note that it is found also in Formula (3) that the current I flowing to the light emitting element does not depend on the source potential and a drain potential.

Therefore, when the transistor 111 is operated in the saturation region, variation in the threshold voltage of the transistor 111 and variation in the current flowing to the transistor 111 caused by deterioration of the light emitting element 116 can be suppressed.

Note that in the case where the transistor 111 is operated in the saturation region, as the channel length L is shorter, a larger amount of current tends to flow when the drain voltage is significantly increased by avalanche breakdown.

Figure 5:
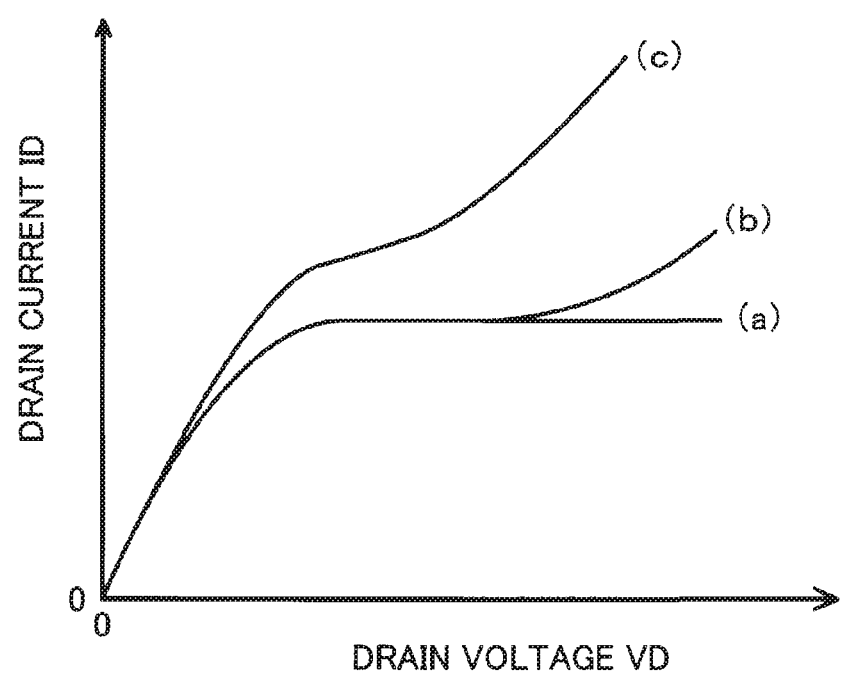
FIG. 5 is a model diagram of a voltage-current characteristic in accordance with channel length modulation.

When the drain voltage is increased to exceed a pinch off voltage, a pinch off point moves to the source side and an effective channel length which substantially functions as a channel is reduced. This increases a current value. This phenomenon is referred to as channel length modulation. Note that the pinch off point is a boundary portion at which the channel disappears and the thickness of the channel is 0 below the gate, and the pinch off voltage refers to a voltage when the pinch off point is at a drain edge. This phenomenon also occurs more easily as the channel length L is shorter. For example, a model diagram of a voltage-current characteristic in accordance with channel length modulation is shown in FIG. 5. Note that the channel lengths L of the transistors (a), (b), (c) satisfy (a)>(b)>(c) in FIG. 5.

Accordingly, in the case of operating the transistor 111 in the saturation region, considering that an influence of deterioration of the light emitting element 116 can be reduced as described above if the current I is constant with respect to the drain-source voltage Vds, the current I with respect to the drain-source voltage Vds is preferably as constant as possible. Thus, the channel length L of the transistor 111 is preferably longer. For example, the channel length L of the transistor is preferably larger than the channel width W. In addition, the channel length L is preferably 10 μm to 50 μm inclusive and more preferably 15 μm to 40 μm inclusive. However, the channel length L and the channel width W are not limited thereto.

In addition, since a reverse bias voltage is applied to the light emitting element 116 in the initialization period, a shorted portion in the light emitting element can be insulated and deterioration of the light emitting element can be suppressed. Thus, the lifetime of the light emitting element can be extended.

Note that since the variation in current value caused by variation in threshold voltage of the transistor can be suppressed, supply destination of the current controlled by the transistor is not particularly limited. Therefore, an EL element (an organic EL element, an inorganic EL element, or an EL element containing an organic material and an inorganic material), an electron emitting element, a liquid crystal element, electronic ink, or the like can be used as the light emitting element 116 shown in FIG. 1.

In addition, it is acceptable as long as the transistor 111 functions to control a current value supplied to the light emitting element 116, and the kind of the transistor is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, a bipolar transistor, a transistor using an organic semiconductor or a carbon nanotube, or another transistor can be used.

Figure 45:
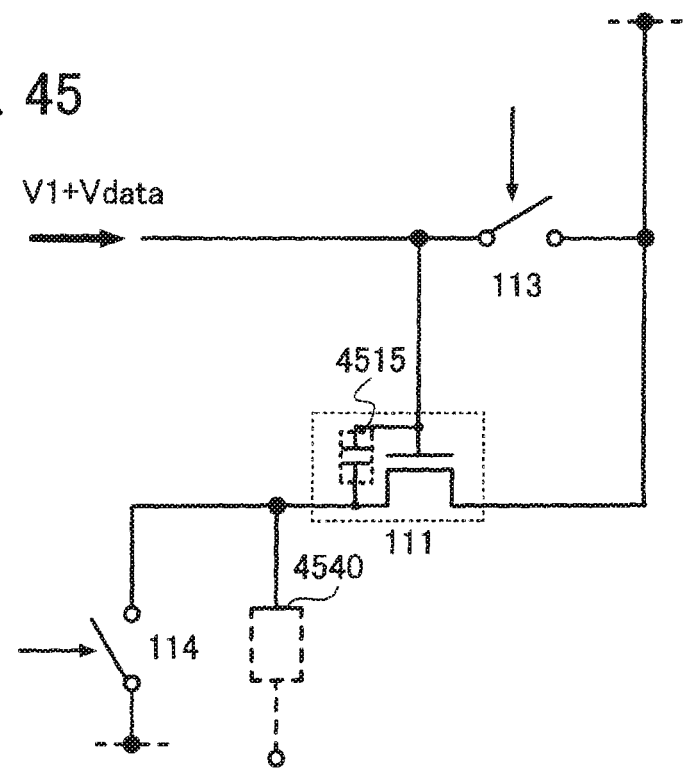
FIG. 45 is a diagram illustrating a pixel structure described in Embodiment Mode 1.
Figure 46:
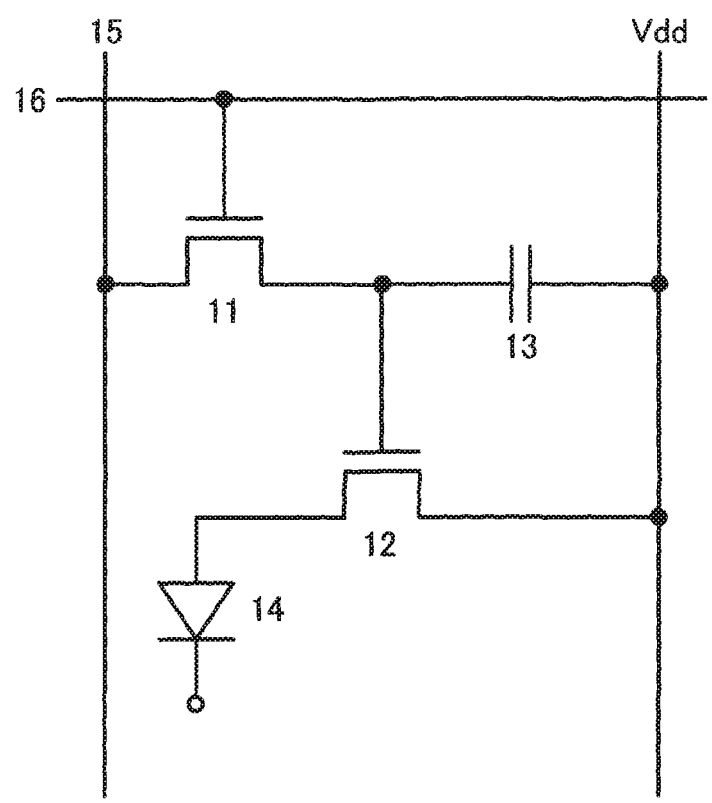
FIG. 46 is a diagram illustrating a pixel structure of conventional art.
Figure 47:
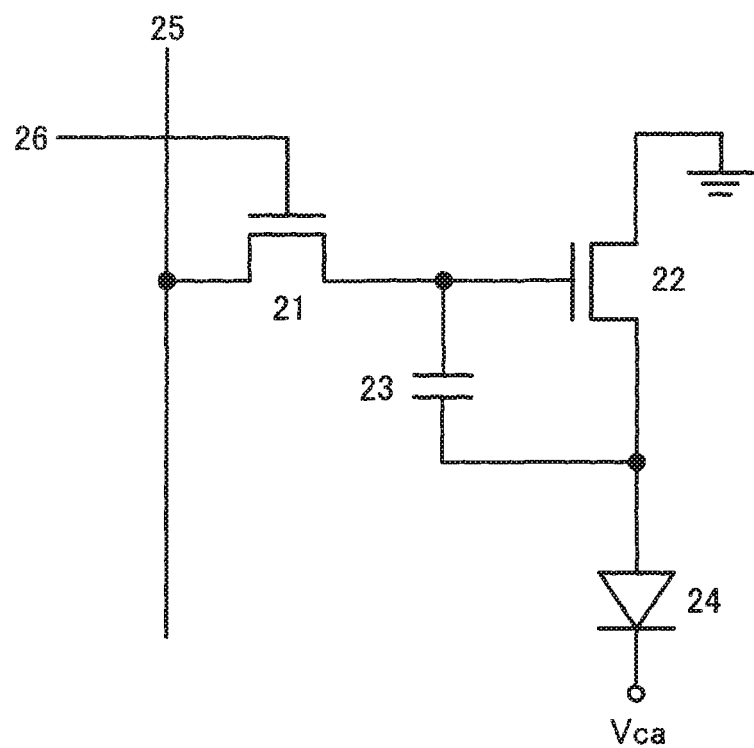
FIG. 47 is a diagram illustrating a pixel structure of conventional art.
Figure 48:
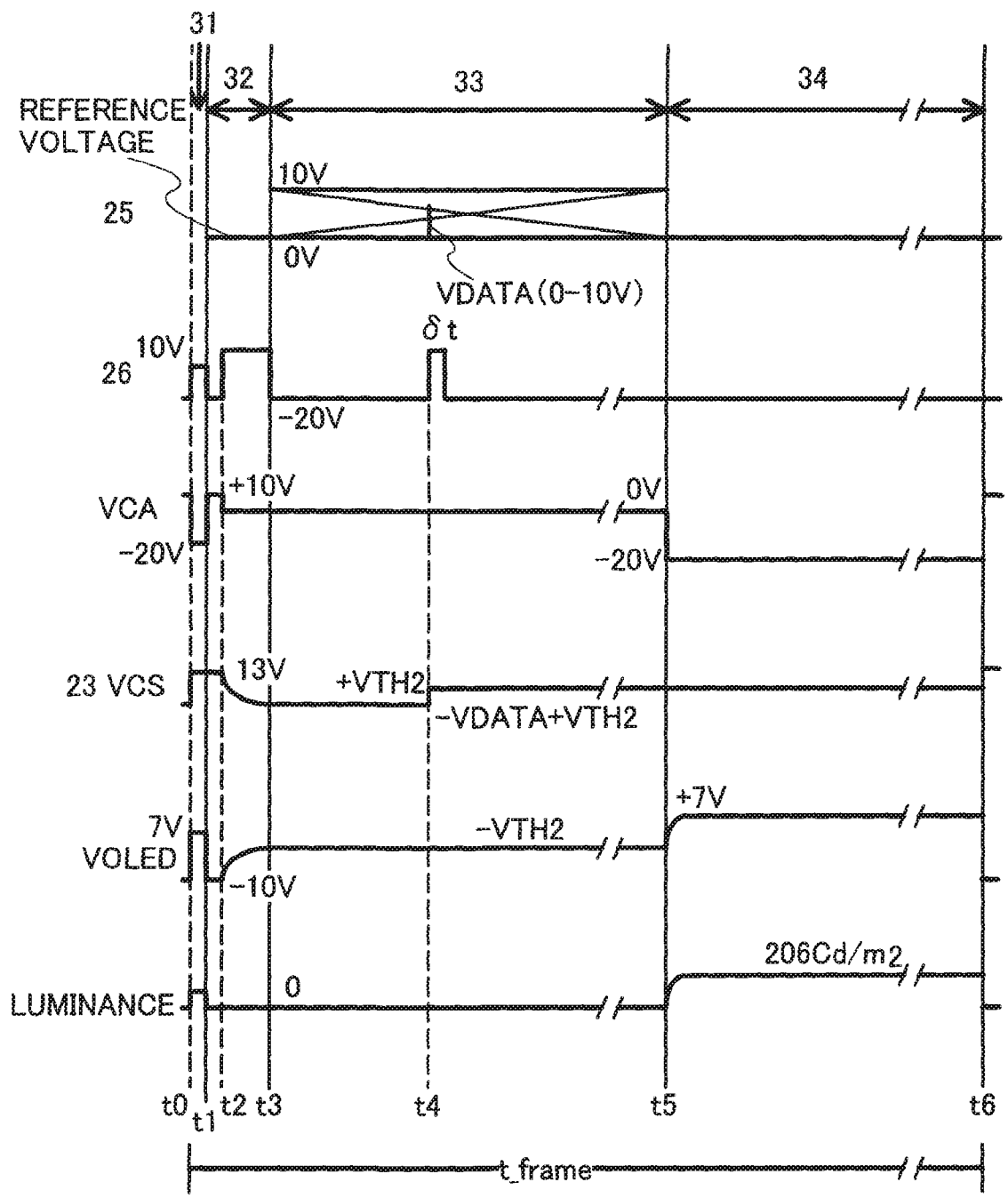
FIG. 48 is a timing chart for operating a pixel described in Related Art.
Figure 49:
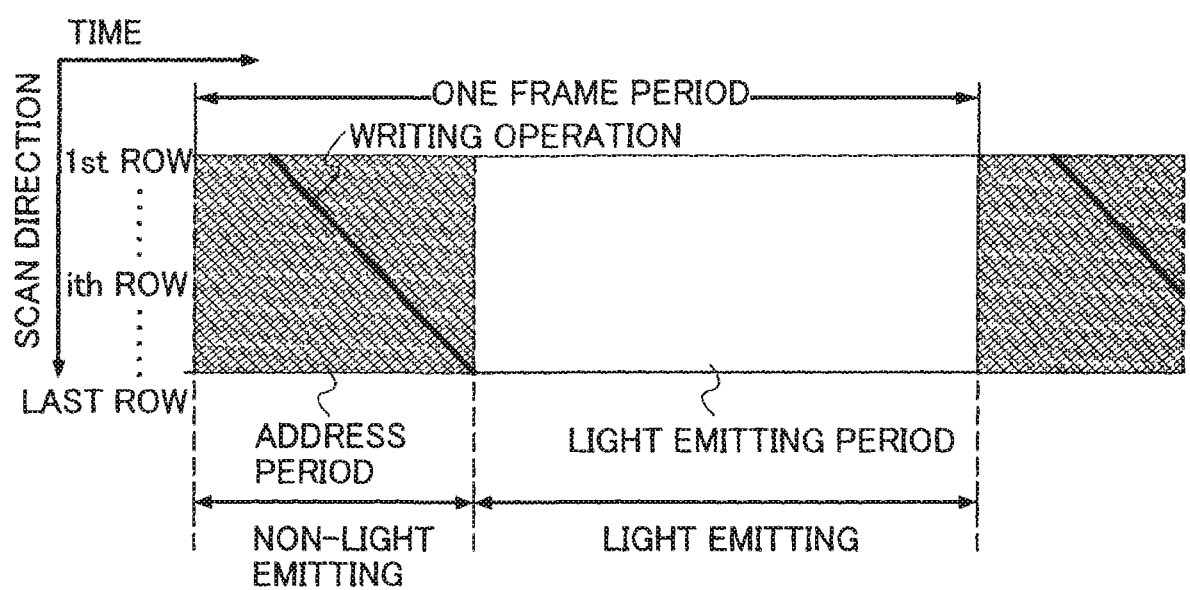
FIG. 49 is a diagram illustrating a ratio of a light emitting period to one frame period when using conventional art.

The first switch 112 selects timing to input a signal in accordance with a gray scale level of the pixel to the capacitor and controls a signal supplied to the gate electrode of the transistor 111. The second switch 113 selects timing to apply a predetermined potential to the gate electrode of the transistor 111 and controls whether or not to supply the predetermined potential to the gate electrode of the transistor 111. The third switch 114 selects timing to apply a predetermined potential for initializing a potential written in the capacitor 115 and decreases the potential of the first electrode of the transistor 111. Therefore, the first switch 112, the second switch 113, and the third switch 114 are not particularly limited as long as they have the above functions. For example, each of the switches may be a transistor, a diode, or a logic circuit that is a combination thereof. Note that the first to third switches are not particularly necessary if the signal or potential can be applied to the pixel at the above timing. For example, when the signal in accordance with a gray scale level of the pixel can be inputted to the gate electrode of the transistor 111, the first switch 112 does not need to be provided as shown in FIG. 45. A pixel shown in FIG. 45 includes a transistor 111, a second switch 113, a third switch 114, and a pixel electrode 4540. A first electrode (one of either a source electrode or a drain electrode) of the transistor 111 is connected to the pixel electrode 4540 and the third switch 114, and a gate electrode of the transistor 111 is connected to a second electrode of the transistor 111 through the second switch 113. Note that a gate capacitance 4515 of the transistor 111 is used as a storage capacitor; therefore, the capacitor 115 in FIG. 1 does not particularly need to be provided. Such a pixel can also suppress variation in current value caused by variation in threshold voltage of the transistor 111 by operating each switch in accordance with the timing chart shown in FIG. 2 and supplying a desired potential to each electrode. Thus, a desired current can be supplied to the pixel electrode 4540.

Figure 4:
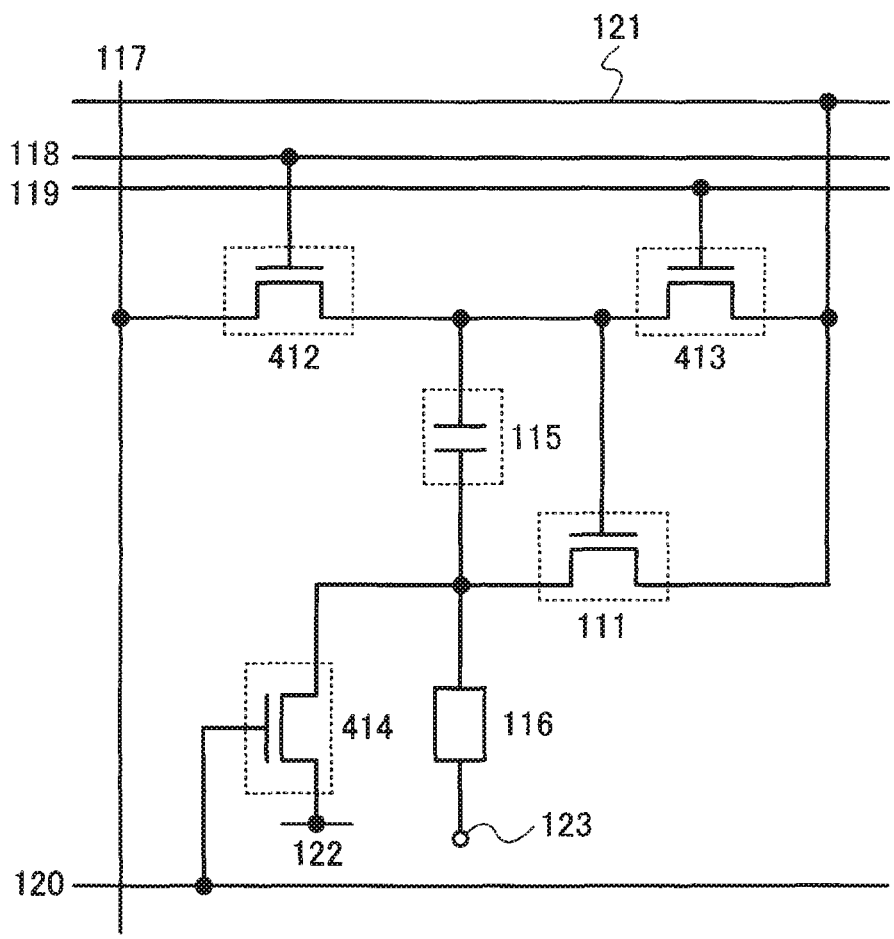
FIG. 4 is a diagram illustrating a pixel structure described in Embodiment Mode 1.

Next, the case of employing n-channel transistors as the first switch 112, the second switch 113, and the third switch 114 is shown in FIG. 4. Note that a common reference numeral is shared with FIG. 1 to denote a common component, and explanation thereof is omitted.

A first switching transistor 412 corresponds to the first switch 112; a second switching transistor 413, the second switch 113; and a third switching transistor 414, the third switch 114. Note that the channel length of the transistor 11 is preferably larger than that of any of the first switching transistor 412, the second switching transistor 413, and the third switching transistor 414.

A gate electrode of the first switching transistor 412 is connected to a first scan line 118; a first electrode thereof, to a signal line 117; and a second electrode thereof, to a first electrode of a capacitor 115 and a gate electrode of the transistor 111.

In addition, a gate electrode of the second switching transistor 413 is connected to a second scan line 119; a first electrode thereof, to the first electrode of the capacitor 115 and the gate electrode of the transistor 111; and a second electrode thereof, to a power supply line 121 and a second electrode of the transistor 111.

A gate electrode of the third switching transistor 414 is connected to a third scan line 120; a first electrode thereof, to a second electrode of the capacitor 115, a first electrode of the transistor 111, and a pixel electrode of a light emitting element 116; and a second electrode thereof, to a potential supply line 122.

Each switching transistor is turned on when a signal inputted to each scan line is at an H level and turned off when the signal inputted is at an L level.

Figure 38:
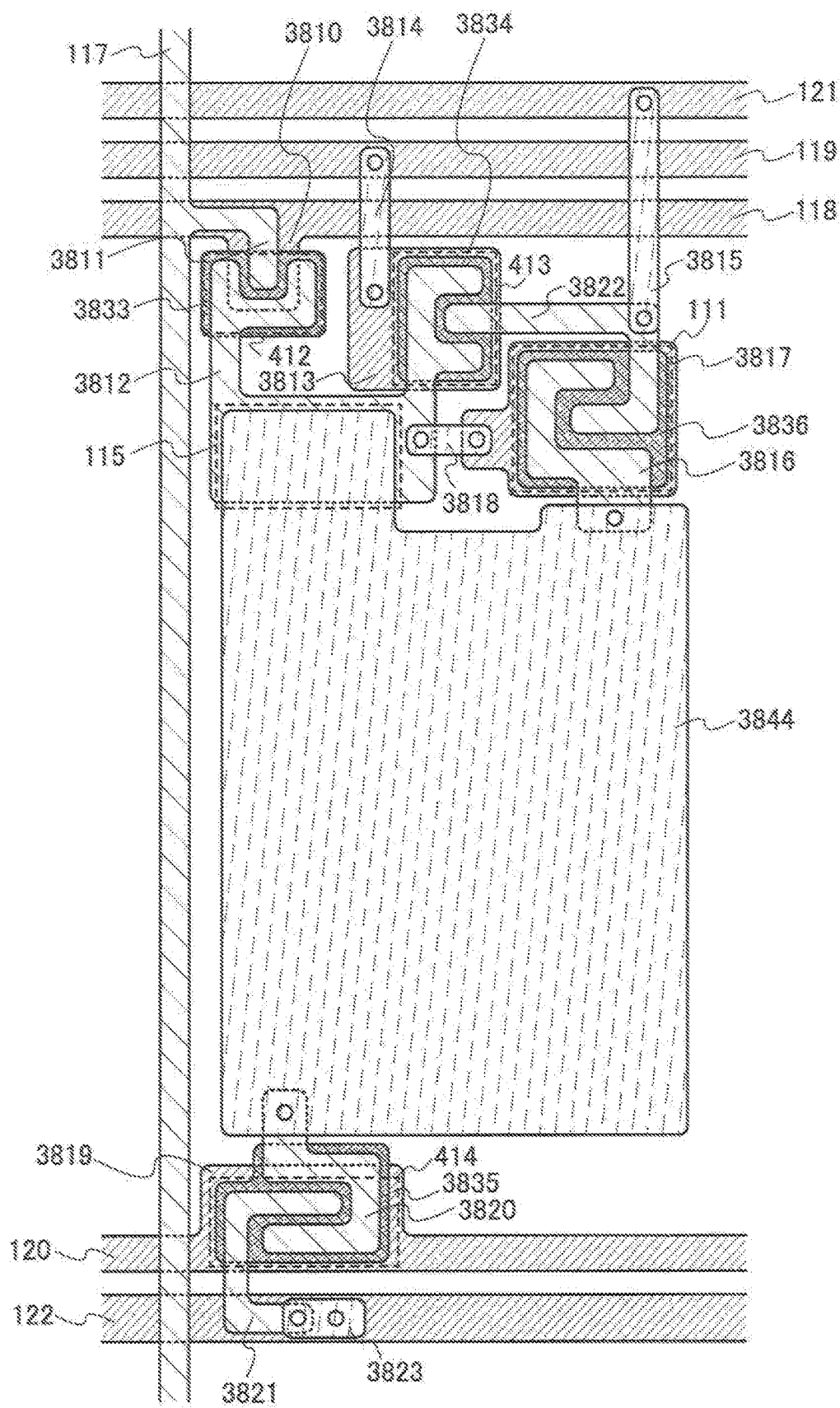
FIG. 38 is a top view of the pixel shown in FIG. 4.

One mode of a top view of the pixel shown in FIG. 4 is shown in FIG. 38. A conductive layer 3810 includes a portion functioning as the first scan line 118 and the gate electrode of the first switching transistor 412, and a conductive layer 3811 includes a portion functioning as the signal line 117 and the first electrode of the first switching transistor 412. In addition, a conductive layer 3812 includes a portion functioning as the second electrode of the first switching transistor 412, a portion functioning as the first electrode of the capacitor 115, and a portion functioning as the first electrode of the second switching transistor 413. A conductive layer 3813 includes a portion functioning as the gate electrode of the second switching transistor 413 and is connected to the second scan line 119 through a wiring 3814. A conductive layer 3822 includes a portion functioning as the second electrode of the second switching transistor 413 and a portion functioning as the second electrode of the transistor 111 and is connected to the power supply line 121 through a wiring 3815. A conductive layer 3816 includes a portion functioning as the first electrode of the transistor 111 and is connected to a pixel electrode 3844 of the light emitting element. A conductive layer 3817 includes a portion functioning as the gate electrode of the transistor 111 and is connected to the conductive layer 3812 through a wiring 3818. A conductive layer 3819 includes a portion functioning as the third scan line 120 and the gate electrode of the third switching transistor 414. A conductive layer 3820 includes a portion functioning as the first electrode of the third switching transistor 414 and is connected to the pixel electrode 3844. A conductive layer 3821 including a portion functioning as the second electrode of the third switching transistor 414 is connected to the potential supply line 122 through a wiring 3823.

Note that among the above conductive layers, the portions functioning as the gate electrode, the first electrode, and the second electrode of the first switching transistor 412 are portions formed so as to be overlapped with a semiconductor layer 3833; the portions functioning as the gate electrode, the first electrode, and the second electrode of the second switching transistor 413 are portions formed so as to be overlapped with a semiconductor layer 3834; and the portions functioning as the gate electrode, the first electrode, and the second electrode of the third switching transistor 414 are portions formed so as to be overlapped with a semiconductor layer 3835. In addition, the portions functioning as the gate electrode, the first electrode, and the second electrode of the transistor 111 are portions of conductive layers formed so as to be overlapped with a semiconductor layer 3836. The capacitor 115 is formed in a portion where the conductive layer 3812 and the pixel electrode 3844 overlap.

The pixel structure in FIG. 4 can also suppress variation in current value caused by variation in threshold voltage of the transistor 111 by an operating method similar to FIG. 1. Thus, current in accordance with luminance data can be supplied to the light emitting element 116, and variation in luminance can be suppressed. When the transistor 111 is operated in the saturation region, variation in luminance caused by deterioration of the light emitting element 116 can also be suppressed.

Further, a manufacturing process can be simplified because the pixel can be formed using only n-channel transistors. In addition, a non-crystalline semiconductor such as an amorphous semiconductor or a semi-amorphous semiconductor (also referred to as a microcrystalline semiconductor) can be used for a semiconductor layer of each transistor included in the pixel. For example, amorphous silicon (a-Si:H) can be used as the amorphous semiconductor. The manufacturing process can further be simplified by using these non-crystalline semiconductors. Accordingly, a reduction in manufacturing cost and an improvement in yield can be achieved.

Note that the first switching transistor 412, the second switching transistor 413, and the third switching transistor 414 are operated as mere switches. Therefore, the polarity (conductivity type) of the transistors is not particularly limited. However, it is desirable to use a transistor having a polarity with lower off-current. As the transistor with low off-current, a transistor provided with an LDD region, a transistor having a multi-gate structure, or the like can be used. Alternatively, the switch may be of CMOS type using both an n-channel transistor and a p-channel transistor.

Next, a display device including the pixel of the present invention is explained with reference to FIG. 6.

The display device includes a signal line driver circuit 611, a scan line driver circuit 612, and a pixel portion 613, and the pixel portion 613 includes a plurality of signal lines S1 to Sm which is arranged extending from the signal line driver circuit 611 in a column direction, a plurality of first scan lines G1_1 to Gn_1, second scan lines G1_2 to Gn_2, third scan lines G1_3 to Gn_3, and power supply lines P1_1 to Pn_1 which are arranged extending from the scan line driver circuit 612 in a row direction, and a plurality of pixels 614 which is arranged in matrix in accordance with the signal lines S1 to Sm. In addition, the pixel portion 613 includes a plurality of potential supply lines P1_2 to Pn_2 parallel to the first scan lines G1_1 to Gn_1. Further, each pixel 614 is connected to a signal line Sj (one of the signal lines S1 to Sm), a first scan line G1_1 (one of the scan lines G1_1 to Gn_1), a second scan line G1_2, a third scan line G1_3, a power supply line P1_1, and a potential supply line P1_2.

Note that the signal line Sj, the first scan line G1_1, the second scan line G1_2, the third scan line G1_3, the power supply line P1_1, and the potential supply line P1_2 correspond to the signal line 117, the first scan line 118, the second scan line 119, the third scan line 120, the power supply line 121, and the potential supply line 122 in FIG. 1, respectively.

In accordance with signals outputted from the scan line driver circuit 612, a row of pixels to be operated is selected, and at the same time, the operation shown in FIG. 2 is performed in each of the pixels belonging to the row. Note that in the data write period of FIG. 2, a video signal outputted from the signal line driver circuit 611 is written into each pixel of the selected row. At this time, potentials in accordance with luminance data of pixels are inputted to the signal lines S1 to Sm.

As shown in FIG. 40, after finishing a data write period of, for example, the i-th row, a signal is written in pixels belonging to the i+1-th row. Note that in order to show the data write period of each row, FIG. 40 shows only the operation of the first switch 112 of FIG. 2 which can precisely show the period. In addition, a pixel that has finished the data write period in the i-th row proceeds to a light emitting period and emits light in accordance with the signal written into the pixel.

Thus, initialization start time can be freely set in respective rows unless data write periods overlap in the respective rows. In addition, since each pixel can emit light except in its address period, a ratio of a light emitting period to one frame period (that is, a duty ratio) can be significantly high and can be approximately 100%. Therefore, a display device with less luminance variation and a high duty ratio can be provided.

In addition, since a threshold write period can be set to be long, a threshold voltage of a transistor can be written into a capacitor more accurately. Therefore, reliability as a display device is improved.

Figure 6:
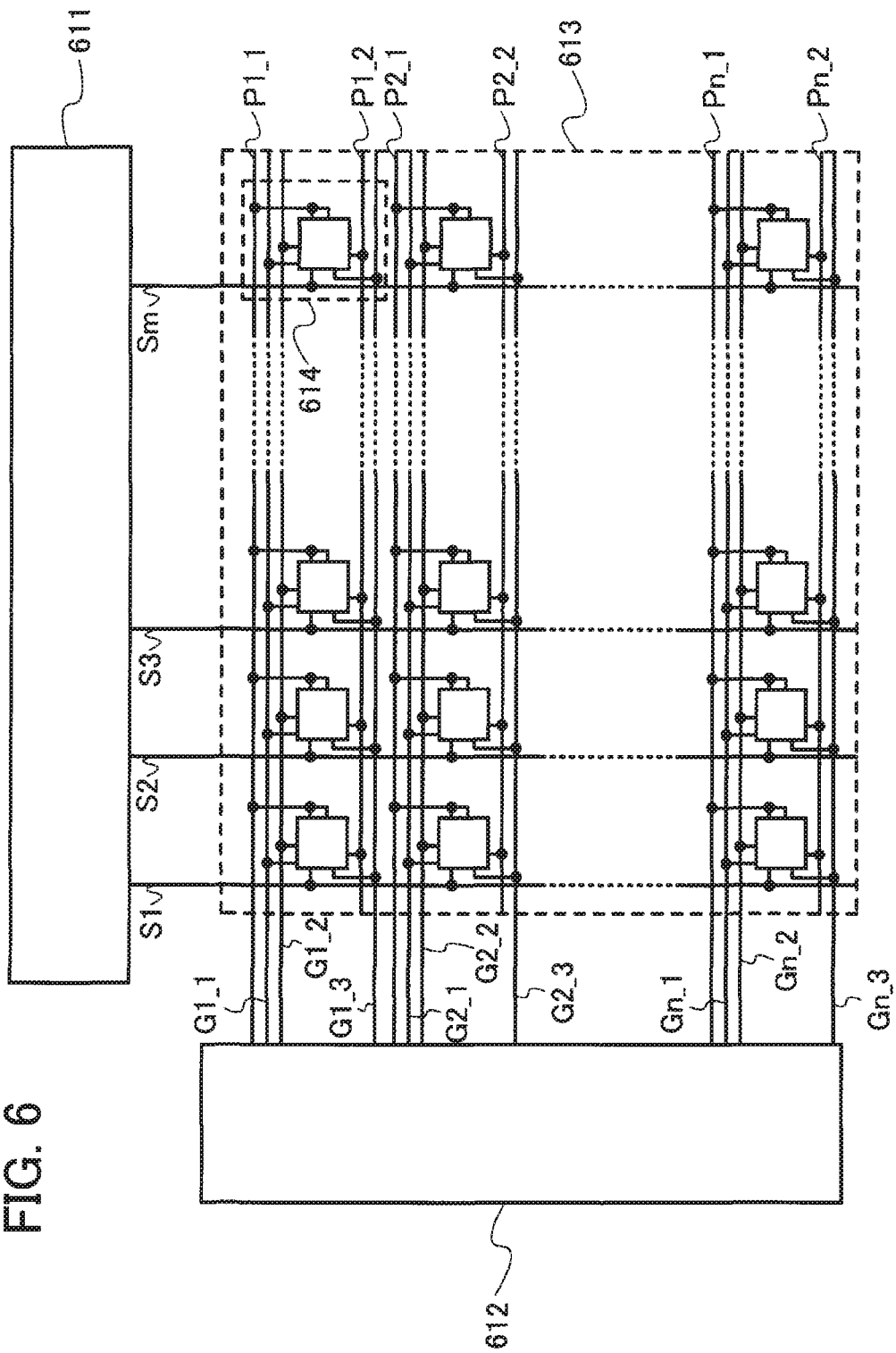
FIG. 6 is a diagram illustrating a display device described in Embodiment Mode 1.

Note that the structure of the display device shown in FIG. 6 is one example, and the present invention is not limited to this. For example, the potential supply lines P1_2 to Pn_2 do not need to be arranged parallel to the first scan lines G1_1 to Gn_1, and may be arranged parallel to the signal lines S1 to Sm.

In addition, the variation in threshold voltage includes fluctuation in threshold voltage of each transistor over time as well as a difference in threshold voltage among transistors of pixels. Further, the difference in threshold voltage among transistors includes a difference in transistor characteristic at the time of manufacturing the transistors. Note that the transistor here refers to a transistor functioning to supply current to a load such as a light emitting element.

Embodiment Mode 2

In this embodiment mode, a pixel with a structure different from Embodiment Mode 1 is explained with reference to FIGS. 39A and 39B. Note that a common reference numeral is used to denote a component similar to Embodiment Mode 1, and detailed explanation of the same portion or a portion having a similar function is omitted.

Figure 39A:
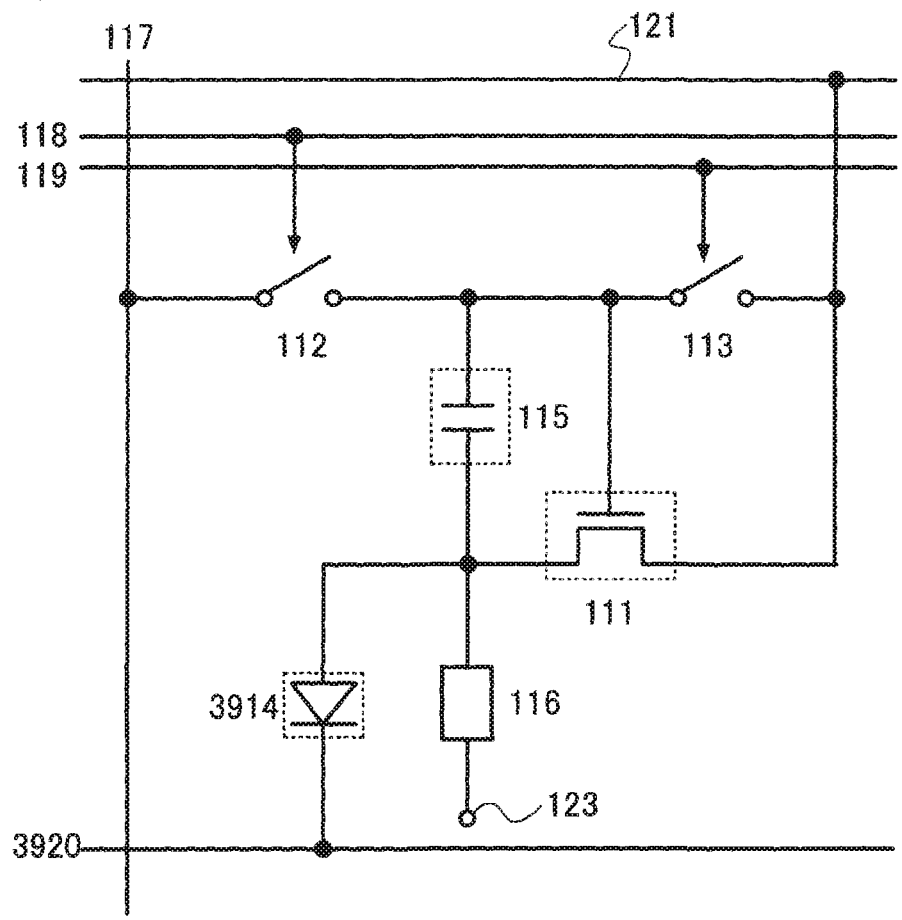
FIGS. 39A and 39B are diagrams illustrating a pixel structure described in Embodiment Mode 2.

The pixel shown in FIG. 39A includes a transistor 111, a first switch 112, a second switch 113, a rectifier element 3914, a capacitor 115, and a light emitting element 116. Note that the pixel is connected to a signal line 117, a first scan line 118, a second scan line 119, a third scan line 3920, and a power supply line 121. The pixel shown in FIG. 39A has a structure in which the rectifier element 3914 is used as the third switch 114 in FIG. 1, and a second electrode of the capacitor 115, a first electrode of the transistor 111, and a pixel electrode of the light emitting element 116 are connected to the third scan line 3920 through the rectifier element 3914. In other words, the rectifier element 3914 is connected so that current flows to the third scan line 3920 from the first electrode of the transistor 111. It is needless to say that transistors or the like may be used as the first switch 112 and the second switch 113 as described in Embodiment Mode 1. In addition, for the rectifier element 3914, a Schottky-barrier diode 3951, a PIN diode 3952, or a PN diode 3953 or a diode-connected transistor 3954 or 3955 shown in FIG. 39B can be used. Note that, as for the transistors 3954 and 3955, the polarity of the transistors needs to be appropriately selected depending on a direction of current flow.

Current does not flow to the rectifier element 3914 when an H-level signal is inputted to the third scan line 3920, and current flows to the rectifier element 3914 when an L-level signal is inputted. Thus, when the pixel in FIG. 39A is operated in a similar manner to that in FIG. 1, an L-level signal is inputted to the third scan line 3920 in the initialization period, and an H-level signal is inputted in the other periods. Note that a potential of the L-level signal is considered to be V1-Vth-α-β (α: an arbitrary positive number) because it is required not only that current flow to the rectifier element 3914 but also that a potential of the second electrode of the capacitor 115 be lowered to V1-Vth-α (α: an arbitrary positive number). Note that β denotes a threshold voltage of the rectifier element 3914 in a forward direction.

Figure 39B:
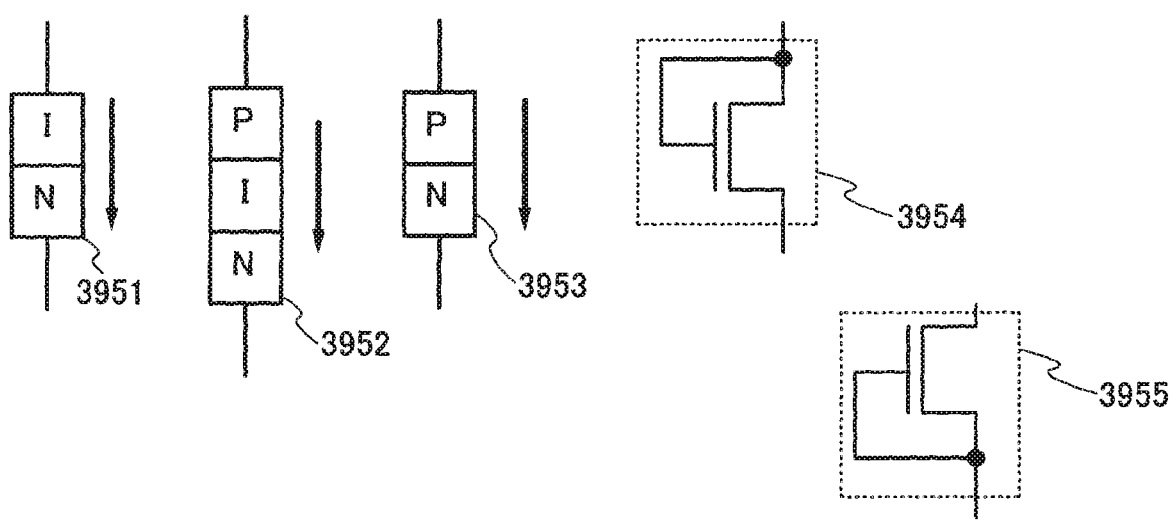

In consideration of the above matters, the pixel structure of FIGS. 39A and 39B can also suppress variation in current value caused by variation in threshold voltage of the transistor 111 by operating the pixel in a similar manner to FIG. 1. Thus, current in accordance with luminance data can be supplied to the light emitting element 116, and variation in luminance can be suppressed. In addition, in the case of operating the transistor 111 in the saturation region, variation in luminance caused by deterioration of the light emitting element 116 can also be suppressed. Further, the use of the rectifier element 3914 can reduce the number of wirings and improve an aperture ratio.

Furthermore, the pixel described in this embodiment mode can be applied to the display device of FIG. 6. Similarly to Embodiment Mode 1, initialization start time can be freely set in respective rows unless data write periods in the respective rows overlap. In addition, since each pixel can emit light except in its address period, a ratio of a light emitting period to one frame period (that is, a duty ratio) can be significantly high and can be approximately 100%. Therefore, a display device with less luminance variation and a high duty ratio can be provided.

In addition, since a threshold write period can be set to be long, a threshold voltage of a transistor which controls a current value flowing to a light emitting element can be written into a capacitor more accurately. Therefore, reliability as a display device is improved.

This embodiment mode can be freely combined with a pixel structure described in the other embodiment mode as well as FIG. 1 described above. In other words, the rectifier element 3914 can be applied to a pixel described in the other embodiment mode.

Embodiment Mode 3

In this embodiment mode, pixels having structures different from those in Embodiment Mode 1 are explained with reference to FIGS. 7 to 9. Note that a common reference numeral is used to denote a component similar to Embodiment Mode 1, and detailed explanation of the same portion or a portion having a similar function is omitted.

Figure 7:
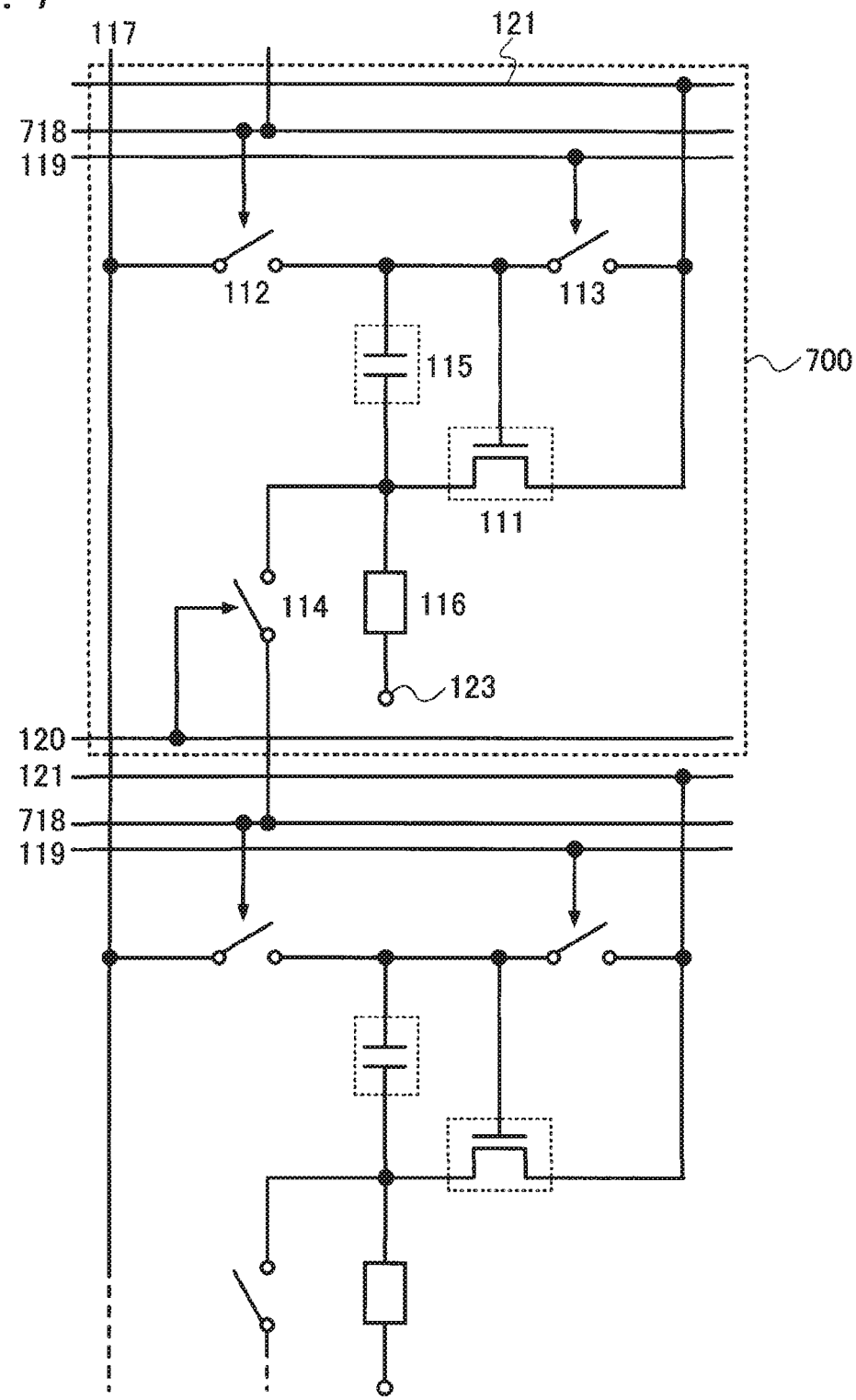
FIG. 7 is a diagram illustrating a pixel structure described in Embodiment Mode 3.

A pixel 700 shown in FIG. 7 includes a transistor 111, a first switch 112, a second switch 113, a third switch 114, a capacitor 115, and a light emitting element 116. Note that the pixel 700 is connected to a signal line 117, a first scan line 718, a second scan line 119, a third scan line 120, a power supply line 121, and a first pixel line 718 of a subsequent row.

In the pixel of FIG. 1 described in Embodiment Mode 1, the first electrode of the transistor 111 is connected to the potential supply line 122 through the third switch 114, while it can be connected to the first scan line 718 of the subsequent row in FIG. 7. This is because the potential supply line 112 can be replaced with anything that can supply a predetermined potential to the first electrode of the transistor 111 in the initialization period. Therefore, a supplying wiring does not always need to be at a constant potential as long as the wiring can supply a predetermined potential to the first electrode of the transistor 111 in the initialization period. Thus, the first scan line 718 of the subsequent row can be used in place of the potential supply line. By sharing a wiring with a subsequent row as described above, the number of wirings can be reduced and an aperture ratio can be improved.

Note that the pixel structure shown in FIG. 7 can also suppress variation in current value caused by variation in threshold voltage of the transistor 111 by operating the pixel in a similar manner to Embodiment Mode 1. Thus, current in accordance with luminance data can be supplied to the light emitting element 116, and variation in luminance can be suppressed. In addition, power consumption can be reduced because operation is performed with an opposite electrode fixed at a constant potential. Note that although the operation region of the transistor 111 is not particularly limited, a more notable effect can be obtained in the saturation region. Further, when the transistor 111 is operated in the saturation region, variation in current flowing to the transistor 111 caused by deterioration of the light emitting element 116 can be suppressed.

Note that a potential of a signal to turn off the first switch 112 which is supplied from the first scan line 718 is V1-Vth-α (α: an arbitrary positive number). Therefore, it is necessary to use the first switch 112 which is turned off with the potential V1-Vth-α (α: an arbitrary positive number). It is also necessary to perform operation so that the initialization period of the row to which the pixel 700 belongs does not overlap with a data write period of the row sharing a wiring.

Note that in the case of using an n-channel transistor for the third switch 114, a potential to turn off the third switch 114 which is supplied from the third scan line 120 may be lower than the potential V1-Vth-α that is the potential of the signal to turn off the first switch 112 which is supplied from the first scan line 718. In this case, a gate-source voltage when the transistor is turned off can be a negative value. Thus, current leakage when the third switch 114 is turned off can be reduced.

Figure 8:
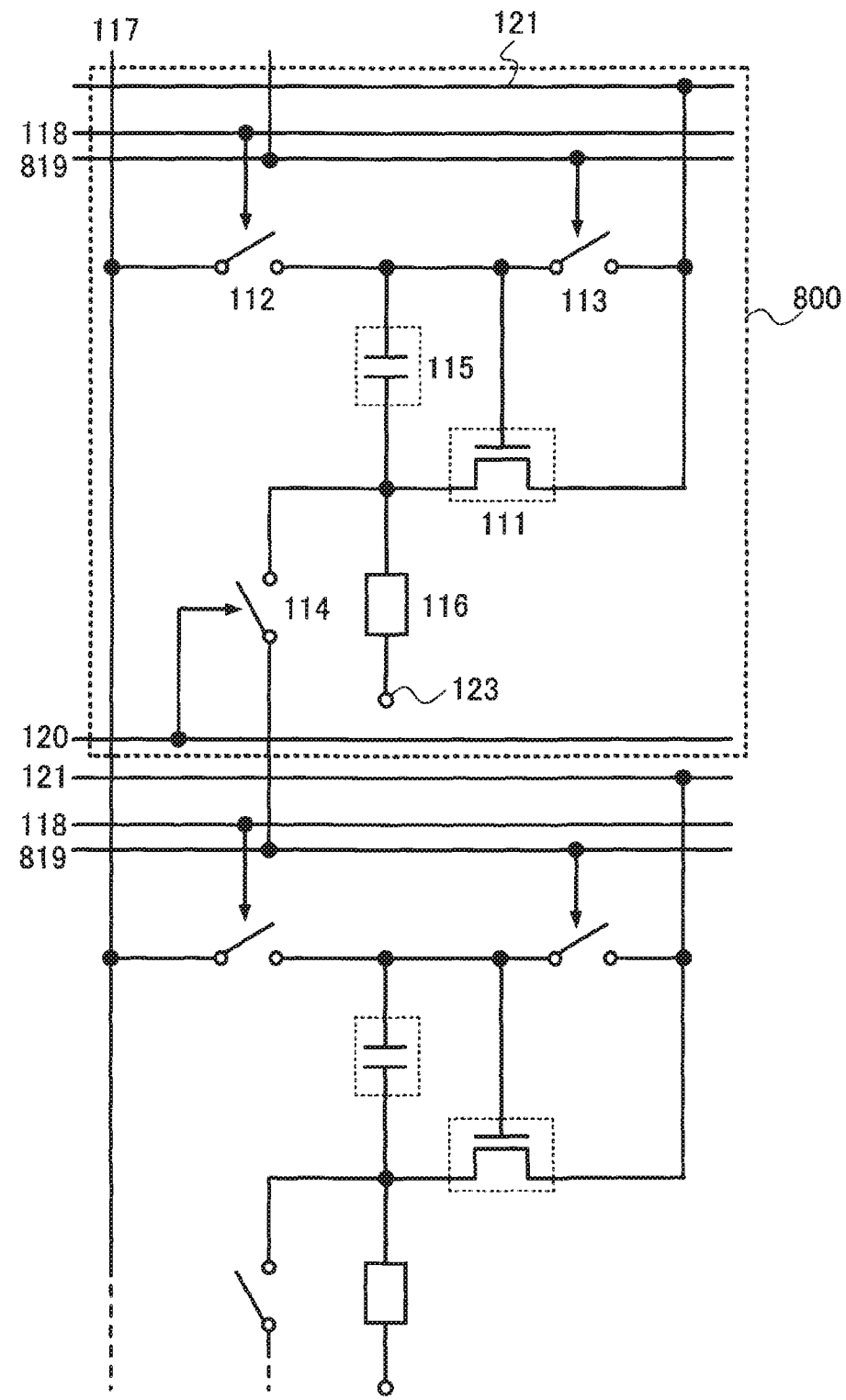
FIG. 8 is a diagram illustrating a pixel structure described in Embodiment Mode 3.

In addition, as shown in a pixel 800 of FIG. 8, a second scan line 819 of a subsequent row may also be used as the potential supply line 122 of FIG. 1. The pixel 800 can also perform similar operation to Embodiment Mode 1. Note that a potential of a signal to turn off the second switch 113 which is supplied from the second scan line 819 is V1-Vth-α (α: an arbitrary positive number). Therefore, it is necessary to use the second switch 113 which is turned off with the potential V1-Vth-α (α: an arbitrary positive number). It is also necessary to perform operation so that the initialization period of the row to which the pixel 800 belongs does not overlap with a threshold write period of the row sharing a wiring.

Note that in the case of using an n-channel transistor for the third switch 114, a potential of a signal to turn off the third switch 114 which is supplied from the third scan line 120 may be lower than the potential V1-Vth-α that is the potential of the signal to turn off the second switch 113 which is supplied from the second scan line 819. In this case, current leakage when the third switch 114 is turned off can be reduced.

Figure 9:
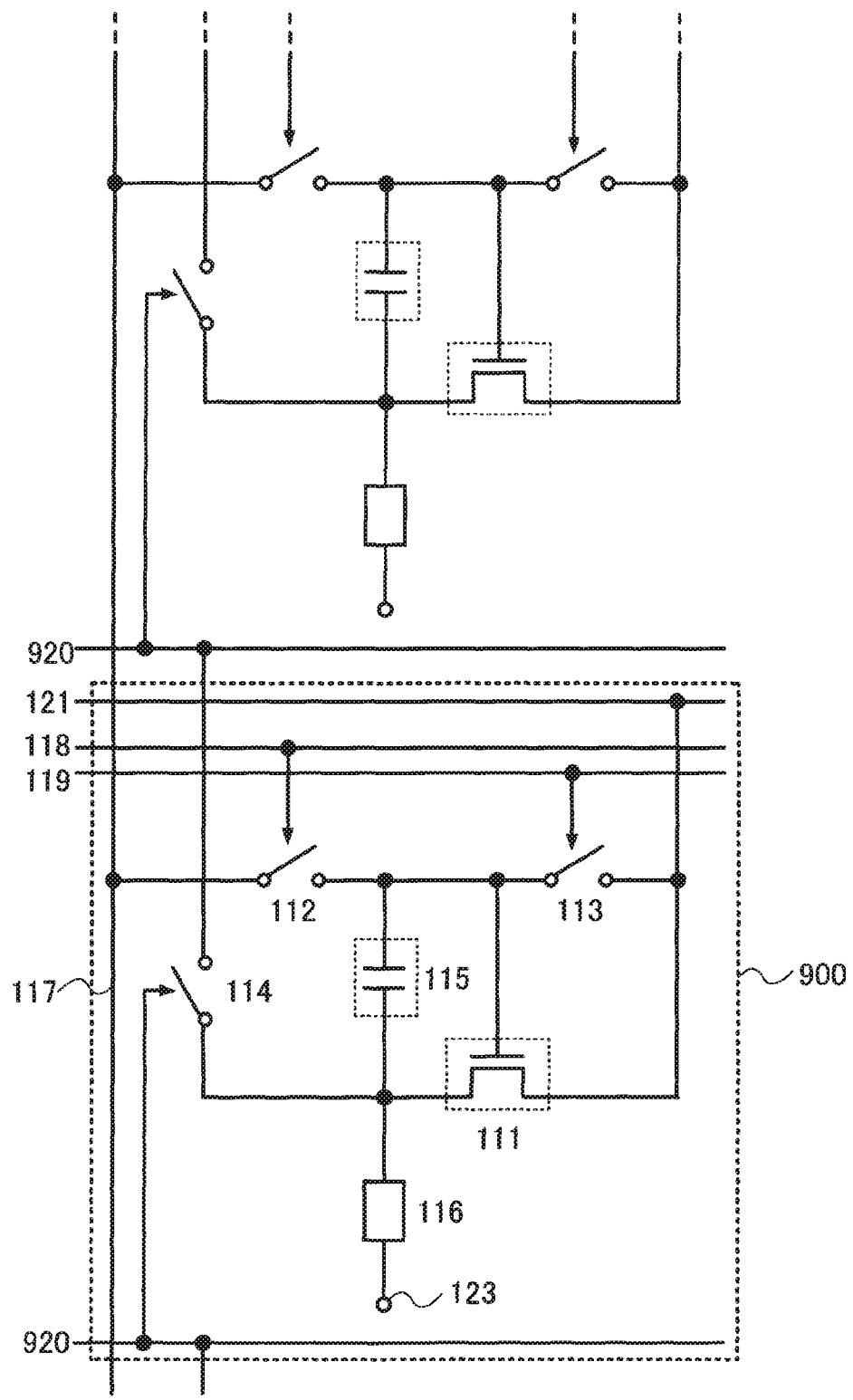
FIG. 9 is a diagram illustrating a pixel structure described in Embodiment Mode 3.

In addition, as shown in a pixel 900 of FIG. 9, the potential supply line 122 of FIG. 1 may also be used as a third scan line 920 of a preceding row. The pixel 900 can also perform similar operation to Embodiment Mode 1. Note that a potential of a signal to turn off a third switch 114 which is supplied from the third scan line 920 is V1-Vth-α (α: an arbitrary positive number). Therefore, it is necessary to use the third switch 114 which is turned off with the potential V1-Vth-α (α: an arbitrary positive number). It is also necessary to perform operation so that the initialization period of the row to which the pixel 900 belongs does not overlap with an initialization period of the row sharing a wiring. However, there is no particular problem when the initialization period is set to be shorter than the data write period.

Note that although this embodiment mode describes the case of using the potential supply line 122 of FIG. 1 also as a scan line of a subsequent or preceding row, any other wiring can be used as long as it can supply the potential V1-Vth-α (α: an arbitrary positive number) in the initialization period.

Further, the pixels described in this embodiment mode can be applied to the display device of FIG. 6. Note that initialization start time can be freely set in respective rows in the display device within the range in which there is limitation on operation of each of the pixels shown in FIGS. 7 to 9 and data write periods in the respective rows do not overlap. In addition, since each pixel can emit light except in its address period, a ratio of a light emitting period to one frame period (that is, a duty ratio) can be significantly high and can be approximately 100%. Therefore, a display device with less luminance variation and a high duty ratio can be provided.

In addition, since a threshold write period can be set to be long, a threshold voltage of a transistor which controls a current value flowing to a light emitting element can be written into a capacitor more accurately. Therefore, reliability as a display device is improved.

This embodiment mode can be freely combined with any of the pixel structures described in Embodiment Modes 1 and 2 besides FIG. 1 described above.

Embodiment Mode 4

In this embodiment mode, a pixel having a structure different from Embodiment Mode 1 is explained with reference to FIG. 10. Note that a common reference numeral is used to denote a component similar to Embodiment Mode 1, and detailed explanation of the same portion or a portion having a similar function is omitted.

Figure 10:
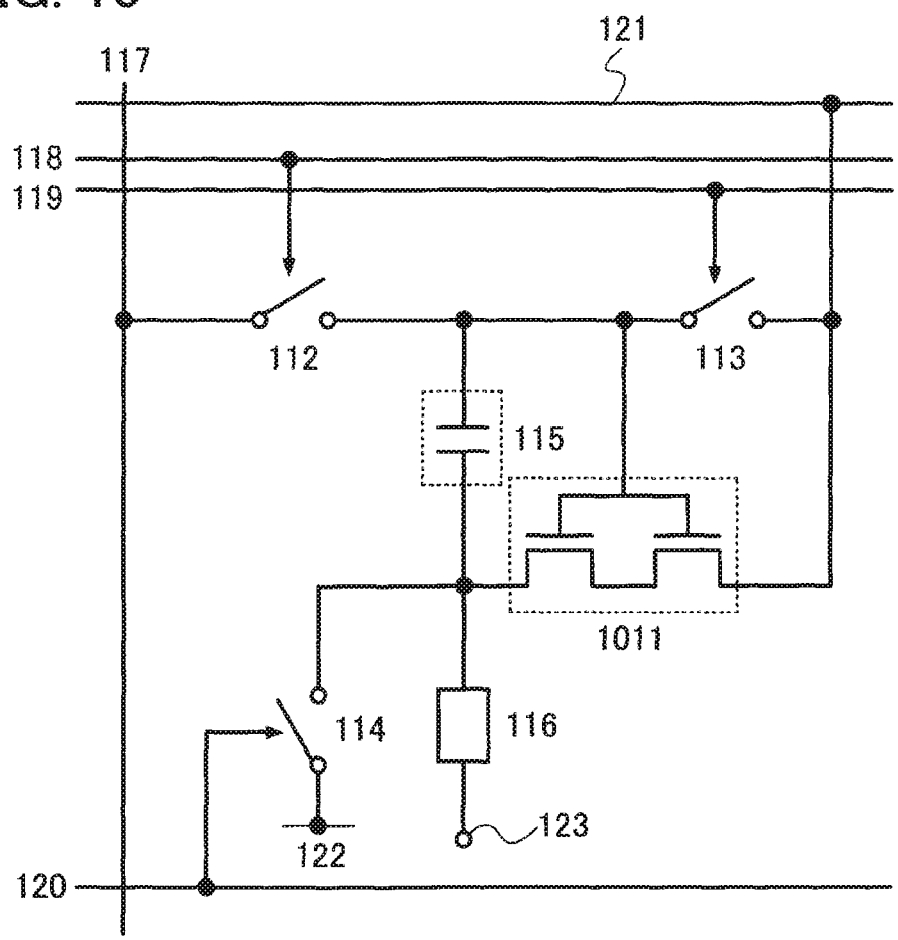
FIG. 10 is a diagram illustrating a pixel structure described in Embodiment Mode 4.

A pixel shown in FIG. 10 includes a transistor 1011, a first switch 112, a second switch 113, a third switch 114, a capacitor 115, and a light emitting element 116. Note that the pixel is connected to a signal line 117, a first scan line 118, a second scan line 119, a third scan line 120, a power supply line 121, and a potential supply line 122.

The transistor 1011 in this embodiment mode is a multi-gate transistor in which two transistors are connected in series, and is provided in the same position as the transistor 111 in Embodiment Mode 1. Note that the number of transistors connected in series is not particularly limited.

By operating the pixel shown in FIG. 10 in a similar manner to Embodiment Mode 1, variation in current value caused by variation in threshold voltage of the transistor 1011 can be suppressed. Thus, current in accordance with luminance data can be supplied to the light emitting element 116, and variation in luminance can be suppressed. In addition, power consumption can be reduced because operation is performed with an opposite electrode fixed at a constant potential. Note that although the operation region of the transistor 1011 is not particularly limited, a more notable effect can be obtained in the saturation region.

Further, when the transistor 1011 is operated in the saturation region, variation in current flowing to the transistor 1011 caused by deterioration of the light emitting element 116 can be suppressed.

When channel widths of the two transistors connected in series are equal to each other, a channel length L of the transistor 1011 in this embodiment mode is equal to the sum of channel lengths of the respective transistors. Thus, a current value which is closer to a constant value can be easily obtained in the saturation region regardless of a drain-source voltage Vds. In particular, the transistor 1011 is effective when it is difficult to manufacture a transistor having a long channel length L. Note that a connection portion of the two transistors functions as a resistor.

Note that it is acceptable as long as the transistor 1011 functions to control a current value supplied to the light emitting element 116, and the kind of the transistor is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, or a bipolar transistor, a transistor using an organic semiconductor or a carbon nanotube, or another transistor can be used.

In the pixel shown in FIG. 10, transistors can be used for the first switch 112, the second switch 113, and the third switch 114 similarly to the pixel shown in FIG. 1.

Furthermore, the pixel described in this embodiment mode can be applied to the display device of FIG. 6. Similarly to Embodiment Mode 1, initialization start time can be freely set in respective rows unless data write periods in the respective rows overlap. In addition, since each pixel can emit light except in its address period, a ratio of a light emitting period to one frame period (that is, a duty ratio) can be significantly high and can be approximately 100%. Therefore, a display device with less luminance variation and a high duty ratio can be provided.

In addition, since a threshold write period can be set to be long, a threshold voltage of a transistor which controls a current value flowing to a light emitting element can be written into a capacitor more accurately. Therefore, reliability as a display device is improved.

Figure 11:
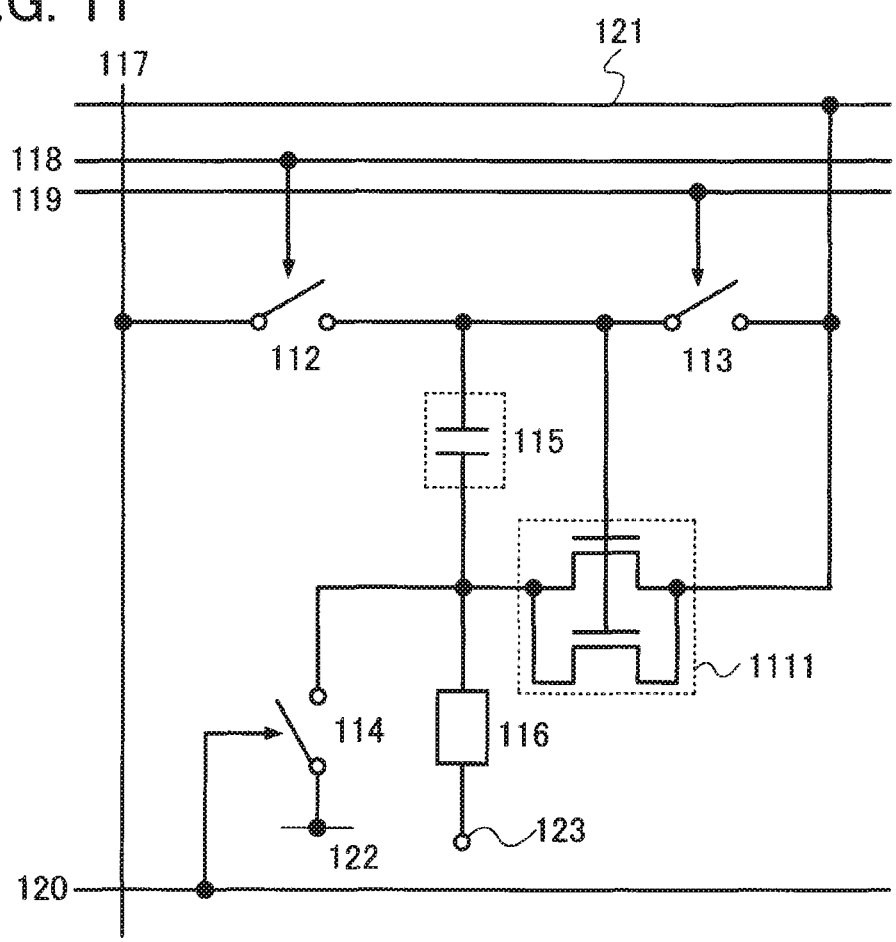
FIG. 11 is a diagram illustrating a pixel structure described in Embodiment Mode 4.

Note that the structure of the transistor 1011 is not limited to that in which transistors are connected in series, and may be that in which transistors are connected in parallel like a transistor 1111 shown in FIG. 11. The transistor 1111 can supply larger current to the light emitting element 116. In addition, since transistor characteristics are averaged by two transistors connected in parallel, original characteristic variation of the transistors included in the transistor 1111 can be reduced. When the variation is reduced, variation in current value caused by variation in threshold voltage of the transistor can be suppressed more easily by the operation shown in FIG. 2.

This embodiment mode can also be applied to any of the pixel structures described in the other embodiment modes as well as FIG. 1 described above.

Embodiment Mode 5

In this embodiment mode, a pixel structure which averages deterioration of transistors over time by periodically switching the transistors which control a current value supplied to a light emitting element in the pixel of the present invention is explained with reference to FIG. 12.

Figure 12:
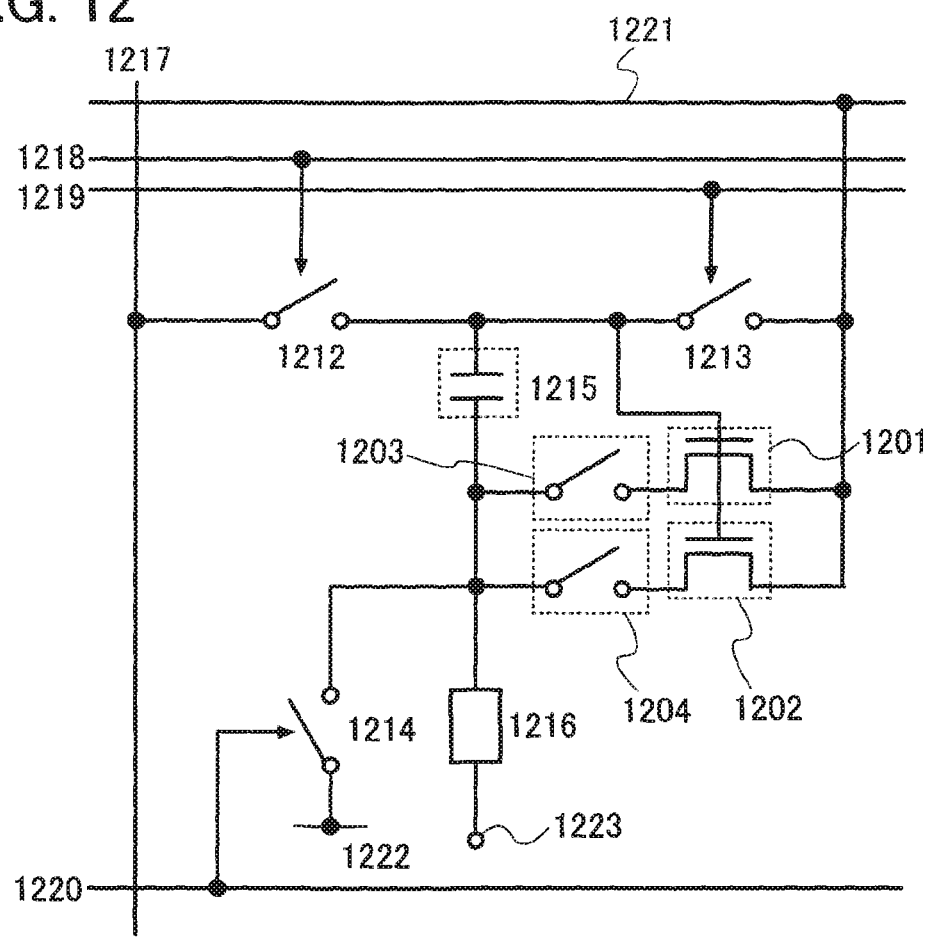
FIG. 12 is a diagram illustrating a pixel structure described in Embodiment Mode 5.

A pixel shown in FIG. 12 includes a first transistor 1201, a second transistor 1202, a first switch 1212, a second switch 1213, a third switch 1214, a fourth switch 1203, a fifth switch 1204, a capacitor 1215, and a light emitting element 1216. Note that the pixel is connected to a signal line 1217, a first scan line 1218, a second scan line 1219, a third scan line 1220, a power supply line 1221, and a potential supply line 1222. In addition, although not shown in FIG. 12, the pixel is also connected to fourth and fifth scan lines which control the fourth switch 1203 and the fifth switch 1204 to be turned on and off. In this embodiment mode, the first transistor 1201 and the second transistor 1202 are n-channel transistors, and each transistor is turned on when a gate-source voltage (Vgs) exceeds a threshold voltage. In addition, a pixel electrode of the light emitting element 1216 is an anode, and an opposite electrode 1223 thereof is a cathode. Note that a gate-source voltage of a transistor is referred to as Vgs and a voltage accumulated in a capacitor is referred to as Vcs. A threshold voltage of the first transistor 1201 is referred to as Vth1 and that of the second transistor 1202 is referred to as Vth2. The power supply line

1221, the potential supply line 1222, and the signal line 1217 are referred to as a first wiring, a second wiring, and a third wiring, respectively.

A first electrode of the first transistor 1201 is connected to the pixel electrode of the light emitting element 1216 through the fourth switch 1203; a second electrode thereof, to the power supply line 1221; and a gate electrode thereof, to the power supply line 1221 through the second switch 1213. In addition, the gate electrode of the first transistor 1201 is also connected to the signal line 1217 through the first switch 1212, and the first electrode of the first transistor 1201 is also connected to the potential supply line 1222 through the fourth switch 1203 and the third switch 1214.

A first electrode of the second transistor 1202 is connected to the pixel electrode of the light emitting element 1216 through the fifth switch 1204; a second electrode thereof, to the power supply line 1221; and a gate electrode thereof, to the power supply line 1221 through the second switch 1213. The gate electrode of the second transistor 1202 is also connected to the signal line 1217 through the first switch 1212, and the first electrode of the second transistor 1202 is also connected to the potential supply line 1222 through the fifth switch 1204 and the third switch 1214. Note that the gate electrodes of the first transistor 1201 and the second transistor 1202 are connected to each other; the second electrodes of the first transistor 1201 and the second transistor 1202 are connected to each other; and the first electrodes of the first transistor 1201 and the second transistor 1202 are connected to each other though the fourth switch 1203 and the fifth switch 1204.

Furthermore, the connected gate electrodes of the first transistor 1201 and the second transistor 1202 are connected to the first electrode of the first transistor 1201 through the capacitor 1215 and the fourth switch 1203 and also connected to the first electrode of the second transistor 1202 through the capacitor 1215 and the fifth switch 1204. In other words, a first electrode of the capacitor 1215 is connected to the gate electrodes of the first transistor 1201 and the second transistor 1202 and a second electrode of the capacitor 1215 is connected to the first electrodes of the first transistor 1201 and the second transistor 1202 through the respective switches. Note that the capacitor 1215 may be formed by sandwiching an insulating film between a wiring, a semiconductor layer, and an electrode or can be omitted by using gate capacitances of the first transistor 1201 and the second transistor 1202.

Note that the first switch 1212, the second switch 1213, and the third switch 1214 are controlled to be turned on and off by inputting signals to the first scan line 1218, the second scan line 1219, and the third scan line 1220, respectively. In FIG. 12, scan lines which control the fourth switch 1203 and the fifth switch 1204 to be turned on and off are omitted.

A signal in accordance with a pixel gray scale level which corresponds to a video signal, that is, a potential in accordance with luminance data is inputted to the signal line 1217.

Next, the operation of the pixel shown in FIG. 12 is explained with reference to a timing chart of FIG. 13. Note that one frame period corresponding to a period for displaying an image for one screen in FIG. 13 is divided into an initialization period, a threshold write period, a data write period, and a light emitting period.

Note that a potential V1 is supplied to the opposite electrode 1223 of the light emitting element 1216, and when a higher value between Vth1 and Vth2 is referred to as Vth, a potential V1-Vth-α (α: an arbitrary positive number) is supplied to the potential supply line 1222. In addition, the potential V1 and a potential V2 are supplied to the power supply line 1221 in an address period and in the light emitting period, respectively. Note that V2>V1.

Here, the potential of the opposite electrode 1223 of the light emitting element 1216 is equal to the potential of the power supply line 1221 in the address period for the purpose of explaining operation. However, when the minimum potential difference which is necessary for the light emitting element 1216 to emit light is referred to as $V_{EL}$, it is acceptable as long as the potential of the opposite electrode 1223 is higher than a potential V1-Vth-α-$V_{EL}$. In addition, it is acceptable as long as the potential V2 of the power supply line 1221 in the light emitting period is higher than the sum of the potential of the opposite electrode 1223 and the minimum potential difference ($V_{EL}$) which is necessary for the light emitting element 1216 to emit light. However, since the potential of the opposite electrode 1223 is V1 here for the purpose of explanation, it is acceptable as long as V2 is higher than V+$V_{EL}$.

Figure 13:
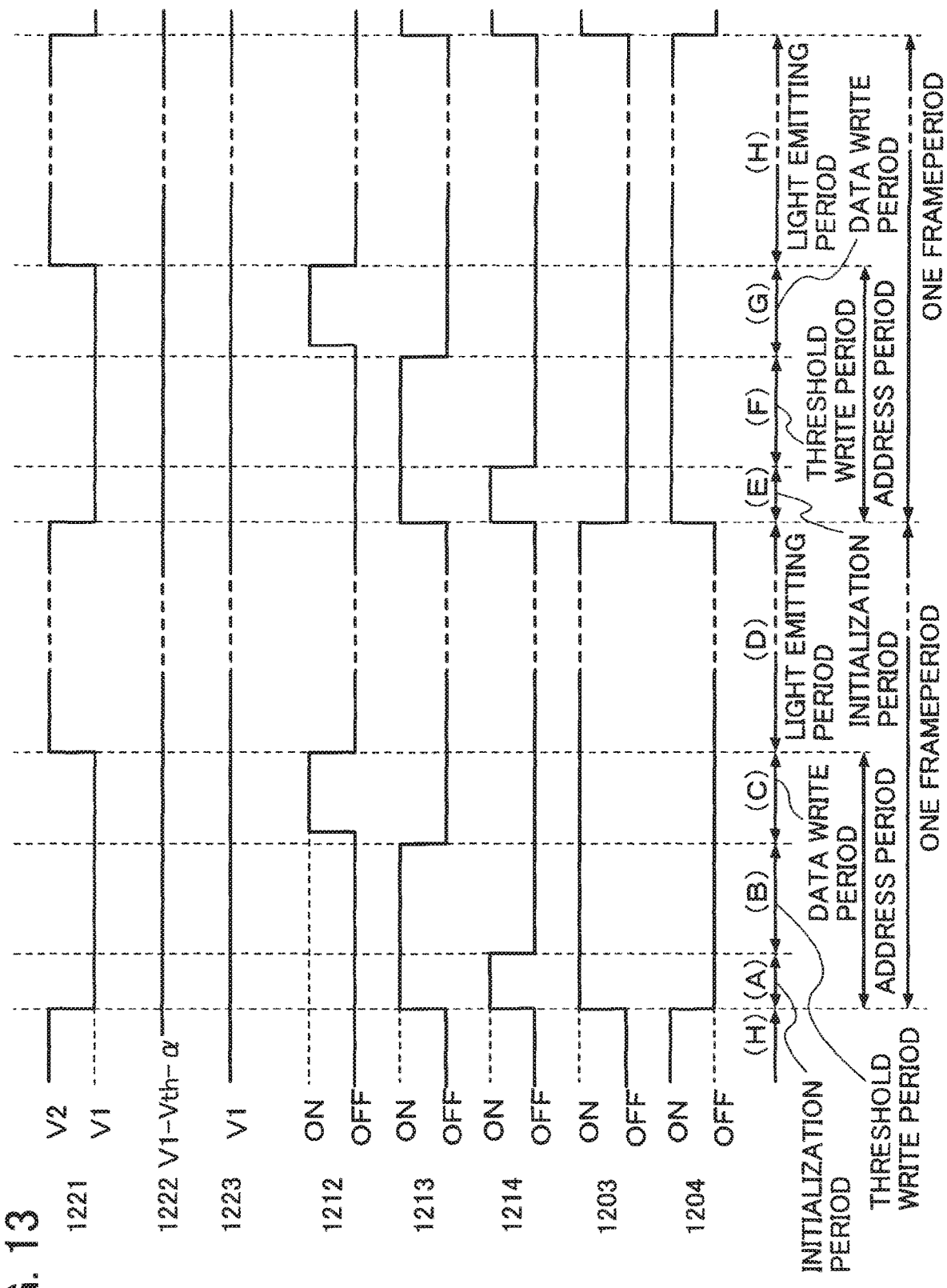
FIG. 13 is a timing chart for explaining operation of the pixel shown in FIG. 12.

First, in the initialization period as shown in (A) in FIG. 13, the first switch 1212 and the fifth switch 1204 are turned off and the second switch 1213, the third switch 1214, and the fourth switch 1203 are turned on. At this time, the first electrode of the first transistor 1201 serves as a source electrode, and a potential thereof is V1-Vth-α. On the other hand, a potential of the gate electrode of the first transistor 1201 is V1. Thus, a gate-source voltage Vgs of the first transistor 1201 is Vth+α and thus the first transistor 1201 is turned on. Then, Vth+α is held by the capacitor 1215 positioned between the gate electrode and the first electrode of the first transistor 1201.

Next, in the threshold write period shown in (B) in FIG. 13, the third switch 1214 is turned off. Therefore, the potential of the first electrode, i.e. the source electrode of the first transistor 1201 rises gradually and when it reaches V1-Vth1, the first transistor 1201 is turned off. Thus, a voltage held by the capacitor 1215 is Vth1.

Next, in the data write period shown in (C) in FIG. 13, the first switch 1212 is turned on and a potential (V1+Vdata) in accordance with luminance data is inputted from the signal line 1217 after turning off the second switch 1213. At this time, the voltage Vcs held by the capacitor 1215 is Vth+ Vdata, and thus the first transistor 1201 is turned on. Note that when a potential Vdata≤0 is inputted, the first transistor 1201 can be turned off so that the light emitting element 1216 does not emit light.

Next, in the light emitting period shown in (D) in FIG. 13, the first switch 1212 is turned off and the potential of the power supply line 1221 is set to V2. At this time, the gate-source voltage Vgs of the first transistor 1201 is equal to Vth1+Vdata, and current in accordance with this Vgs flows to the first transistor 1201 and the light emitting element 1216, so that the light emitting element 1216 emits light.

According to such operation, the current flowing to the light emitting element 1216 does not depend on the threshold voltage (Vth1) of the first transistor 1201 regardless of whether the operation region of the first transistor 1201 is either the saturation region or the linear region.

Furthermore, in an initialization period of a subsequent one frame period shown in (E) in FIG. 13, the fourth switch 1203 is turned off and the second switch 1213, the third switch 1214, and the fifth switch 1204 are turned on. At this time, the first electrode of the second transistor 1202 serves as a source electrode, and a potential thereof is V1-Vth-α. On the other hand, a potential of the gate electrode of the second transistor 1202 is V1. Thus, a gate-source voltage Vgs of the second transistor 1202 is Vth+α, so that the second transistor 1202 is turned on. Then, Vth+α is held by the capacitor 1215 positioned between the gate electrode and the first electrode of the second transistor 1202.

Next, in the threshold write period shown in (F) in FIG. 13, the third switch 1214 is turned off. Therefore, the potential of the first electrode, i.e. the source electrode of the second transistor 1202 rises gradually and when it reaches V1-Vth2, the second transistor 1202 is turned off. Thus, a voltage held by the capacitor 1215 is Vth2.

Next, in the data write period shown in (G) in FIG. 13, the first switch 1212 is turned on and a potential (V1+Vdata) in accordance with luminance data is inputted from the signal line 1217 after turning off the second switch 1213. At this time, the voltage Vcs held by the capacitor 1215 is Vth2+Vdata, and thus the second transistor 1202 is turned on.

Next, in the light emitting period shown in (H) in FIG. 13, the first switch 1212 is turned off and the potential of the power supply line 1221 is set to V2. At this time, the gate-source voltage Vgs of the second transistor 1202 is equal to Vth2+Vdata, and current in accordance with this Vgs flows to the second transistor 1202 and the light emitting element 1216, so that the light emitting element 1216 emits light.

The current flowing to the light emitting element 1216 does not depend on the threshold voltage (Vth2) regardless of whether the operation region of the second transistor 1202 is either the saturation region or the linear region.

Therefore, by controlling current supplied to the light emitting element using either the first transistor 1201 or the second transistor 1202, variation in current value caused by variation in threshold voltage of the transistor can be suppressed and a current value in accordance with luminance data can be supplied to the light emitting element 1216. Note that by reducing a load on each transistor by switching between the first transistor 1201 and the second transistor 1202, changes over time in threshold voltage of the transistors can be reduced.

Accordingly, variation in luminance caused by variation in threshold voltages of the first transistor 1201 and the second transistor 1202 can be suppressed. In addition, since the potential of the opposite electrode is fixed, power consumption can be reduced.

Further, in the case of operating the first transistor 1201 and the second transistor 1202 in the saturation region, variation in current flowing to each transistor due to deterioration of the light emitting element 1216 can also be suppressed.

Note that in the case of operating the first transistor 1201 and the second transistor 1202 in the saturation region, the channel lengths L of these transistors are preferably long.

In addition, since a reverse bias voltage is applied to the light emitting element 1216 in the initialization period, a shorted portion in the light emitting element can be insulated and deterioration of the light emitting element can be suppressed. Thus, the lifetime of the light emitting element can be extended.

Note that since the variation in current value caused by variation in threshold voltage of the transistors can be suppressed, supply destination of the current controlled by the transistors is not particularly limited. Therefore, an EL element (an organic EL element, an inorganic EL element, or an EL element containing an organic material and an inorganic material), an electron emitting element, a liquid crystal element, electronic ink, or the like can be used as the light emitting element 1216 shown in FIG. 12.

In addition, it is acceptable as long as the first transistor 1201 and the second transistor 1202 function to control a current value supplied to the light emitting element 1216, and the kind of the transistors is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, a bipolar transistor, a transistor using an organic semiconductor or a carbon nanotube, or another transistor can be used.

The first switch 1212 selects timing to input a signal in accordance with a pixel gray scale level to the capacitor. The second switch 1213 selects timing to apply a predetermined potential to the gate electrode of the first transistor 1201 or the second transistor 1202. The third switch 1214 selects timing to apply a predetermined potential for initializing a potential written in the capacitor 1215. Therefore, the first switch 1212, the second switch 1213, and the third switch 1214 are not particularly limited as long as they have the above functions. For example, each of the switches may be a transistor, a diode, or a logic circuit that is a combination thereof. Note that the first to third switches are not particularly necessary if the signal or potential can be applied to the pixel at the above timing. Further, the fourth switch 1203 and the fifth switch 1204 are also not particularly limited, each of which may be, for example, a transistor, a diode, or a logic circuit that is a combination thereof.

In the case of using n-channel transistors for the first switch 1212, the second switch 1213, the third switch 1214, the fourth switch 1203, and the fifth switch 1204, a manufacturing process can be simplified because the pixel can be formed using only an n-channel transistors. In addition, a non-crystalline semiconductor such as an amorphous semiconductor or a semi-amorphous semiconductor (also referred to as a microcrystalline semiconductor) can be used for a semiconductor layer of each transistor included in the pixel. For example, amorphous silicon (a-Si:H) can be used as the amorphous semiconductor. The manufacturing process can further be simplified by using these non-crystalline semiconductors. Accordingly, a reduction in manufacturing cost and an improvement in yield can be achieved.

Note that in the case of using transistors for the first switch 1212, the second switch 1213, the third switch 1214, the fourth switch 1203, and the fifth switch 1204, the polarity (conductivity type) of the transistors is not particularly limited. However, it is desirable to use a transistor having a polarity with lower off-current.

Figure 41:
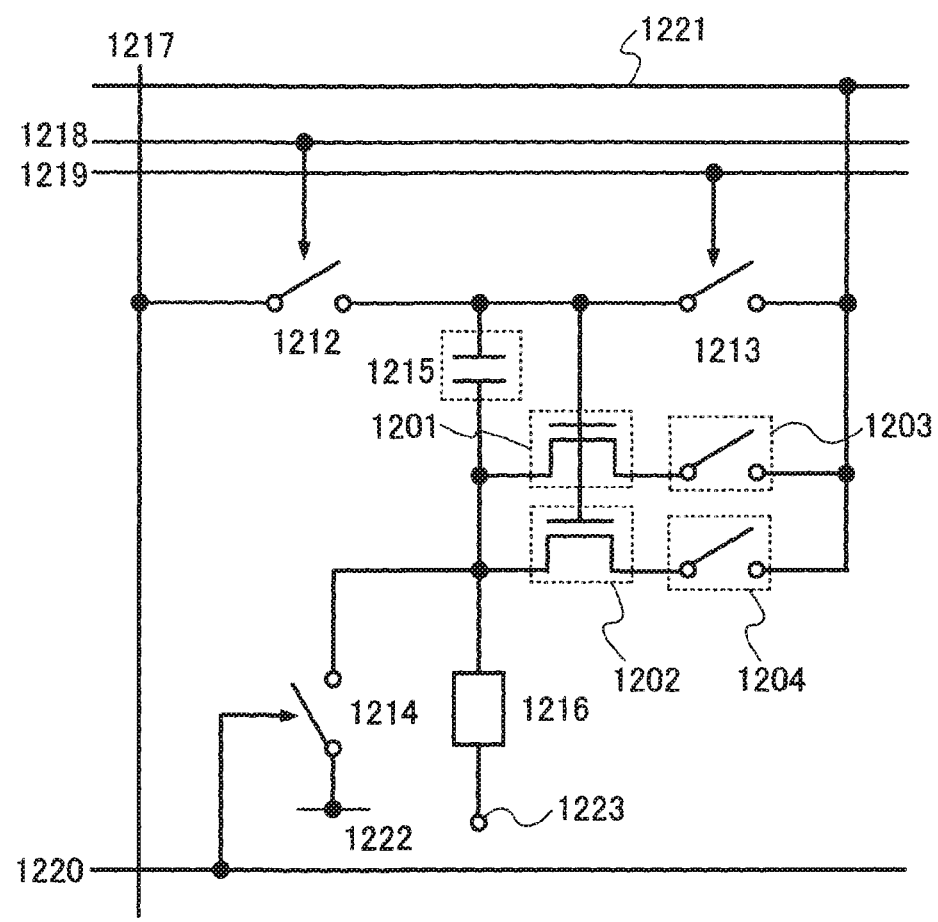
FIG. 41 is a diagram illustrating a pixel structure described in Embodiment Mode 5.

In addition, the first transistor 1201 and the fourth switch 1203, and the second transistor 1202 and the fifth switch 1204 are interchangeable as shown in FIG. 41. In other words, the first electrodes of the first transistor 1201 and the second transistor 1202 are connected to the gate electrodes of the first transistor 1201 and the second transistor 1202 through the capacitor 1215. The second electrode of the first transistor 1201 is connected to the power supply line 1221 through the fourth switch 1203, and the second electrode of the second transistor 1202 is connected to the power supply line 1221 through the fifth switch 1204.

FIGS. 12 and 41 show the case where the number of elements arranged in parallel is two using a transistor and a switch as a set, that is, using the first transistor 1201 and the fourth switch 1203 as a set, and the second transistor 1202 and the fifth switch 1204 as a set. However, the number of elements arranged in parallel is not particularly limited.

By applying the pixel described in this embodiment mode to the display device of FIG. 6, initialization start time can be freely set in respective rows similarly to Embodiment Mode 1 unless data write periods in the respective rows overlap. In addition, since each pixel can emit light except in its address period, a ratio of a light emitting period to one frame period (that is, a duty ratio) can be significantly high and can be approximately 100%. Therefore, a display device with less luminance variation and a high duty ratio can be provided.

In addition, since a threshold write period can be set to be long, a threshold voltage of a transistor which controls a current value flowing to a light emitting element can be written into a capacitor more accurately. Thus, reliability as a display device is improved.

Note that the potential supply line 1222 can also be used as a wiring of another row similarly to Embodiment Mode 3. In addition, similarly to Embodiment Mode 4, a multi-gate transistor in which transistors are connected in series, or transistors arranged in parallel may be used for each of the first transistor 1201 and the second transistor 1202. Moreover, this embodiment mode can be applied to any of the pixel structures described in Embodiment Modes 1 to 4.

Embodiment Mode 6

In this embodiment mode, a pixel having a structure different from Embodiment Mode 1 is described. A common reference numeral is used to denote a component similar to Embodiment Mode 1, and detailed explanation of the same portion or a portion having a similar function is omitted. Note that such portions are operated in a similar manner to Embodiment Mode 1.

In this embodiment mode, a pixel structure which forcibly prevents current from flowing to a light emitting element 116 is explained. In other words, this embodiment mode aims to obtain a display device in which an afterimage is hardly seen and moving image characteristics are excellent by forcibly putting a light emitting element into a non-light emitting state.

Figure 29:
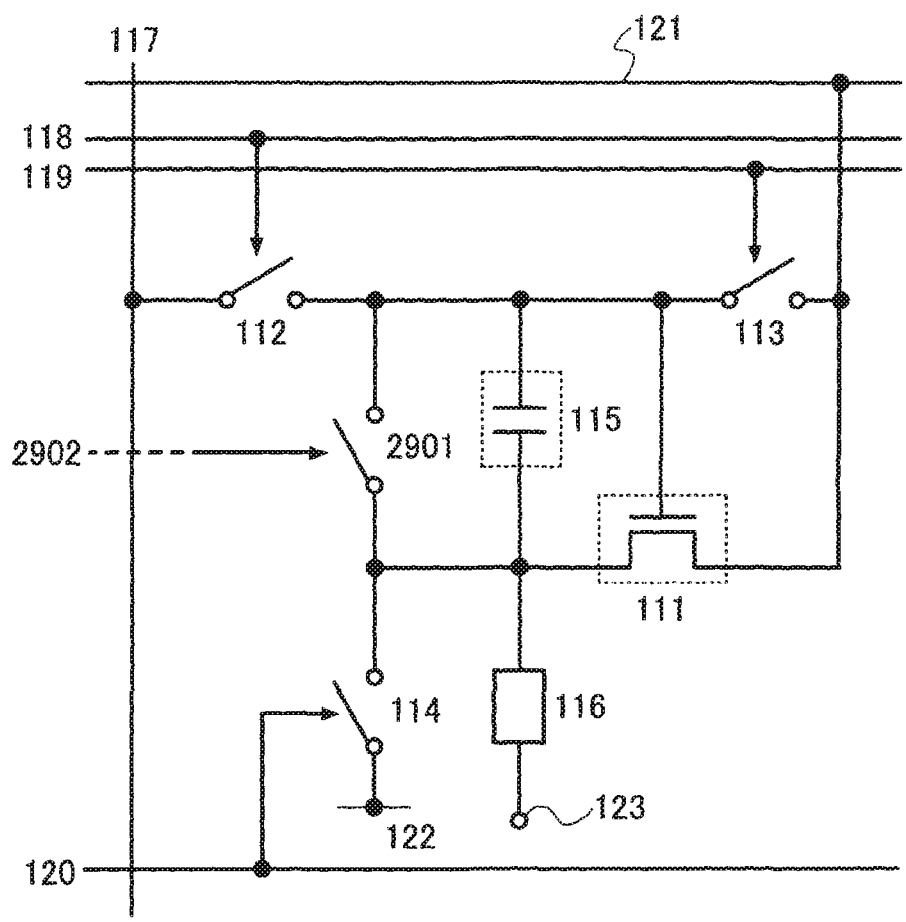
FIG. 29 is a diagram illustrating a pixel structure described in Embodiment Mode 6.

One of such pixel structures is shown in FIG. 29. A pixel shown in FIG. 29 includes a fourth switch 2901 in addition to the transistor 111, the first switch 112, the second switch 113, the third switch 114, the capacitor 115, and the light emitting element 116 which are included in the pixel of FIG. 1. The pixel is connected to a fourth scan line 2902 in addition to the signal line 117, the first scan line 118, the second scan line 119, the third scan line 120, the power supply line 121, and the potential supply line 122.

In FIG. 29, the fourth switch 2901 is connected in parallel with the capacitor 115. Therefore, the gate electrode and the first electrode of the transistor 111 are short-circuited when the fourth switch 2901 is turned on. Then, since a gate-source voltage of the transistor 111 held by the capacitor 115 can be 0 V, the transistor 111 is turned off and the light emitting element 116 can be put into a non-light emitting state. Note that the fourth switch 2901 can be controlled to be turned on and off by scanning pixels from row to row with a signal inputted to the fourth scan line 2902.

According to such operation, a signal written in the pixel is erased. Thus, an erase period in which the light emitting element is forcibly put in a non-light emitting state is provided until a subsequent initialization period. In other words, black display is inserted. Accordingly, an afterimage becomes less perceptible and moving image characteristics can be improved.

Meanwhile, as a driving method of a display device for expressing a gray scale, there are an analog gray scale method and a digital gray scale method. The analog gray scale method includes a method to control the emission intensity of a light emitting element in an analog manner and a method to control the emission time of a light emitting element in an analog manner. Between the two, the method to control the emission intensity of a light emitting element in an analog manner is often used. On the other hand, in the digital gray scale method, a light emitting element is turned on/off by control in a digital manner to express a gray scale. The digital gray scale method has the advantage of high resistance to noise because processing can be performed using a digital signal. However, there are only two states, that is, a light emitting state and a non-light emitting state, so that only two gray scale levels can be expressed. Therefore, multiple level gray scale display is attempted by using another method in combination. As a technique for multiple level gray scale display, there are an area gray scale method in which light emission area of a pixel is weighted and selected to perform gray scale display and a time gray scale method in which light emission time is weighted and selected to perform gray scale display.

Figure 42:
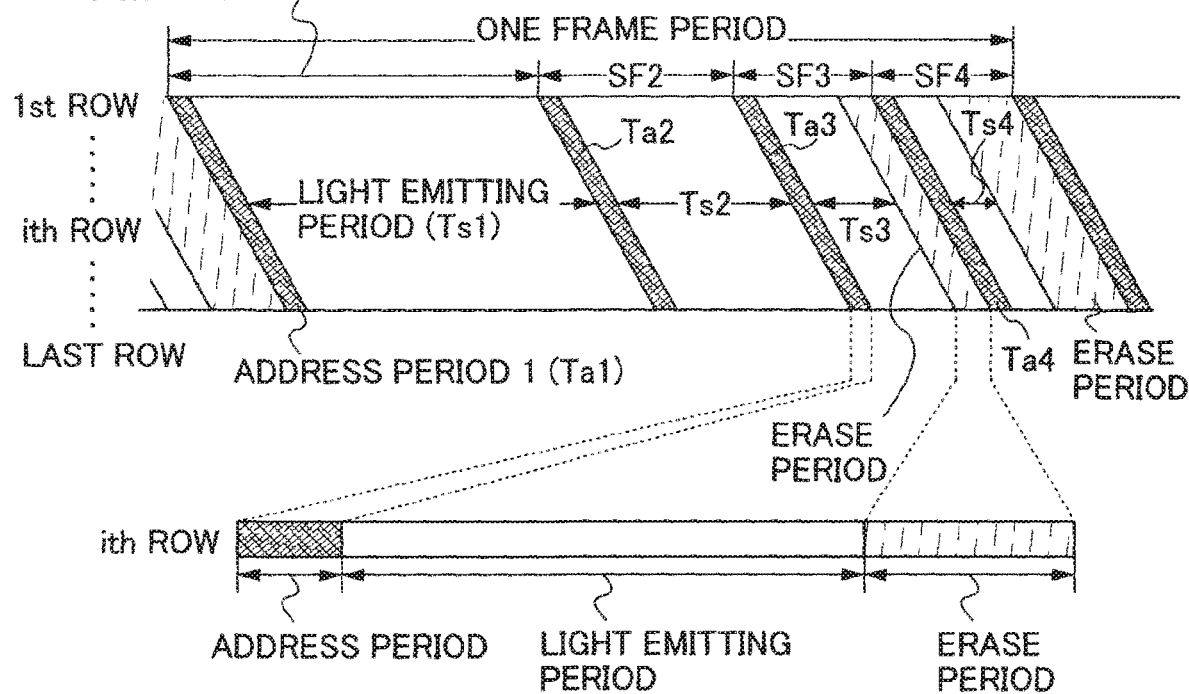
FIG. 42 is a diagram illustrating a driving method which combines a digital gray scale method and a time gray scale method.

In the case of combining the digital gray scale method and the time gray scale method, one frame period is divided into a plurality of subframe periods (SFn) as shown in FIG. 42. Each subframe period includes an address period (Ta) including an initialization period, a threshold write period, and a data write period and a light emitting period (Ts). Note that subframe periods, the number of which corresponds to the number of display bits n, are provided in one frame period. In addition, a ratio of lengths of light emitting periods in respective subframe periods is set to satisfy $2^{(2n-1)}:2^{(n-2)} \ldots : 2:1$; light emission or non-light emission of a light emitting element is selected in each light emitting period; and a gray scale is expressed using a difference in total time in one frame period for which the light emitting element emits light. When the total time of light emission in one frame period is long, luminance is high, and when short, luminance is low. Note that FIG. 42 shows an example of a 4-bit gray scale, in which one frame period is divided into four subframe periods and $2^4=16$ gray scale levels can be expressed by a combination of light emitting periods. Note that a gray scale can also be expressed when a ratio of lengths of light emitting periods is not a power-of-two ratio. Further, a subframe period may further be divided.

Note that in the case of attempting multiple level gray scale display by using the time gray scale method as described above, the length of a light emitting period of a lower-order bit is short. Therefore, when data write operation is started immediately upon termination of a light emitting period of a preceding subframe period, it overlaps with data write operation of the preceding subframe period, and thus normal operation cannot be performed. Therefore, by providing an erase period as described above in a subframe period, light emission shorter than data write periods necessary for all rows can be expressed. In other words, a light emitting period can be freely set.

The present invention is effective particularly in the display analog gray scale method. Furthermore, it is effective to provide an erase period because a light emitting period can be freely set also in a method combining the digital gray scale method and the time gray scale method.

The erase period may be provided by providing another switch in the path of current flow from the power supply line 121 to the pixel electrode of the light emitting element 116 through the transistor 111 and turning off the switch by scanning pixels row by row.

Figure 30:
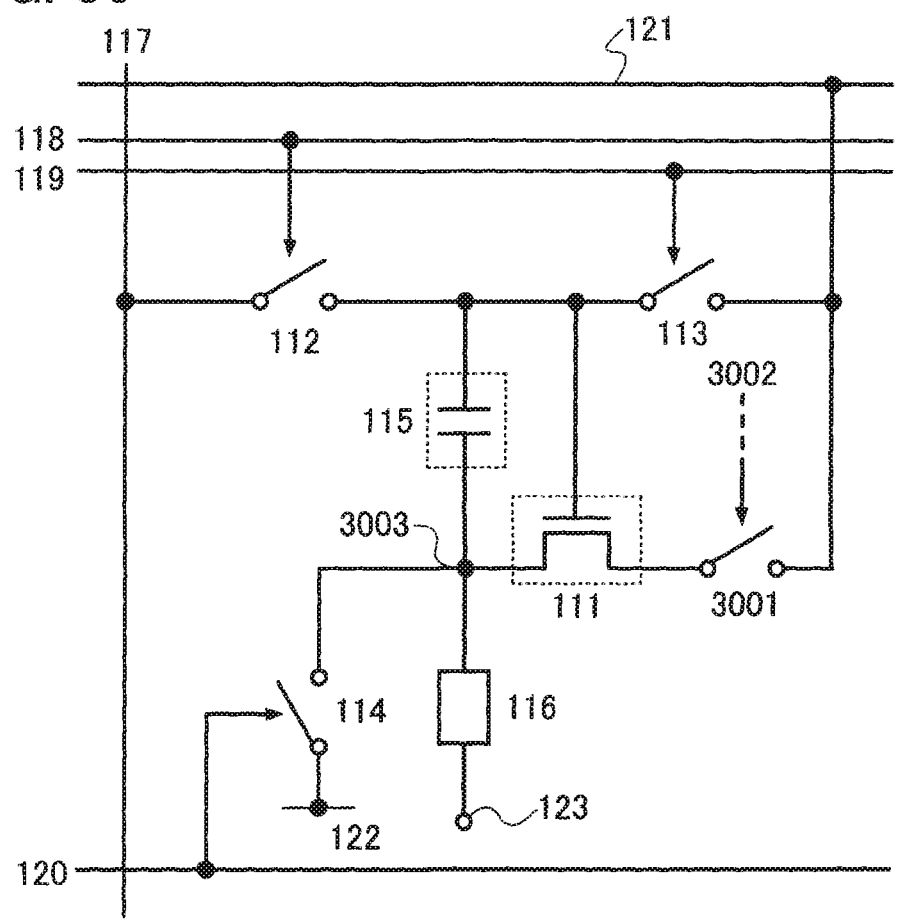
FIG. 30 is a diagram illustrating a pixel structure described in Embodiment Mode 6.

One of such structures is shown in FIG. 30. In the structure of FIG. 30, a fourth switch 3001 is connected between the second electrode of the transistor 111 and the power supply line 121, in addition to the pixel structure of FIG. 1. The fourth switch 3001 is controlled to be turned on and off by a signal inputted to a fourth scan line 3002.

Figure 37:
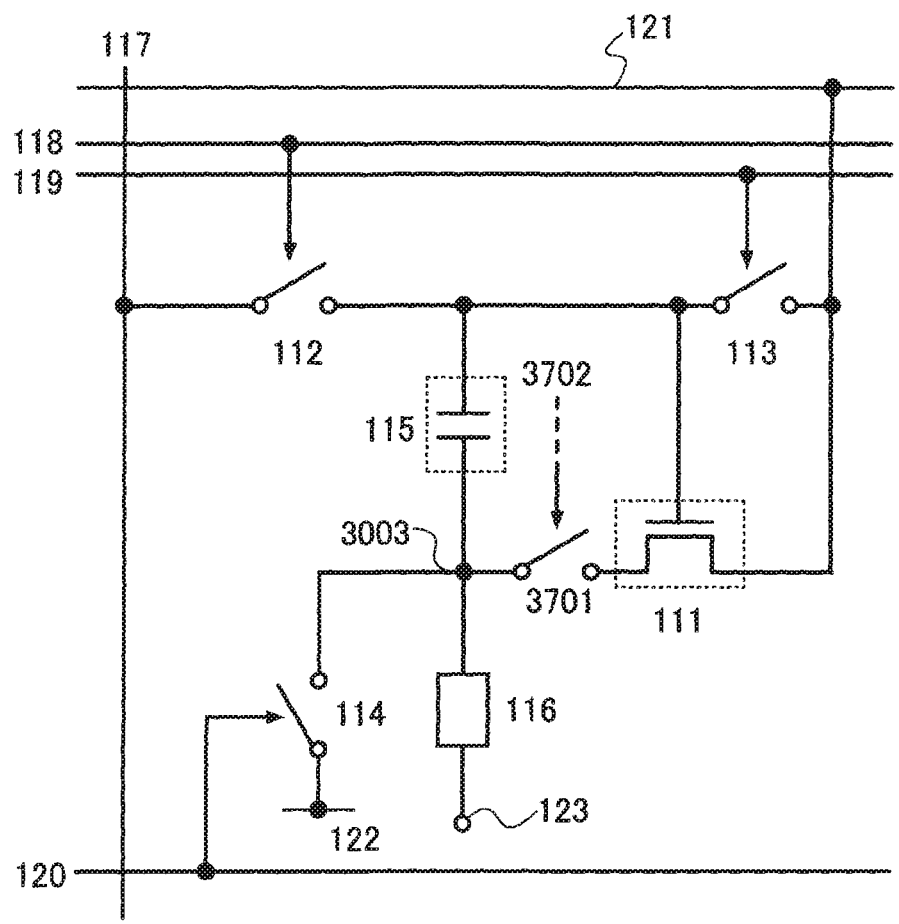
FIG. 37 is a diagram illustrating a pixel structure described in Embodiment Mode 6.

When a connection point of the first electrode of the transistor 111 and the pixel electrode of the light emitting element 116 is referred to as a node 3003, a fourth switch 3701 may be connected between the node 3003 and the first electrode of the transistor 111 as shown in FIG. 37. The fourth switch 3701 is controlled to be turned on and off by a signal inputted to the fourth scan line 3702.

Thus, an erase period can be provided by turning off the fourth switch. In addition, when operating the pixels shown in FIGS. 30 and 37 similarly to Embodiment Mode 1, power consumption can also be reduced by turning off the fourth switch in an initialization period.

Figure 43:
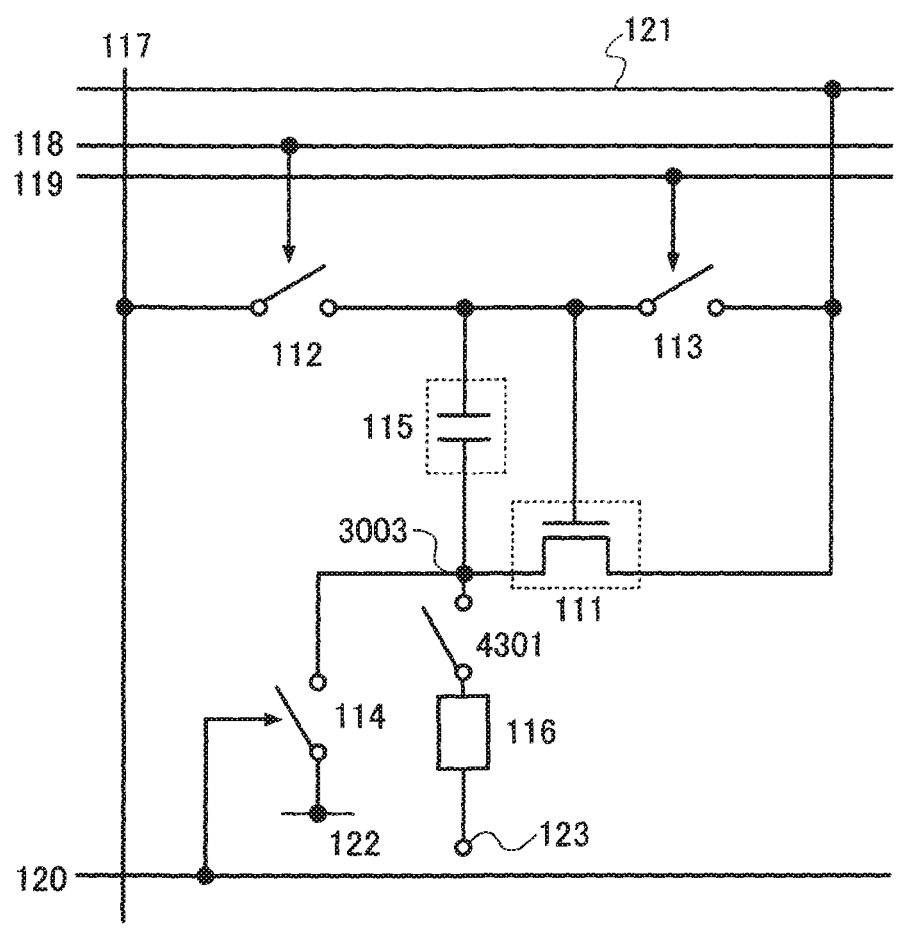
FIG. 43 is a diagram illustrating a pixel structure described in Embodiment Mode 6.
Figure 44:
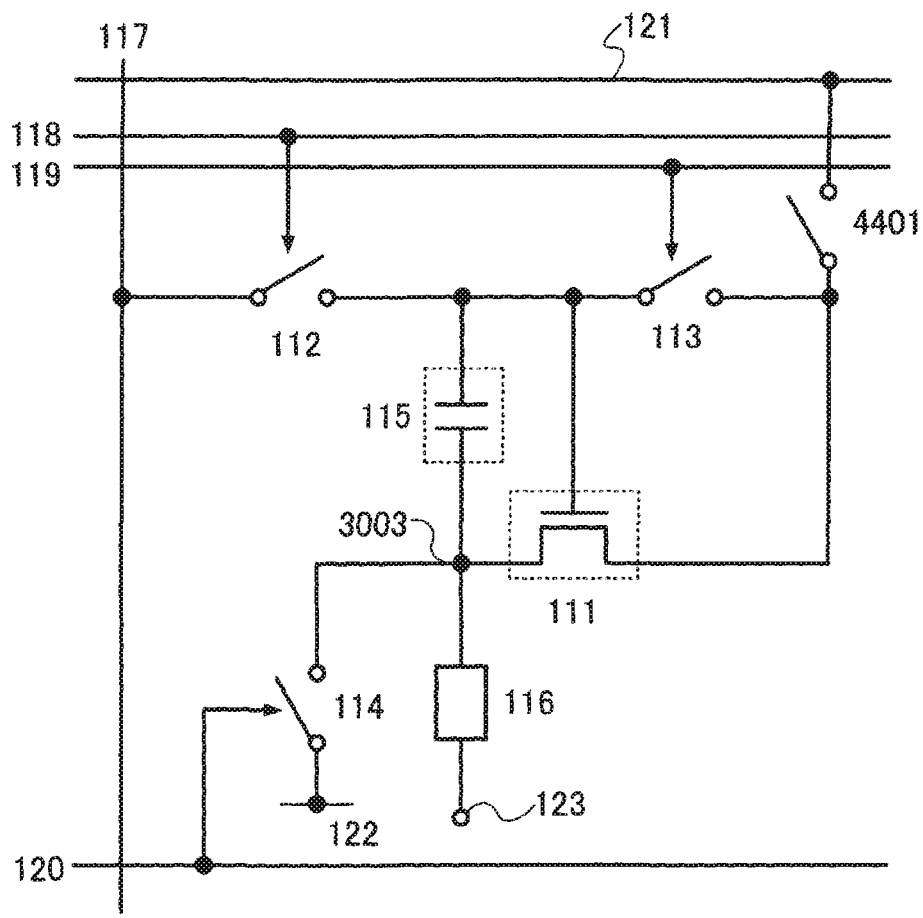
FIG. 44 is a diagram illustrating a pixel structure described in Embodiment Mode 6.

Note that the erase period can be provided by connecting a fourth switch 4301 between the node 3003 and the pixel electrode of the light emitting element 116 as shown in FIG. 43 as well as FIGS. 30 and 37. Alternatively, the erase period can be provided by connecting a fourth switch 4401 between a connection point of the second electrode of the transistor 111 and the second switch 113, and the power supply line 121 as shown in FIG. 44.

Further, the erase period may be forcibly provided by inputting a potential to the gate electrode of the transistor 111.

Figure 31:
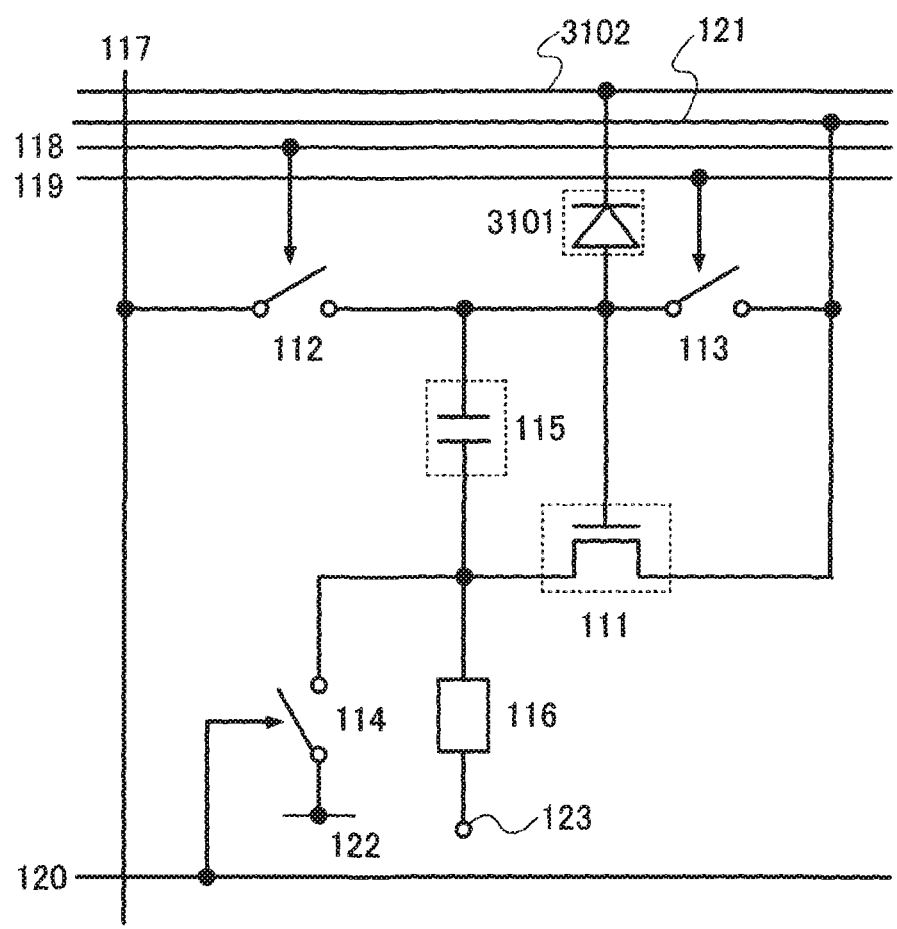
FIG. 31 is a diagram illustrating a pixel structure described in Embodiment Mode 6.

One of such structures is shown in FIG. 31. The structure of FIG. 31 includes a rectifier element 3101 in addition to the pixel structure of FIG. 1, and the gate electrode of the transistor 111 and a fourth scan line 3102 are connected to each other through the rectifier element 3101. Note that when the transistor 111 is an n-channel transistor, the rectifier element 3101 is connected so that current flows from the gate electrode of the transistor 111 to the fourth scan line 3102. As to the fourth scan line 3102, an L-level signal is inputted only when forcibly turning off the transistor 111, and otherwise, an H-level signal is inputted. Then, current does not flow to the rectifier element 3101 when the fourth scan line is at an H level, and current flows to the fourth scan line 3102 from the transistor 111 when at an L level. By causing current to flow to the fourth scan line 3102 as described above, a voltage held by the capacitor 115 is lowered to the threshold voltage (Vth) of the transistor 111 or less, and the transistor 11 is forcibly turned off. Note that an L-level potential needs to be determined so that the potential of the gate electrode of the transistor 111 does not become equal to or lower than a potential which is higher than the L-level potential by a forward threshold voltage of the rectifier element 3101. In addition, in the case of using a switch which is turned off with the L-level potential for each of the first switch 112 and the second switch 113, the fourth scan line 3102 may be substituted with the first scan line 118 or the second scan line 119.

Note that a pixel structure is not particularly limited to the above structure because an afterimage can be made less perceptible by inserting black display as long as the pixel structure includes a means to forcibly put a light emitting element into a non-light emitting state.

Note that the Schottky-barrier diode, the PIN diode, the PN diode, the diode-connected transistor, or the like shown in FIG. 39B can be used for the rectifier element 3101.

Note that the switch for providing the erase period described in this embodiment mode can be applied to the pixel structure described in any of the other embodiment modes as well as that of FIG. 1 described above.

Without providing such a switch, the initialization period can also serve as the erase period by setting the initialization period to be long. Thus, moving image characteristics can be improved by setting the length of a period in which black display is desired to be performed in order to make an afterimage less perceptible to be equal to that of the initialization period when operating any of the pixels described in Embodiment Modes 1 to 5. Further, black display may be inserted by equalizing the potential of the power supply line 121 to the potential of the opposite electrode 123 in the light emitting period.

Note that when the transistor 111 is turned on in the data write period in the pixel structure shown in FIG. 30, current flow to the transistor 111 can be blocked by turning off the fourth switch 3001. Thus, since variation in potential of the second electrode of the capacitor 115 which is connected to the source electrode of the transistor 111 can be suppressed, a voltage Vth+Vdata can be held by the capacitor 115 more accurately. Consequently, more accurate current in accordance with luminance data can be supplied to the light emitting element 116.

In addition, since the pixel structure shown in FIG. 37 can also suppress variation in potential of the second electrode of the capacitor 115 by turning off the fourth switch 3701 in the data write period also in, a voltage Vth+Vdata can be held by the capacitor 115 more accurately. Thus, more accurate current in accordance with luminance data can be supplied to the light emitting element 116.

Note that the pixel described in this embodiment mode can be applied to the display device described in Embodiment Mode 1. Accordingly, a display device with less luminance variation and excellent moving image characteristics can be obtained.

Embodiment Mode 7

In this embodiment mode, the case of applying a p-channel transistor to a transistor which controls a current value supplied to a light emitting element is explained with reference to FIG. 14.

Figure 14:
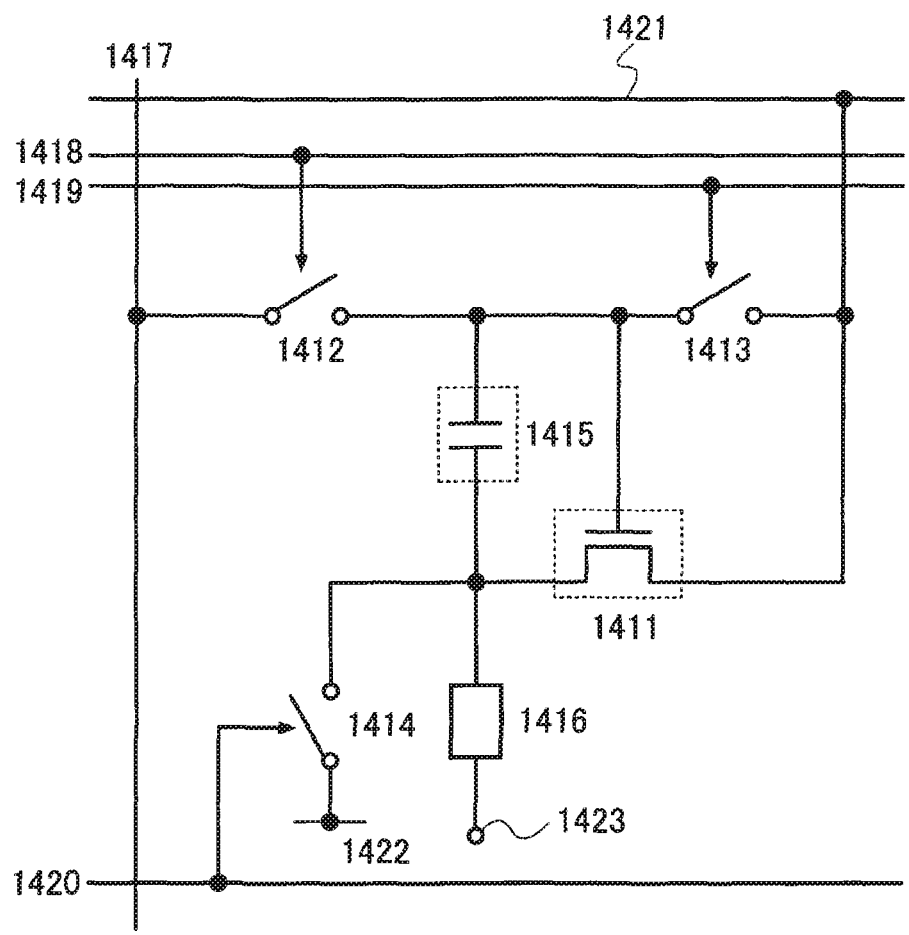
FIG. 14 is a diagram illustrating a pixel structure described in Embodiment Mode 7.

A pixel shown in FIG. 14 includes a transistor 1411, a first switch 1412, a second switch 1413, a third switch 1414, a capacitor 1415, and a light emitting element 1416. Note that the pixel is connected to a signal line 1417, a first scan line 1418, a second scan line 1419, a third scan line 1420, a power supply line 1421, and a potential supply line 1422. In this embodiment mode, the transistor 1411 is a p-channel transistor, and is turned on when the absolute value of its gate-source voltage (|Vgs|) exceeds that of a threshold voltage (|Vth|) (when Vgs is below Vth). In addition, a pixel electrode of the light emitting element 1416 is a cathode and an opposite electrode 1423 thereof is an anode. Note that the absolute value of a gate-source voltage of the transistor is denoted by |Vgs|, the absolute value of a threshold voltage is denoted by |Vth|, and the power supply line 1421, the potential supply line 1422, and the signal line 1417 are also referred to as a first wiring, a second wiring, and a third wiring, respectively.

A first electrode (one of either a source electrode or a drain electrode) of the transistor 1411 is connected to the pixel electrode of the light emitting element 1416; a second electrode (the other of either the source electrode or the drain electrode) of the transistor 1411, to the power supply line

1421; and a gate electrode of the second transistor 1411, to the power supply line 1421 through the second switch 1413. In addition, the gate electrode of the transistor 1411 is also connected to the signal line 1417 through the first switch 1412, and the first electrode thereof is also connected to the potential supply line 1422 through the third switch 1414.

Further, the capacitor 1415 is connected between the gate electrode and the first electrode of the transistor 1411. In other words, a first electrode of the capacitor 1415 is connected to the gate electrode of the transistor 1411 and a second electrode thereof is connected to the first electrode of the transistor 1411. Note that the capacitor 1415 may be formed by sandwiching an insulating film between a wiring, a semiconductor layer, and an electrode or can be omitted by using a gate capacitance of the transistor 1411.

Note that the first switch 1412, the second switch 1413, and the third switch 1414 are controlled to be turned on and off by inputting signals to the first scan line 1418, the second scan line 1419, and the third scan line 1420, respectively.

A signal in accordance with a pixel gray scale level which corresponds to a video signal, that is, a potential in accordance with luminance data is inputted to the signal line 1417.

Next, the operation of the pixel shown in FIG. 14 is explained with reference to a timing chart of FIG. 15 and FIGS. 16A to 16D. Note that one frame period corresponding to a period for displaying an image for one screen in FIG. 14 is divided into an initialization period, a threshold write period, a data write period, and a light emitting period. The initialization period, the threshold write period, and the data write period are collectively referred to as an address period. The length of one frame period is not particularly limited, but is preferably 1/60 second or less so that an image viewer does not perceive flicker.

Note that a potential V1 is inputted to the opposite electrode 1423 of the light emitting element 1416 and a potential V1+|Vth|+α (α: an arbitrary positive number) is inputted to the potential supply line 1422. In addition, to the power supply line 1421, V1 is inputted in the address period and a potential V2 is inputted in the light emitting period. Note that V2<V1.

Here, the potential of the opposite electrode 1423 of the light emitting element 1416 is equal to the potential of the power supply line 1421 in the address period for the purpose of explaining operation. However, when the minimum potential difference which is necessary for the light emitting element 1416 to emit light is referred to as $V_{EL}$, it is acceptable as long as the potential of the opposite electrode 1423 is equal to or greater than V1 and less than a potential V1+|Vth|+α+$V_{EL}$. In addition, it is acceptable as long as the potential V2 of the power supply line 1421 in the light emitting period is lower than a value obtained by subtracting the minimum potential difference ($V_{EL}$) which is necessary for the light emitting element 1416 to emit light from the potential of the opposite electrode 1423. However, since the potential of the opposite electrode 1423 is V1 here for the purpose of explanation, it is acceptable as long as V2 is less than V1-$V_{EL}$.

Figure 16A:
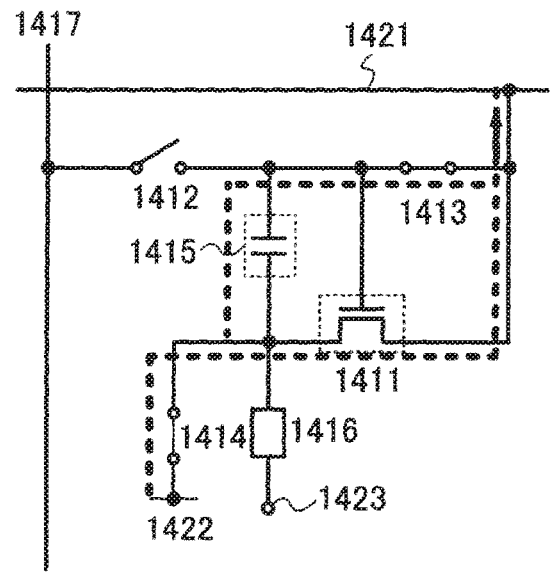
FIGS. 16A to 16D are diagrams illustrating operation of the pixel shown in FIG. 14.

First, the first switch 1412 is turned off and the second switch 1413 and the third switch 1414 are turned on in the initialization period as shown in (A) in FIG. 15 and FIG. 16A. At this time, the first electrode of the transistor 1411 serves as a source electrode, and a potential thereof is equal to that of the potential supply line 1422, that is, V1+|Vth|+a. On the other hand, a potential of the gate electrode of the transistor 1411 is V1. Thus, the absolute value of the gate-source voltage |Vgs| of the transistor 1411 is |Vth|+α, and thus the transistor 1411 is turned on. Then, |Vth|+α is held by the capacitor 1415 provided between the gate electrode and the first electrode of the transistor 1411.

Figure 16B:
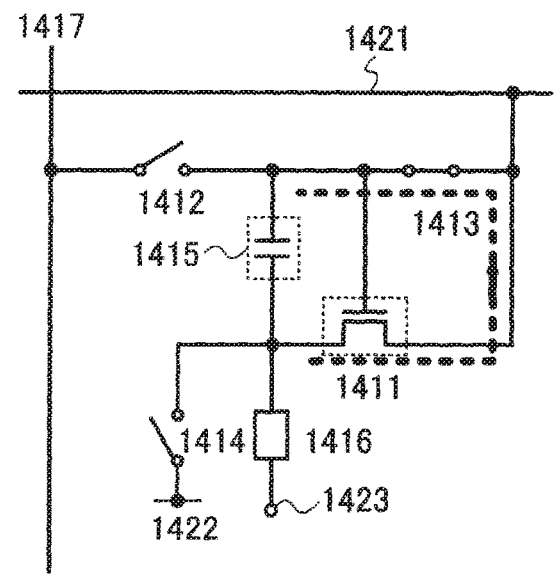

Next, the third switch 1414 is turned off in the threshold write period shown in (B) in FIG. 15 and FIG. 16B. Therefore, the potential of the first electrode, i.e. the source electrode of the transistor 1411 drops gradually and when it reaches V1+|Vth|, the transistor 1411 is turned off. Thus, a voltage held by the capacitor 1415 is |Vth|.

Figure 16C:
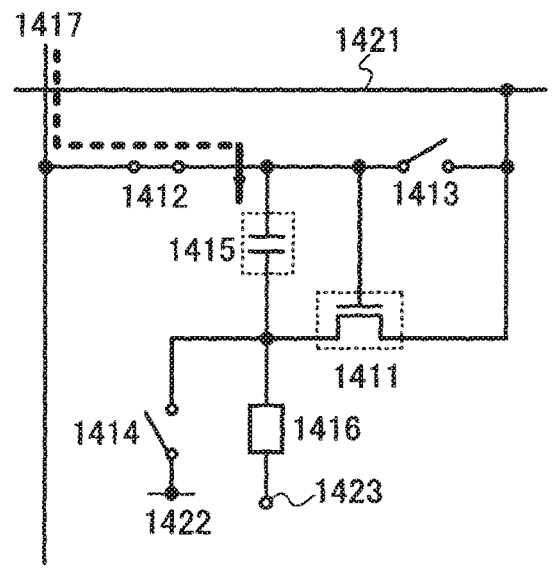

In the subsequent data write period shown in (C) in FIG. 15 and FIG. 16C, the first switch 1412 is turned on and a potential (V1-Vdata) in accordance with luminance data is inputted from the signal line 1417 after turning off the second switch 1413. At this time, the voltage Vcs held by the capacitor 1415 can be represented by Formula (5) where capacitances of the capacitor 1415 and the light emitting element 1416 are referred to as C1 and C2, respectively.

$$Vcs = |-|Vth| - Vdata \times C2/C1 + C2 \tag{5}$$

Note that C2>>C1 because the light emitting element 1416 is thinner and has a larger electrode area than the capacitor 1415. Thus, from C2/(C1+C2)≈1, the voltage Vcs held by the capacitor 1415 is represented by Formula (6), and the transistor 1411 is turned on.

$$Vcs = |-|Vth| - Vdata| \tag{6}$$

Figure 16D:
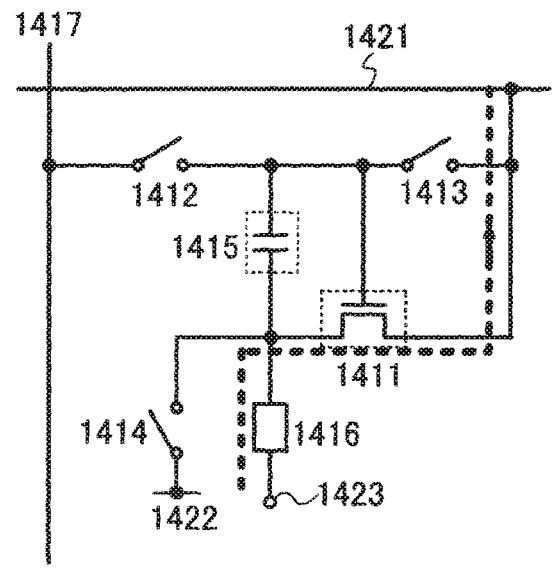

Next, in the light emitting period shown in (D) in FIG. 15 and FIG. 16D, the first switch 1412 is turned off and the potential of the power supply line 1421 is set to V2. At this time, the gate-source voltage Vgs of the transistor 1411 is equal to -Vdata-|Vth|, and current in accordance with this Vgs flows to the transistor 1411 and the light emitting element 1416, so that the light emitting element 1416 emits light.

Note that a current I flowing to the light emitting element is represented by Formula (7) when the transistor 1411 is operated in the saturation region.

$$I = \frac{1}{2}\left(\frac{W}{L}\right)\mu Cox(Vgs - Vth)^2 \tag{7}$$
$$= \frac{1}{2}\left(\frac{W}{L}\right)\mu Cox(-Vdata - |Vth| - Vth)^2$$

Since the transistor 1411 is a p-channel transistor, Vth is less than 0. Thus, Formula (7) can be transformed into Formula (8).

$$I = \frac{1}{2}\left(\frac{W}{L}\right)\mu Cox(-Vdata)^2 \tag{8}$$

In addition, the current I flowing to the light emitting element is represented by Formula (9) when the transistor 1411 is operated in the linear region.

$$I = \left(\frac{W}{L}\right)\mu Cox\left[(Vgs - Vth)Vds - \frac{1}{2}Vds^2\right] \tag{9}$$
$$= \left(\frac{W}{L}\right)\mu Cox\left[(-Vdata - |Vth| - Vth)Vds - \frac{1}{2}Vds^2\right]$$

From Vth<0, Formula (9) can be transformed into Formula (10).

$$I = \left(\frac{W}{L}\right)\mu Cox\left[(-Vdata)Vds - \frac{1}{2}Vds^2\right] \quad (10)$$

Here, W denotes a channel width of the transistor 1411; L, a channel length; μ, a mobility; and Cox, a storage capacitance.

According to Formulas (8) and (10), the current flowing to the light emitting element 1416 does not depend on the threshold voltage (Vth) of the transistor 1411 regardless of whether the operation region of the transistor 1411 is either the saturation region or the linear region. Therefore, variation in current value caused by variation in threshold voltage of the transistor 1411 can be suppressed and a current value in accordance with luminance data can be supplied to the light emitting element 1416.

Accordingly, variation in luminance caused by variation in threshold voltage of the transistor 1411 can be suppressed. In addition, power consumption can be reduced because operation is performed with the opposite electrode fixed at a constant potential.

Furthermore, when the transistor 1411 is operated in the saturation region, variation in luminance due to deterioration of the light emitting element 1416 can also be suppressed. When the light emitting element 1416 is deteriorated, $V_{EL}$ of the light emitting element 1416 increases and the potential of the first electrode, that is, the source electrode of the transistor 1411 decreases. At this time, the source electrode of the transistor 1411 is connected to the second electrode of the capacitor 1415; the gate electrode of the transistor 1411 is connected to the first electrode of the capacitor 1415; and the gate electrode side is in a floating state. Therefore, in accordance with the decrease in the source potential, the gate potential of the transistor 1411 also decreases by the same amount as the decrease in the source potential. Thus, Vgs of the transistor 1411 does not change. Therefore, the current flowing to the transistor 1411 and the light emitting element 1416 is not affected even if the light emitting element is deteriorated. Note that it is found also in Formula (8) that the current I flowing to the light emitting element does not depend on the source potential and a drain potential.

Therefore, when the transistor 1411 is operated in the saturation region, variation in the luminance caused by variation in the threshold voltage of the transistor 1411 and deterioration of the light emitting element 1416 can be suppressed.

Note that in the case of operating the transistor 1411 in the saturation region, a channel length L of the transistor 1411 is preferably long to suppress an increase in current amount by avalanche breakdown and channel length modulation.

In addition, since a reverse bias voltage is applied to the light emitting element 1416 in the initialization period, a shorted portion in the light emitting element can be insulated and deterioration of the light emitting element can be suppressed. Thus, the lifetime of the light emitting element can be extended.

Note that the light emitting element 1416 shown in FIG. 14 is not particularly limited, and an EL element (an organic EL element, an inorganic EL element, or an EL element containing an organic material and an inorganic material), an electron emitting element, a liquid crystal element, electronic ink, or the like can be used.

In addition, it is acceptable as long as the transistor 1411 functions to control a current value supplied to the light emitting element 1416, and the kind of the transistor is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, or a bipolar transistor, a transistor using an organic semiconductor or a carbon nanotube, or another transistor can be used.

The first switch 1412 selects timing to input a signal in accordance with a pixel gray scale level to the capacitor. The second switch 1413 selects timing to apply a predetermined potential to the gate electrode of the transistor 1411. The third switch 1414 selects timing to apply a predetermined potential for initializing a potential written in the capacitor 1415. Therefore, the first switch 1412, the second switch 1413, and the third switch 1414 are not particularly limited as long as they have the above functions. Each of the switches may be a transistor, a diode, or a logic circuit that is a combination thereof.

Note that in the case of using a transistor, a polarity (conductivity type) thereof is not particularly limited. However, it is desirable to use a transistor having a polarity with lower off-current. As an example of the transistor having a polarity with lower off-current, a transistor provided with an LDD region, a transistor having a multi-gate structure, or the like can be given. The switch may be of CMOS type using both an n-channel transistor and a p-channel transistor.

For example, in the case of applying p-channel transistors to the first switch 1412, the second switch 1413, and the third switch 1414, an L-level signal is inputted to a scan line which controls on/off of each switch when the switch is desired to be turned on, or an H-level signal is inputted when the switch is desired to be turned off.

In this case, a manufacturing process can be simplified because the pixel can be formed using only p-channel transistors.

Furthermore, the pixel described in this embodiment mode can be applied to the display device of FIG. 6. Similarly to Embodiment Mode 1, initialization start time can be freely set in respective rows unless data write periods in the respective rows overlap. In addition, since each pixel can emit light except in its address period, a ratio of a light emitting period to one frame period (that is, a duty ratio) can be significantly high and can be approximately 100%. Therefore, a display device with less luminance variation and a high duty ratio can be provided.

In addition, since a threshold write period can be set to be long, a threshold voltage of a transistor which controls a current value flowing to a light emitting element can be written into a capacitor more accurately. Therefore, reliability as a display device is improved.

Note that the potential supply line 1422 can also be used as a wiring of another row similarly to Embodiment Mode 3. In addition, any of the structures of the transistors described in Embodiment Modes 4 and 5 can be applied to the transistor 1411. Moreover, the structure and operation described in Embodiment Mode 6 can also be applied. In addition, the transistor 1411 can be applied to the pixel structures described in Embodiment Modes 1 to 6.

Figure 32:
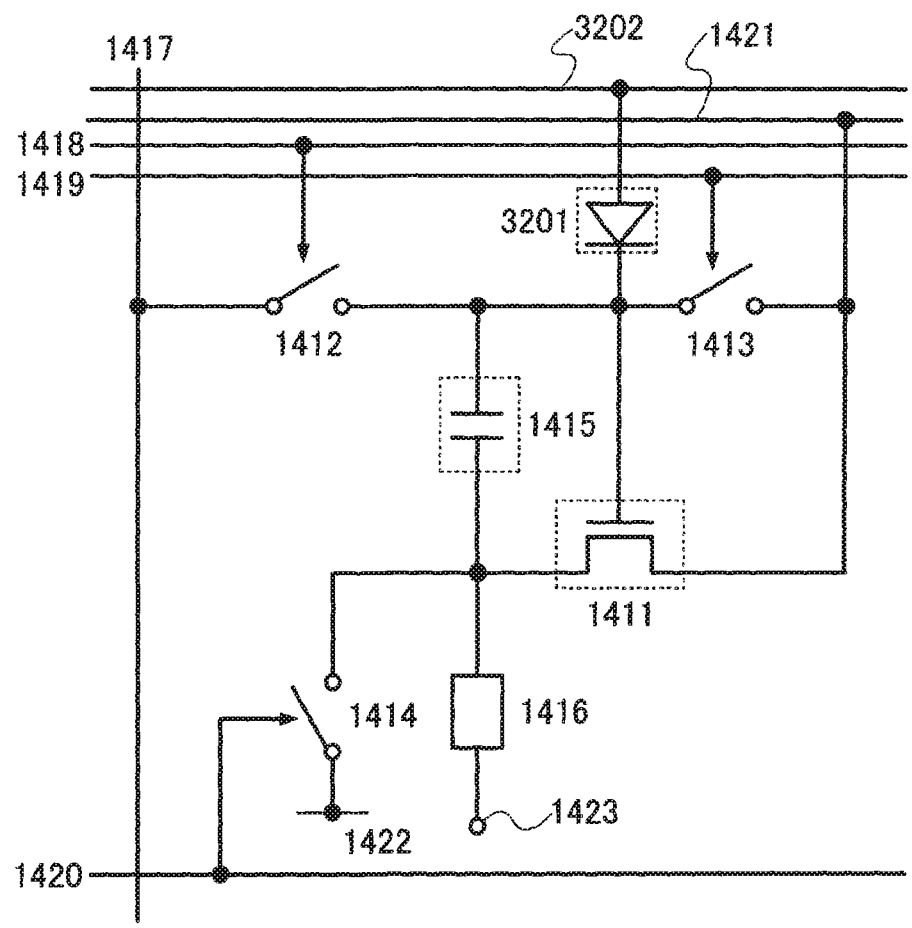
FIG. 32 is a diagram illustrating a pixel structure described in Embodiment Mode 7.

Note that in the case of using a rectifier element to provide an erase period, the direction of current flowing to the rectifier element needs to be varied depending on the polarity of a transistor which controls current flowing to a light emitting element. This is explained with reference to FIG. 32.

When the transistor 1411 is a p-channel transistor, a rectifier element 3201 is connected so that current flows to the gate electrode of the transistor 1411 from a fourth scan line 3202. As to the fourth scan line 3202, an H-level signal is inputted only when forcibly turning off the transistor 1411, and otherwise, an L-level signal is inputted. Then, current does not flow to the rectifier element 3201 when the fourth scan line 3202 is at an L level, and current flows to the fourth scan line 3202 from the transistor 1411 when at an H level. By causing current to flow to the fourth scan line 3202 as described above, a potential held by the capacitor 1415 is lowered to the absolute value of the threshold voltage (Vth) of the transistor 1411 or less, and thus the transistor 1411 is forcibly turned off. Note that an H-level potential needs to be determined so that the potential of the gate electrode of the transistor 1411 does not become equal to or higher than a potential which is lower than the H-level potential by a forward threshold voltage of the rectifier element 3201. According to such operation, black display is inserted; an afterimage becomes less perceptible; and moving image characteristics can be improved.

Embodiment Mode 8

In this embodiment mode, one mode of a fragmentary sectional view of a pixel of the present invention is explained with reference to FIG. 17. Note that a transistor shown in the fragmentary sectional view in this embodiment mode is a transistor functioning to control a current value supplied to a light emitting element.

First, a base film 1712 is formed over a substrate 1711 having an insulating surface. As the substrate 1711 having an insulating surface, an insulating substrate such as a glass substrate, a quartz substrate, a plastic substrate (polyimide, acrylic, polyethylene terephthalate, polycarbonate, polyarylate, polyethersulfone, or the like), or a ceramic substrate; or a metal substrate (tantalum, tungsten, molybdenum, or the like), a semiconductor substrate, or the like on the surface of which an insulating film is formed, can be used. Note that it is necessary to use a substrate which can withstand at least heat generated during a process.

The base film 1712 is formed using a single layer or a plurality of layers (two or more layers) of an insulating film such as a silicon oxide film, a silicon nitride film, or a silicon oxynitride (SiO$_x$N$_y$) film. Note that the base film 1712 may be formed using a sputtering method, a CVD method, or the like. Although the base film 1712 is a single layer in this embodiment mode, it goes without saying that it may be a plurality of layers (two or more layers).

Next, a transistor 1713 is formed over the base film 1712. The transistor 1713 includes at least a semiconductor layer 1714, a gate insulating film 1715 formed over the semiconductor layer 1714, and a gate electrode 1716 formed over the semiconductor layer 1714 with the gate insulating film 1715 interposed therebetween. The semiconductor layer 1714 has a source region and a drain region.

The semiconductor layer 1714 can be formed using a film having a non-crystalline state (i.e. a non-crystalline semiconductor film) selected from an amorphous semiconductor containing silicon, silicon germanium (SiGe), or the like as well as amorphous silicon (a-Si:H) as its main component, a semi-amorphous semiconductor in which an amorphous state and a crystalline state are mixed, a microcrystalline semiconductor in which crystal grains of 0.5 nm to 20 nm can be observed within an amorphous semiconductor, or a crystalline semiconductor film of polysilicon (p-Si:H) or the like. Note that the microcrystalline state in which crystal grains of 0.5 nm to 20 nm can be observed is referred to as microcrystal. Note that when using a non-crystalline semiconductor film, the semiconductor layer 1714 may be formed using a sputtering method, a CVD method, or the like, and when using a crystalline semiconductor film, the semiconductor layer 1714 may be formed by, for example, forming and then crystallizing a non-crystalline semiconductor film. If necessary, a slight amount of an impurity element (such as phosphorus, arsenic, or boron) may be contained in the semiconductor layer 1714 in addition to the above main component in order to control a threshold voltage of a transistor.

Next, a gate insulating film 1715 is formed to cover the semiconductor layer 1714. The gate insulating film 1715 is formed of a single layer or a plurality of stacked films using, for example, silicon oxide, silicon nitride, silicon nitride oxide, or the like. Note that a CVD method, a sputtering method, or the like can be used as a film formation method.

Then, a gate electrode 1716 is formed over the semiconductor layer 1714 with the gate insulating film 1715 interposed therebetween. The gate electrode 1716 may be formed of a single layer or may be formed by stacking a plurality of metal films. Note that the gate electrode can be formed using a metal element selected from among tantalum (Ta), tungsten (W), titanium (Ti), molybdenum (Mo), aluminum (Al), copper (Cu), and chromium (Cr) or an alloy or compound material containing the element as its main component. For example, the gate electrode may include a first conductive film and a second conductive film using tantalum nitride (TaN) as a first conductive layer and tungsten (W) as a second conductive layer.

Next, an impurity which imparts n-type or p-type conductivity is selectively added to the semiconductor layer 1714 using as a mask the gate electrode 1716 or a resist which is formed into a desired shape. In this manner, a channel formation region and an impurity region (including a source region, a drain region, a GOLD region, and an LDD region) are formed in the semiconductor layer 1714. In addition, the transistor 1713 can be formed as either an n-channel transistor or a p-channel transistor depending on the conductivity type of an impurity element to be added.

Figure 17:
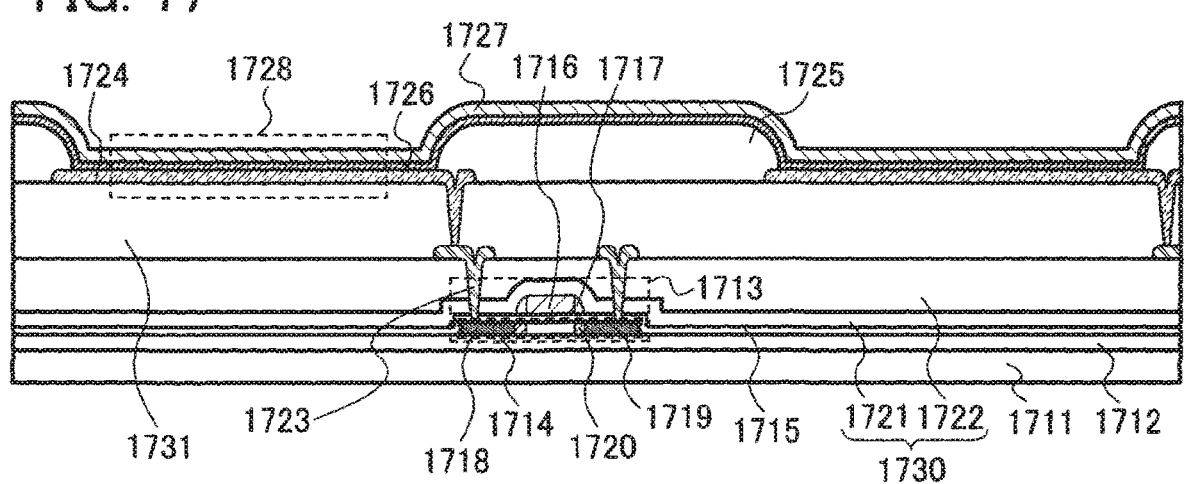
FIG. 17 is a fragmentary sectional view of a pixel described in Embodiment Mode 8.

Note that in order to form an LDD region 1720 in a self-aligned manner in FIG. 17, a silicon compound, for example, a silicon oxide film, a silicon nitride film, or a silicon oxynitride film is formed to cover the gate electrode 1716 and then etched back to form a sidewall 1717. After that, a source region 1718, a drain region 1719, and an LDD region 1720 can be formed by adding an impurity which imparts conductivity to the semiconductor layer 1714. Therefore, the LDD region 1720 is located below the sidewall 1717. Note that the sidewall 1717 is provided to form the LDD region 1720 in a self-aligned manner, and does not necessarily need to be provided. Note that phosphorus, arsenic, boron, or the like is used as the impurity which imparts conductivity.

Next, a first interlayer insulating film 1730 is formed by stacking a first insulating film 1721 and a second insulating film 1722 to cover the gate electrode 1716. As the first insulating film 1721 and the second insulating film 1722, an inorganic insulating film such as a silicon oxide film, a silicon nitride film, or a silicon oxynitride (SiO$_x$N$_y$) film or an organic resin film (a photosensitive or non-photosensitive organic resin film) with a low dielectric constant can be used. Alternatively, a film containing siloxane may be used.

Note that siloxane is a material in which a skeleton is formed by the bond of silicon (Si) and oxygen (O), and an organic group (such as an alkyl group or aromatic hydrocarbon) is used as a substituent. Further, a fluoro group may be contained as a substituent.

Note that insulating films made of the same material may be used as the first insulating film 1721 and the second insulating film 1722. In this embodiment mode, the first interlayer insulating film 1730 has a stacked structure of two layers; however, it may be a single layer or have a stacked structure of three or more layers.

Note that the first insulating film 1721 and the second insulating film 1722 may be formed using a sputtering method, a CVD method, a spin coating method, or the like, and may be formed by a coating method in the case of using an organic resin film or a film containing siloxane.

After that, source and drain electrodes 1723 are formed over the first interlayer insulating film 1730. Note that the source and drain electrodes 1723 are connected to the source region 1718 and the drain region 1719 through contact holes, respectively.

Note that the source and drain electrodes 1723 can be formed using a metal such as silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), or barium (Ba), an alloy thereof, metal nitride thereof, or stacked films thereof.

Next, a second interlayer insulating film 1731 is formed to cover the source and drain electrodes 1723. As the second interlayer insulating film 1731, an inorganic insulating film, a resin film, or a stacked layer thereof can be used. As the inorganic insulating film, a silicon nitride film, a silicon oxide film, a silicon oxynitride film, or a stacked layer thereof can be used. For the resin film, polyimide, polyamide, acrylic, polyimide amide, epoxy, or the like can be used.

A pixel electrode 1724 is formed over the second interlayer insulating film 1731. Next, an insulator 1725 is formed to cover an end portion of the pixel electrode 1724. The insulator 1725 is formed to have a curved surface with curvature at an upper end or a lower end thereof in order to favorably form a layer 1726 containing a light emitting substance later. For example, in the case of using positive photosensitive acrylic as a material of the insulator 1725, the insulator 1725 is preferably formed to have a curved surface with a curvature radius (0.2 μm to 3 μm) only at an upper end. Either a negative resist which becomes insoluble in an etchant by light irradiation or a positive resist which becomes soluble in an etchant by light irradiation can be used as the insulator 1725. Further, an inorganic material such as silicon oxide or silicon oxynitride as well as an organic material can be used as a material of the insulator 1725.

Next, a layer 1726 containing a light emitting substance and an opposite electrode 1727 are formed over the pixel electrode 1724 and the insulator 1725.

Note that a light emitting element 1728 is formed in a region where the layer 1726 containing a light emitting substance is sandwiched between the pixel electrode 1724 and the opposite electrode 1727.

Figure 18A:
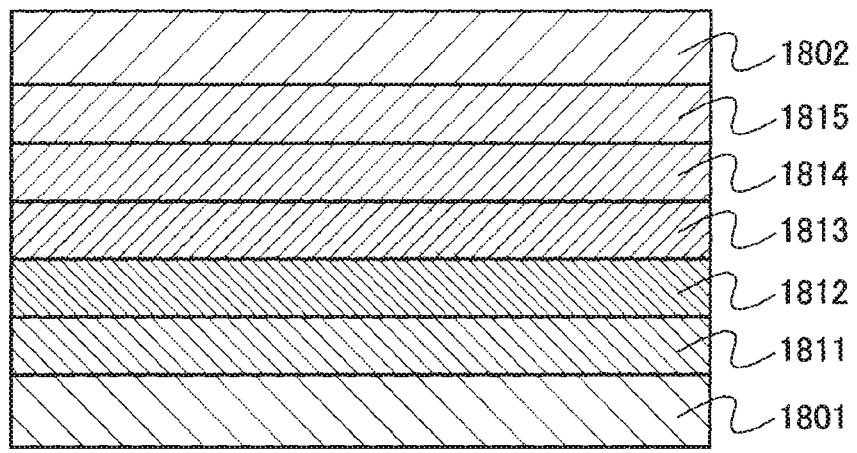
FIGS. 18A and 18B are diagrams illustrating light emitting elements described in Embodiment Mode 8.

Next, the detail of the light emitting element 1728 is explained with reference to FIGS. 18A and 18B. Note that the pixel electrode 1724 and the opposite electrode 1727 in FIG. 17 correspond to a pixel electrode 1801 and an opposite electrode 1802 in FIGS. 18A and 18B, respectively. In FIG. 18A, the pixel electrode is an anode and the opposite electrode is a cathode.

As shown in FIG. 18A, a hole injection layer 1811, a hole transport layer 1812, an electron transport layer 1814, an electron injection layer 1815, and the like as well as a light emitting layer 1813 are provided between the pixel electrode 1801 and the opposite electrode 1802. These layers are stacked so that holes are injected from the pixel electrode 1801 side and electrons are injected from the opposite electrode 1802 side when applying a voltage to set a potential of the pixel electrode 1801 to be higher than a potential of the opposite electrode 1802.

In such a light emitting element, the holes injected from the pixel electrode 1801 and the electrons injected from the opposite electrode 1802 are recombined in the light emitting layer 1813 to excite a light emitting substance. Then, the excited light emitting substance emits light when returning to a ground state. Note that it is acceptable as long as the light emitting substance is a substance which can provide luminescence (electroluminescence).

There is no particular limitation on the substance for forming the light emitting layer 1813, and the light emitting layer may be formed of only a light emitting substance. However, when concentration quenching occurs, the light emitting layer is preferably a layer formed using a substance (host) having a larger energy gap than that of the light emitting substance, in which the light emitting substance is mixed so as to be dispersed. This can prevent concentration quenching of the light emitting substance. Note that the energy gap refers to an energy difference between the lowest unoccupied molecular orbital (LUMO) level and the highest occupied molecular orbital (HOMO) level.

In addition, there is no particular limitation on the light emitting substance, and a substance which can emit light with a desired emission wavelength may be used. For example, in order to obtain red light emission, a substance which exhibits light emission having a peak of an emission spectrum at 600 nm to 680 nm can be used, such as 4-dicyanomethylene-2-isopropyl-6-[2-(1,1,7,7-tetramethyl-julolidine-9-yl)ethenyl]-4H-p yran (abbr.: DCJTI), 4-dicyanomethylene-2-methyl-6-[2-(1,1,7,7-tetramethyljulolidine-9-yl)ethenyl]-4H-pyr an (abbr.: DCJT), 4-dicyanomethylene-2-tert-butyl-6-[2-(1,1,7,7-tetramethyl-julolidine-9-yl)ethenyl]-4H-p yran (abbr.: DCJTB), periflanthene, or 2,5-dicyano-1,4-bis[2-(10-methoxy-1,1,7,7-tetramethyljulolidine-9-yl)ethenyl]benzene. In order to obtain green light emission, a substance which exhibits light emission having a peak of an emission spectrum at 500 nm to 550 nm can be used, such as N,N'-dimethylquinacridon (abbr.: DMQd), coumarin 6, coumarin 545T, tris(8-quinolinolato) aluminum (abbr.: Alq), or N,N-diphenylquinacridon (DPQd). In order to obtain blue light emission, a substance which exhibits light emission having a peak of an emission spectrum at 420 nm to 500 nm can be used, such as 9,10-bis(2-naphthyl)-tert-butylanthracene (abbr.: t-BuDNA), 9,9'-bianthryl, 9,10-diphenylanthracene (abbr.: DPA), 9,10-bis(2-naphthyl)anthracene (abbr.: DNA), bis(2-methyl-8-quinolinolato)-4-phenylphenolato-gallium (abbr.: BGaq), or bis(2-methyl-8-quinolinolato)-4-phenylpheno-lato-aluminum (abbr.: BAlq).

There is no particular limitation on the substance which is used for dispersing the light emitting substance, and for example, an anthracene derivative such as 9,10-di(2-naph-thyl)-2-tert-butylanthracene (abbr.: t-BuDNA), a carbazole derivative such as 4,4'-bis(N-carbazolyl)biphenyl (abbr.: CBP), a metal complex such as bis[2-(2-hydroxyphenyl)

pyridinato]zinc (abbr.: Znpp$_2$) or bis[2-(2-hydroxyphenyl) benzoxazolato]zinc (abbr.: ZnBOX), or the like can be used.

Although an anode material for forming the pixel electrode 1801 is not particularly limited, a metal, an alloy, a conductive compound, a mixture thereof, or the like having a high work function (a work function of 4.0 eV or higher) is preferably used. As a specific example of such an anode material, oxide of a metal material such as indium tin oxide (abbr.: ITO), ITO containing silicon oxide, or indium zinc oxide (abbr.: IZO) formed using a target in which indium oxide is mixed with zinc oxide (ZnO) of 2 wt % to 20 wt % can be given. Further, gold (Au), platinum (Pt), nickel (Ni), tungsten (W), chromium (Cr), molybdenum (Mo), iron (Fe), cobalt (Co), copper (Cu), palladium (Pd), nitride of a metal material (for example, TiN), or the like can be given.

On the other hand, as a substance for forming the opposite electrode 1802, a metal, an alloy, a conductive compound, a mixture thereof, or the like having a low work function (a work function of 3.8 eV or lower) can be used. As a specific example of such a cathode material, an element belonging to Group 1 or 2 of the Periodic Table, that is, an alkali metal such as lithium (Li) or cesium (Cs), an alkaline earth metal such as magnesium (Mg), calcium (Ca), or strontium (Sr), or an alloy containing these (Mg:Ag, Al:Li) can be given. In addition, by providing a layer having an excellent electron injection property between the opposite electrode 1802 and the light emitting layer 1813 so as to be stacked with the opposite electrode, various conductive materials including the materials described as the material of the pixel electrode 1801 such as Al, Ag, ITO, or ITO containing silicon oxide can be used for the opposite electrode 1802 regardless of the magnitude of the work function. Alternatively, a similar effect can be obtained by forming the electron injection layer 1815 to be described later using a material having a particularly excellent electron injecting function.

Note that in order to extract light emission to outside, it is preferable that either or both the pixel electrode 1801 and the opposite electrode 1802 are transparent electrodes made of ITO or the like or are formed with a thickness of several to several tens nm so as to be able to transmit visible light.

The hole transport layer 1812 is provided between the pixel electrode 1801 and the light emitting layer 1813 as shown in FIG. 18A. The hole transport layer is a layer functioning to transport holes injected from the pixel electrode 1801 to the light emitting layer 1813. By providing the hole transport layer 1812 and separating the pixel electrode 1801 and the light emitting layer 1813 from each other, light emission can be prevented from being quenched due to metal.

Note that the hole transport layer 1812 is preferably formed using a substance having an excellent hole transport property, and particularly, a substance having a hole mobility of 1×106 cm$^2$/Vs or more. Note that the substance having an excellent hole transport property refers to a substance having a higher mobility of holes than that of electrons. As a specific example of a substance which can be used for forming the hole transport layer 1812, 4,4'-bis[N-(1-naphthyl)-N-phenylamino]biphenyl (abbr.: NPB), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino] triphenylamine (abbr.: MTDATA), 4,4'-bis{N-[4-(N,N-di-m-tolylamino)phenyl]-N-phenylamino}biphenyl (abbr.: DNTPD), 1,3,5-tris[N,N-di(m-tolyl)amino]benzene (abbr.: m-MTDAB), 4,4',4"-tris(N-carbazolyl)tripheylamine (abbr.: TCTA), phthalocyanine (abbr.: H$_2$Pc), copper phthalocyanine (abbr.: CuPc), vanadylphthalocyanine (abbr.: VOPc), or the like can be given. In addition, the hole transport layer 1812 may be a layer having a multilayer structure which is formed by combining two or more layers formed of the above-described substances.

Further, the electron transport layer 1814 may be provided between the opposite electrode 1802 and the light emitting layer 1813 as shown in FIG. 18A. Here, the electron transport layer is a layer functioning to transport electrons injected from the opposite electrode 1802 to the light emitting layer 1813. By providing the electron transport layer 1814 and separating the opposite electrode 1802 and the light emitting layer 1813 from each other, light emission can be prevented from being quenched due to metal.

There is no particular limitation on the material of the electron transport layer 1814, and the electron transport layer 1814 can be formed of a metal complex having a quinoline skeleton or a benzoquinoline skeleton such as tris(8-quinolinolato)aluminum (abbr.: Alq), tris(5-methyl-8-quinolinolato)aluminum (abbr.: Almq$_3$), bis(10-hydroxybenzo[h]-quinolinato)beryllium (abbr.: BeBq$_2$), or bis(2-methyl-8-quinolinolato)-4-phenylphenolato-aluminum (abbr.: BAlq), or the like. Alternatively, it may be formed of a metal complex having an oxazole-based or thiazole-based ligand such as bis[2-(2-hydroxyphenyl)benzoxazolato]zinc (abbr.: Zn(BOX)$_2$) or bis[2-(2-hydroxyphenyl)-benzothiazolato]zinc (abbr.: Zn(BTZ)$_2$), or the like. Further, it may be formed using 2-(4-biphenylyl)-5-(4-tert-butylphenyl)-1, 3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like. The electron transport layer 1814 is preferably formed using a substance having a higher mobility of electrons than that of holes as described above. In addition, the electron transport layer 1814 is preferably formed using a substance having an electron mobility of 10$^{-6}$ cm$^2$Vs or more. Note that the electron transport layer 1814 may be a layer having a multilayer structure which is formed by combining two or more layers formed of the above-described substances.

Moreover, the hole injection layer 1811 may be provided between the pixel electrode 1801 and the hole transport layer 1812 as shown in FIG. 18A. Here, the hole injection layer refers to a layer functioning to promote hole injection from an electrode functioning as an anode to the hole transport layer 1812.

There is no particular limitation on the material of the hole injection layer 1811, and the hole injection layer 1811 can be formed of metal oxide such as molybdenum oxide (MoOx), vanadium oxide (VOx), ruthenium oxide (RuOx), tungsten oxide (WOx), or manganese oxide (MnO$_x$). Alternatively, the hole injection layer 1811 can be formed of a phthalocyanine-based compound such as phthalocyanine (abbr.: H$_2$Pc) or copper phthalocyanine (CuPc), an aromatic amine-based compound such as 4,4-bis{N-[4-(N,N-di-m-tolylamino)phenyl]-N-phenylamino}biphenyl(abbr.:DNTPD), a high molecular compound such as a poly(ethylene dioxythiophene)/poly(styrenesulfonic acid) aqueous solution (PEDOT/PSS), or the like.

In addition, a mixture of the metal oxide and a substance having an excellent hole transport property may be provided between the pixel electrode 1801 and the hole transport layer 1812. Since such a layer does not cause an increase in drive voltage even when thickened, optical design using a microcavity effect or a light interference effect can be performed by adjusting the thickness of the layer. Therefore, a high-quality light emitting element with excellent color purity and few color changes depending on a viewing angle can be manufactured. In addition, a film thickness can be set so as to prevent short circuit of the pixel electrode 1801 and the opposite electrode 1802 due to the influence of unevenness generated at the time of film formation on the surface of the pixel electrode 1801 and minute residue remaining on the surface of the electrode.

In addition, the electron injection layer 1815 may be provided between the opposite electrode 1802 and the electron transport layer 1814 as shown in FIG. 18A. Here, the electron injection layer is a layer functioning to promote electron injection from an electrode functioning as a cathode to the electron transport layer 1814. Note that when the electron transport layer is not particularly provided, electron injection to the light emitting layer may be supported by providing the electron injection layer between the electrode functioning as a cathode and the light emitting layer.

There is no particular limitation on the material of the electron injection layer 1815, and the electron injection layer 1815 can be formed using a compound of alkali metal or alkaline earth metal, such as lithium fluoride (LiF), cesium fluoride (CsF), or calcium fluoride (CaF$_2$). Alternatively, a mixture of a substance having an excellent electron transport property such as Alq or 4,4-bis(5-methylbenzoxazol-2-yl)stilbene (BzOs) and alkali metal or alkaline earth metal such as magnesium or lithium can be used for the electron injection layer 1815.

Note that each of the hole injection layer 1811, the hole transport layer 1812, the light emitting layer 1813, the electron transport layer 1814, and the electron injection layer 1815 may be formed by any method such as an evaporation method, an ink-jet method, or a coating method. In addition, the pixel electrode 1801 or the opposite electrode 1802 may also be formed using any method such as a sputtering method or an evaporation method.

Figure 18B:
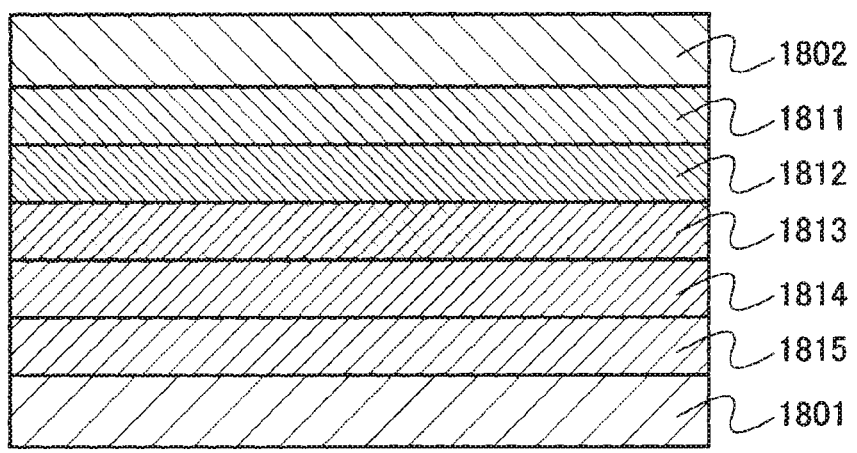

In addition, a layer structure of a light emitting element is not limited to that shown in FIG. 18A, and may be manufactured by forming layers sequentially from an electrode serving as a cathode as shown in FIG. 18B. In other words, the pixel electrode 1801 may be a cathode, and the electron injection layer 1815, the electron transport layer 1814, the light emitting layer 1813, the hole transport layer 1812, the hole injection layer 1811, and the opposite electrode 1802 may be stacked in this order over the pixel electrode 1801. Note that the opposite electrode 1802 functions as an anode.

Note that the light emitting element is described to have a single light emitting layer; however, the light emitting element may include a plurality of light emitting layers. White light can be obtained by providing a plurality of light emitting layers and mixing light emissions from the respective light emitting layers. For example, in the case of a light emitting element including two light emitting layers, a spacing layer, and a layer which generates holes and a layer which generates electrons are preferably provided between a first light emitting layer and a second light emitting layer. This structure enables the light emitted from the respective light emitting layers to outside to be visually mixed and perceived as white light. Thus, white light can be obtained.

Light emission is extracted to outside through either or both the pixel electrode 1724 and the opposite electrode 1727 in FIG. 17. Accordingly, either or both the pixel electrode 1724 and the opposite electrode 1727 are formed of a light-transmitting substance.

Figure 19A:
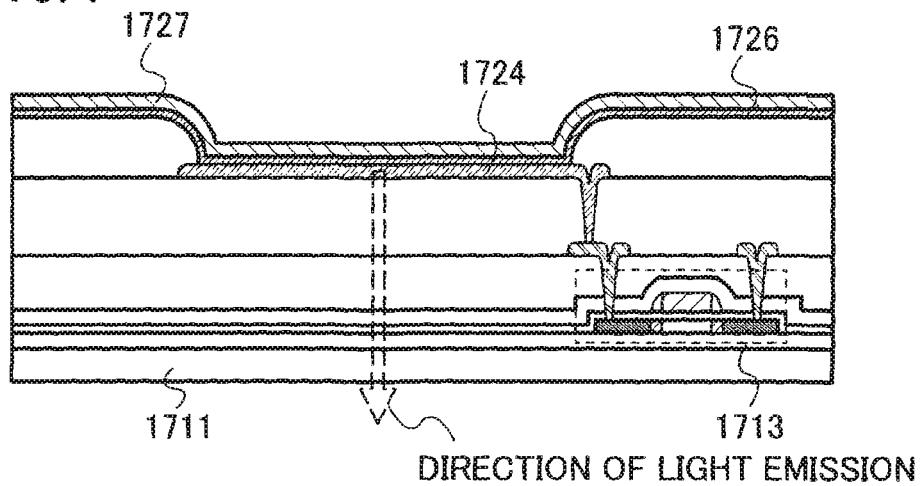
FIGS. 19A to 19C are diagrams illustrating extraction directions of light described in Embodiment Mode 8.
Figure 19B:
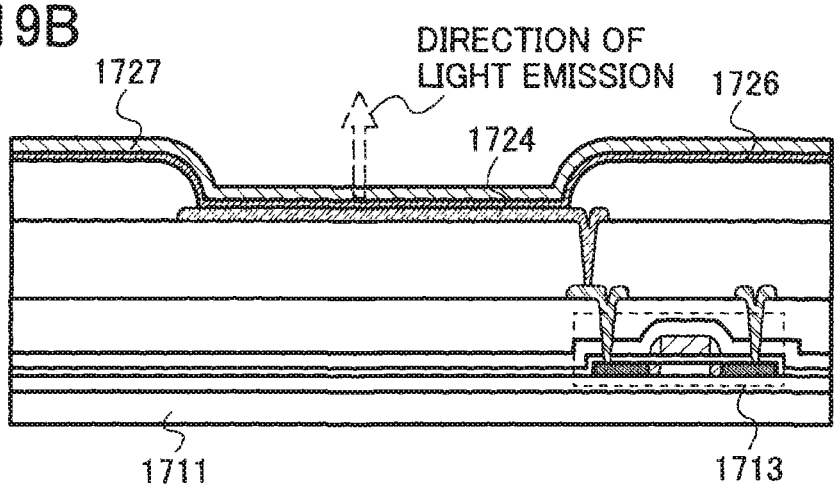
Figure 19C:
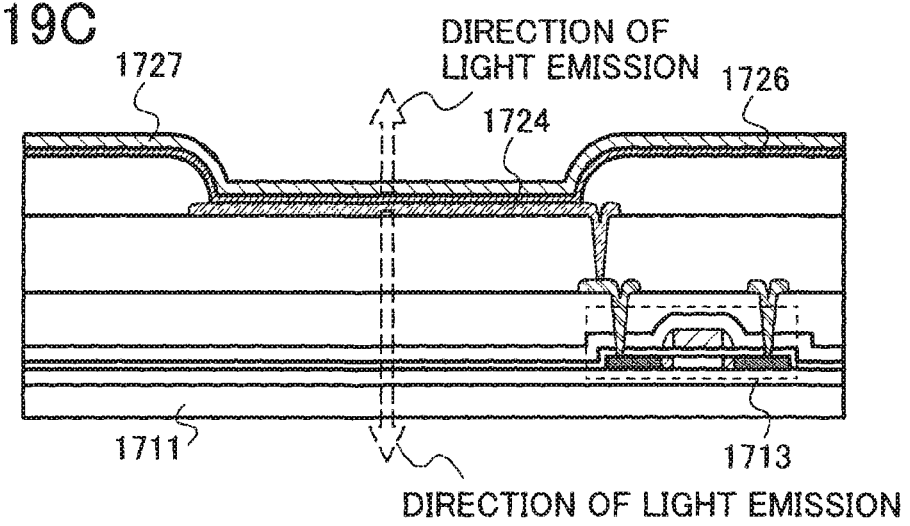

When only the opposite electrode 1727 is formed of a light-transmitting substance, light emission is extracted from a side opposite to the substrate through the opposite electrode 1727 as shown in FIG. 19A. When only the pixel electrode 1724 is formed of a light-transmitting substance, light emission is extracted from the substrate side through the pixel electrode 1724 as shown in FIG. 19B. When both the pixel electrode 1724 and the opposite electrode 1727 are formed of a light-transmitting substance, light emission is extracted from both the substrate side and the opposite side through the pixel electrode 1724 and the opposite electrode 1727 as shown in FIG. 19C.

Next, a transistor having a staggered structure using a non-crystalline semiconductor film for the semiconductor layer of the transistor 1713 is explained. Fragmentary sectional views of pixels are shown in FIGS. 20A and 20B. Note that in each of FIGS. 20A and 20B, a transistor having a staggered structure is shown and a capacitor included in a pixel is also explained.

As shown in FIG. 20A, a base film 2012 is formed over a substrate 2011. Further, a pixel electrode 2013 is formed over the base film 2012. In addition, a first electrode 2014 is formed of the same material and in the same layer as the pixel electrode 2013.

Further, a wiring 2015 and a wiring 2016 are formed over the base film 2012, and an end of the pixel electrode 2013 is covered with the wiring 2015. An n-type semiconductor layer 2017 and an n-type semiconductor layer 2018 each having n-type conductivity are formed over the wiring 2015 and the wiring 2016. In addition, a semiconductor layer 2019 is formed over the base film 2012 and between the wiring 2015 and the wiring 2016. Apart of the semiconductor layer 2019 is extended so as to overlap with the n-type semiconductor layer 2017 and the n-type semiconductor layer 2018. Note that this semiconductor layer is formed of a non-crystalline semiconductor film made of an amorphous semiconductor such as amorphous silicon (a-Si:H), a semi-amorphous semiconductor, a microcrystalline semiconductor, or the like. In addition, a gate insulating film 2020 is formed over the semiconductor layer 2019. An insulating film 2021 made of the same material and in the same layer as the gate insulating film 2020 is also formed over the first electrode 2014.

Furthermore, a gate electrode 2022 is formed over the gate insulating film 2020; thus, a transistor 2025 is formed. In addition, a second electrode 2023 made of the same material and in the same layer as the gate electrode 2022 is formed over the first electrode 2014 with the insulating film 2021 interposed therebetween, and a capacitor 2024 is formed in which the insulating film 2021 is sandwiched between the first electrode 2014 and the second electrode 2023. An interlayer insulating film 2026 is formed to cover the end of the pixel electrode 2013, the transistor 2025, and the capacitor 2024.

A layer 2027 containing a light emitting substance and an opposite electrode 2028 are formed over the interlayer insulating film 2026 and the pixel electrode 2013 located in an opening of the interlayer insulating film 2026, and a light emitting element 2029 is formed in a region where the layer 2027 containing a light emitting substance is sandwiched between the pixel electrode 2013 and the opposite electrode 2028.

The first electrode 2014 shown in FIG. 20A may be formed of the same material and in the same layer as the wirings 2015 and 2016 as shown in FIG. 20B, and a capacitor 2031 may be formed in which the insulating film 2021 is sandwiched between the first electrode 2030 and the second electrode 2023. Although an n-channel transistor is used as the transistor 2025 in FIGS. 20A and 20B, a p-channel transistor may be used.

Materials of the substrate 2011, the base film 2012, the pixel electrode 2013, the gate insulating film 2020, the gate electrode 2022, the interlayer insulating film 2026, the layer 2027 containing a light emitting substance, and the opposite electrode 2028 may be similar to those of the substrate 1711, the base film 1712, the pixel electrode 1724, the gate insulating film 1715, the gate electrode 1716, the interlayer insulating films 1730 and 1731, the layer 1726 containing a light emitting substance, and the opposite electrode 1727 shown in FIG. 17. The wiring 2015 and the wiring 2016 may be formed using similar materials to those of the source and drain electrodes 1723 in FIG. 17.

Next, fragmentary sectional views of pixels each having a transistor with a structure in which a gate electrode is sandwiched between a substrate and a semiconductor layer, in other words, a bottom-gate transistor in which a gate electrode is located below a semiconductor layer are shown in FIGS. 21A and 21B as other structures of a transistor using a non-crystalline semiconductor film for a semiconductor layer.

A base film 2112 is formed over a substrate 2111. A gate electrode 2113 is formed over the base film 2112. In addition, a first electrode 2114 is formed of the same material and in the same layer as the gate electrode 2113. A material of the gate electrode 2113 may be polycrystalline silicon to which phosphorus is added or silicide that is a compound of metal and silicon as well as the material used for the gate electrode 1716 shown in FIG. 17.

A gate insulating film 2115 is formed to cover the gate electrode 2113 and the first electrode 2114.

A semiconductor layer 2116 is formed over the gate insulating film 2115. A semiconductor layer 2117 made of the same material and in the same layer as the semiconductor layer 2116 is formed over the first electrode 2114. Note that this semiconductor layer is formed of a non-crystalline semiconductor film made of an amorphous semiconductor such as amorphous silicon (a-Si:H), a semi-amorphous semiconductor, a microcrystalline semiconductor, or the like.

An n-type semiconductor layer 2118 and an n-type semiconductor layer 2119 each having n-type conductivity are formed over the semiconductor layer 2116, and an n-type semiconductor layer 2120 is formed over the semiconductor layer 2117.

A wiring 2121 and a wiring 2122 are formed over the n-type semiconductor layer 2118 and the n-type semiconductor layer 2119, respectively, and a transistor 2129 is formed. A conductive layer 2123 made of the same material and in the same layer as the wiring 2121 and the wiring 2122 is formed over the n-type semiconductor layer 2120, and this conductive layer 2123, the n-type semiconductor layer 2120, and the semiconductor layer 2117 form a second electrode. Note that a capacitor 2130 is formed in which the gate insulating film 2115 is sandwiched between this second electrode and the first electrode 2114.

One end of the wiring 2121 is extended, and a pixel electrode 2124 is formed on the extended portion of the wiring 2121.

An insulator 2125 is formed to cover an end of the pixel electrode 2124, the transistor 2129, and the capacitor 2130.

A layer 2126 containing a light emitting substance and an opposite electrode 2127 are formed over the pixel electrode 2124 and the insulator 2125, and a light emitting element 2128 is formed in a region where the layer 2126 containing a light emitting substance is sandwiched between the pixel electrode 2124 and the opposite electrode 2127.

The semiconductor layer 2117 and the n-type semiconductor layer 2120 which serve as a part of the second electrode of the capacitor 2130 do not particularly need to be provided. In other words, a capacitor may be formed in which the conductive layer 2123 is used as the second electrode and the gate insulating film 2115 is sandwiched between the first electrode 2114 and the conductive layer 2123.

Although an n-channel transistor is used as the transistor 2129, a p-channel transistor may be used.

Note that a capacitor 2132 having a structure in which the gate insulating film 2115 is sandwiched between the first electrode 2114 and a second electrode 2131 made of the same material and in the same layer as the pixel electrode 2124 as shown in FIG. 21B can also be formed by forming the pixel electrode 2124 before forming the wiring 2121 in FIG. 21A.

Although an inverted staggered transistor with a channel etch structure is described, it goes without saying that a transistor with a channel protective structure may be used. Next, the case of a transistor with a channel protective structure is explained with reference to FIGS. 22A and 22B. Note that a common reference numeral is used in FIGS. 22A and 22B to denote a similar component to that in FIGS. 21A and 21B.

Figure 22A:
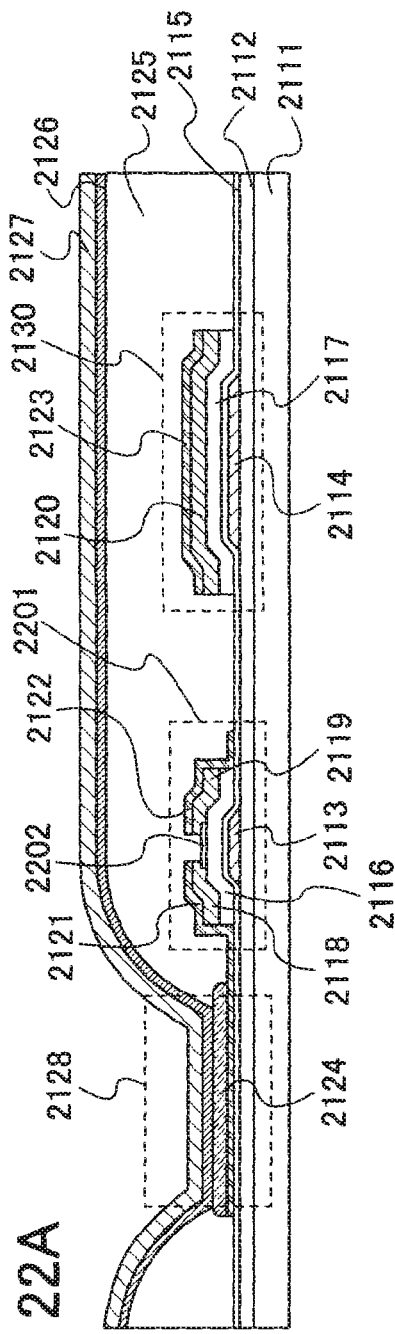
FIGS. 22A and 22B are fragmentary sectional views of pixels described in Embodiment Mode 8.

A transistor 2201 with a channel protective structure shown in FIG. 22A is different from the transistor 2129 with a channel etch structure shown in FIG. 21A in that an insulator 2202 serving as an etching mask is provided over a region of the semiconductor layer 2116 in which a channel is formed.

Figure 22B:
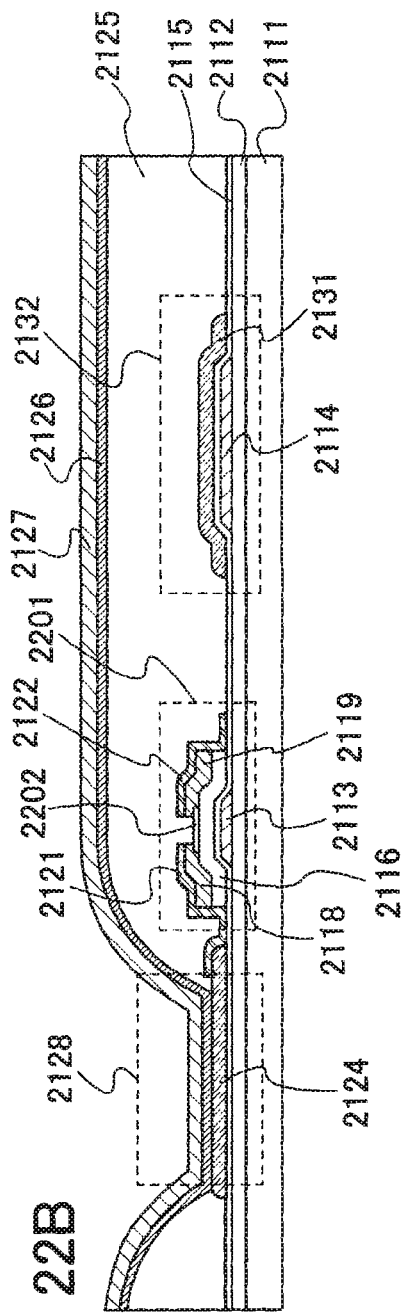

Similarly, a transistor 2201 with a channel protective structure shown in FIG. 22B is different from the transistor 2129 with a channel etch structure shown in FIG. 21B in that an insulator 2202 serving as an etching mask is provided over a region of the semiconductor layer 2116 in which a channel is formed.

Manufacturing cost can be reduced by using a non-cyrstalline semiconductor film for a semiconductor layer of a transistor included in the pixel of the present invention. Note that the materials explained with reference to FIG. 17 can be used as respective materials.

Structures of a transistor and a capacitor are not limited to those described above, and transistors and capacitors having various structures can be used.

A crystalline semiconductor film made of polysilicon (p-Si:H) or the like as well as a non-crystalline semiconductor film made of an amorphous semiconductor such as amorphous silicon (a-Si:H), a semi-amorphous semiconductor, a microcrystalline semiconductor, or the like may be used for a semiconductor layer of a transistor.

Figure 23:
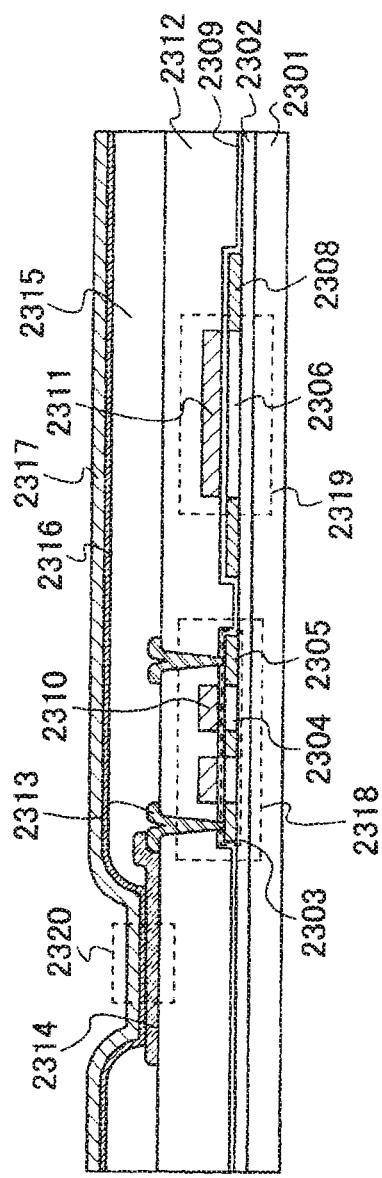
FIG. 23 is a fragmentary sectional view of a pixel described in Embodiment 5 Mode 8.

FIG. 23 shows a fragmentary sectional view of a pixel including a transistor using a crystalline semiconductor film for a semiconductor layer, which is explained below. Note that a transistor 2318 shown in FIG. 23 is the multi-gate transistor shown in FIG. 10.

As shown in FIG. 23, a base film 2302 is formed over a substrate 2301, and a semiconductor layer 2303 is formed thereover. Note that the semiconductor layer 2303 is formed by patterning a crystalline semiconductor film into a desired shape.

An example of a method for manufacturing the crystalline semiconductor film is described below. First, an amorphous silicon film is formed over the substrate 2301 by a sputtering method, a CVD method, or the like. A film formation material does not need to be limited to an amorphous silicon film, and a non-crystalline semiconductor film made of an amorphous semiconductor, a semi-amorphous semiconductor, a microcrystalline semiconductor, or the like is acceptable. In addition, a compound semiconductor film having an amorphous structure such as an amorphous silicon germanium film may be used.

Then, the amorphous silicon film obtained is crystallized using a thermal crystallization method, a laser crystallization method, a thermal crystallization method using a catalytic element such as nickel, or the like, thereby obtaining a crystalline semiconductor film. Note that crystallization may be performed by a combination of these crystallization methods.

In the case of forming a crystalline semiconductor film by a thermal crystallization method, a heating furnace, laser irradiation, RTA (Rapid Thermal Annealing), or a combination thereof can be used.

When the crystalline semiconductor film is formed by a laser crystallization method, a continuous wave laser beam (CW laser beam) or a pulsed laser beam can be used. As a laser beam that can be used here, a laser beam emitted from one or more kinds of a gas laser such as an Ar laser, a Kr laser, or an excimer laser; a laser using, as a medium, single-crystal YAG, YVO$_4$, forsterite (Mg$_2$SiO$_4$), YAlO$_3$, or GdVO$_4$, or polycrystalline (ceramic) YAQ Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. A crystal having a large grain diameter can be obtained by irradiation with the fundamental wave of the above laser beam or a second harmonic to a fourth harmonic of the laser beam. For example, the second harmonic (532 nm) or the third harmonic (355 nm) of a Nd:YVO$_4$ laser (the fundamental wave: 1064 nm) can be used. At this time, an energy density of the laser is required to be about 0.01 MW/cm$^2$ to 100 MW/cm$^2$ (preferably, 0.1 MW/cm$^2$ to 10 MW/cm$^2$). A scanning rate is set to about 10 cm/sec to 2000 cm/sec for irradiation.

Note that a laser using, as a medium, single-crystal YAQ, YVO$_4$, forsterite (Mg$_2$SiO$_4$), YAlO$_3$, or GdVO$_4$, or polycrystalline (ceramic) YAQ, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti: sapphire laser can be a CW laser. Alternatively, it can be pulsed at a repetition rate of 10 MHz or more by performing Q-switch operation, mode locking, or the like. When a laser beam is pulsed at a repetition rate of 10 MHz or more, the semiconductor film is irradiated with the following pulsed laser after being melted by a preceding laser and before being solidified. Therefore, unlike the case of using a pulsed laser having a low repetition rate, the interface between the solid phase and the liquid phase can be moved continuously in the semiconductor film, so that crystal grains grown continuously in the scanning direction can be obtained.

In the case of forming a crystalline semiconductor film by a thermal crystallization method using a catalytic element such as nickel, it is preferable to perform gettering treatment for removing the catalytic element such as nickel after crystallization.

By the above-described crystallization, a crystallized region is formed in a part of the amorphous semiconductor film. This partly crystallized crystalline semiconductor film is patterned into a desired shape, thereby forming an island-shaped semiconductor film. This semiconductor film is used for the semiconductor layer 2303 of the transistor.

The crystalline semiconductor layer is used for a channel formation region 2304 and an impurity region 2305 serving as a source region or a drain region of the transistor 2318 and also for a semiconductor layer 2306 and an impurity region 2308 serving as a lower electrode of a capacitor 2319. Note that the impurity region 2308 does not particularly need to be provided. Channel doping may be performed to the channel formation region 2304 and the semiconductor layer 2306.

Next, a gate insulating film 2309 is formed over the semiconductor layer 2303 and the lower electrode of the capacitor 2319. Further, agate electrode 2310 is formed over the semiconductor layer 2303 with the gate insulating film 2309 interposed therebetween, and an upper electrode 2311 made of the same material and in the same layer as the gate electrode 2310 is formed over the semiconductor layer 2306 of the capacitor 2319 with the gate insulating film 2309 interposed therebetween. In this manner, the transistor 2318 and the capacitor 2319 are manufactured.

Next, an interlayer insulating film 2312 is formed to cover the transistor 2318 and the capacitor 2319, and a wiring 2313 is formed over the interlayer insulating film 2312 so as to be in contact with the impurity region 2305 through a contact hole. Then, a pixel electrode 2314 is formed in contact with the wiring 2313 and over the interlayer insulating film 2312, and an insulator 2315 is formed to cover an end of the pixel electrode 2314 and the wiring 2313. Further, a layer 2316 containing a light emitting substance and an opposite electrode 2317 are formed over the pixel electrode 2314, and a light emitting element 2320 is formed in a region where the layer 2316 containing a light emitting substance is sandwiched between the pixel electrode 2314 and the opposite electrode 2317.

Figure 24:
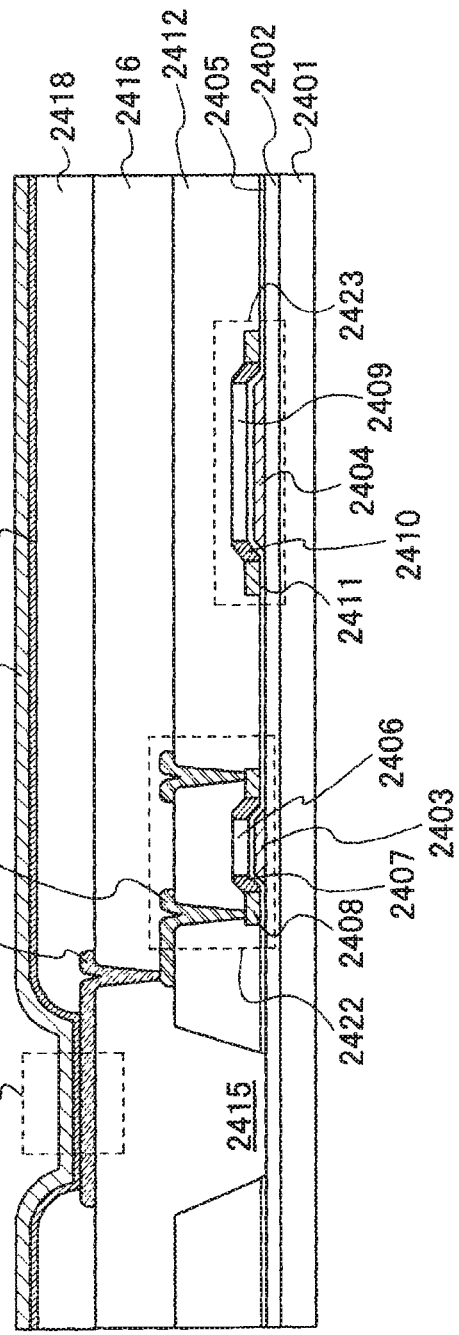
FIG. 24 is a fragmentary sectional view of a pixel described in Embodiment Mode 8.

A fragmentary cross section of a pixel including a bottom-gate transistor using a crystalline semiconductor film made of polysilicon (p-Si:H) or the like for a semiconductor layer is shown in FIG. 24.

A base film 2402 is formed over a substrate 2401, and a gate electrode 2403 is formed thereover. In addition, a first electrode 2404 of a capacitor 2423 is formed of the same material and in the same layer as the gate electrode 2403.

A gate insulating film 2405 is formed to cover the gate electrode 2403 and the first electrode 2404.

A semiconductor layer is formed over the gate insulating film 2405. Note that the semiconductor layer is formed by crystallizing a non-crystalline semiconductor film made of an amorphous semiconductor, a semi-amorphous semiconductor, a microcrystalline semiconductor, or the like using a thermal crystallization method, a laser crystallization method, a thermal crystallization method using a catalytic element such as nickel, or the like and patterning the crystallized semiconductor film into a desired shape.

Note that a channel formation region 2406, an LDD region 2407, and an impurity region 2408 serving as a source region or a drain region of a transistor 2422, and a region 2409 serving as a second electrode, and impurity regions 2410 and 2411 of the capacitor 2423 are formed using the semiconductor layer. Note that the impurity regions 2410 and 2411 are not necessarily required to be provided. In addition, an impurity may be added to the channel formation region 2406 and the region 2409.

Note that the capacitor 2423 has a structure in which the gate insulating film 2405 is sandwiched between the first electrode 2404 and the second electrode including the region 2409 formed of the semiconductor layer and the like.

Next, a first interlayer insulating film 2412 is formed to cover the semiconductor layer, and a wiring 2413 is formed over the first interlayer insulating film 2412 so as to be in contact with the impurity region 2408 through a contact hole.

An opening 2415 is formed in the first interlayer insulating film 2412. A second interlayer insulating film 2416 is formed to cover the transistor 2422, the capacitor 2423, and the opening 2415, and a pixel electrode 2417 is formed over the second interlayer insulating film 2416 so as to be connected to the wiring 2413 through a contact hole. In addition, an insulator 2418 is formed to cover an end of the pixel electrode 2417. Then, a layer 2419 containing a light emitting substance and an opposite electrode 2420 are formed over the pixel electrode 2417, and a light emitting element 2421 is formed in a region where the layer 2419 containing a light emitting substance is sandwiched between the pixel electrode 2417 and the opposite electrode 2420. Note that the opening 2415 is located below the light emitting element 2421. In other words, since the first interlayer insulating film 2412 has the opening 2415, transmittance can be increased when light emission from the light emitting element 2421 is extracted from the substrate side.

By using a crystalline semiconductor film for a semiconductor layer of a transistor included in the pixel of the present invention, it becomes easier to form the scan line driver circuit 612 and the signal line driver circuit 611 in FIG. 6 over the same substrate as the pixel portion 613, for example.

Note that a structure of a transistor using a crystalline semiconductor film for a semiconductor layer is not limited to that described above, and the transistor can have various structures. Note that the same applies to a capacitor. In this embodiment mode, the materials in FIG. 17 can be appropriately used unless stated otherwise.

The transistor described in this embodiment mode can be used as the transistor which controls a current value supplied to the light emitting element in the pixel described in any of Embodiment Modes 1 to 7. Therefore, variation in current value caused by variation in threshold voltage of the transistor can be suppressed by operating the pixel as described in any of Embodiment Modes 1 to 7. Accordingly, current in accordance with luminance data can be supplied to a light emitting element, and variation in luminance can be suppressed. In addition, power consumption can be reduced because operation is performed with an opposite electrode fixed at a constant potential.

In addition, since each pixel can emit light except in its address period by applying such a pixel to the display device of FIG. 6, a ratio of a light emitting period to one frame period (that is, a duty ratio) can be significantly high and can be approximately 100%. Therefore, a display device with less luminance variation and a high duty ratio can be provided.

In addition, since a threshold write period can be set to be long, a threshold voltage of a transistor which controls a current value flowing to a light emitting element can be written into a capacitor more accurately. Therefore, reliability as a display device is improved.

Embodiment Mode 9

In this embodiment mode, one mode of a display device of the present invention is explained with reference to FIGS. 25A and 25B.

FIG. 25A is a top view showing a display device, and FIG. 25B is an A-A' line cross sectional view (cross sectional view taken along a line A-A') of FIG. 25A. The display device includes a signal line driver circuit 2501, a pixel portion 2502, a first scan line driver circuit 2503, and a second scan line driver circuit 2506 over a substrate 2510 which are indicated by dotted lines in the drawing. The display device also includes a sealing substrate 2504 and a sealant 2505, and a portion of the display device surrounded by them is a space 2507.

Note that a wiring 2508 is a wiring for transmitting signals to be inputted to the first scan line driver circuit 2503, the second scan line driver circuit 2506, and the signal line driver circuit 2501 and receives a video signal, a clock signal, a start signal, and the like through an FPC (Flexible Printed Circuit) 2509 that serves as an external input terminal. IC chips (semiconductor chips provided with a memory circuit, a buffer circuit, and the like) 2518 and 2519 are mounted by COG (Chip On Glass) or the like on a connection portion of the FPC 2509 and the display device. Note that only the FPC is shown here, but a printed wiring board (PWB) may be attached to the FPC. The display device of the present invention includes not only a main body of a display device but also a display device with an FPC or a PWB attached thereto. In addition, it also includes a display device on which an IC chip or the like is mounted.

A cross-sectional structure is explained with reference to FIG. 25B. The pixel portion 2502 and its peripheral driver circuits (the first scan line driver circuit 2503, the second scan line driver circuit 2506, and the signal line driver circuit 2501) are formed over the substrate 2510; here, the signal line driver circuit 2501 and the pixel portion 2502 are shown.

Note that the signal line driver circuit 2501 includes transistors with single polarity such as n-channel transistors 2520 and 2521. It goes without saying that a p-channel transistor may be used or a CMOS circuit may be formed using not only an n-channel transistor but also a p-channel transistor. In this embodiment mode, the display panel in which the peripheral driver circuits are formed over the same substrate as the pixel portion is described; however, the present invention is not limited to this. All or part of the peripheral driver circuits may be formed on an IC chip or the like and mounted by COG or the like.

The pixel described in any of Embodiment Modes 1 to 7 is used for the pixel portion 2502. Note that FIG. 25B shows a transistor 2511 which functions as a switch, a transistor 2512 which controls a current value supplied to a light emitting element, and a light emitting element 2528. Note that a first electrode of the transistor 2512 is connected to a pixel electrode 2513 of the light emitting element 2528. In addition, an insulator 2514 is formed to cover an end of the pixel electrode 2513. Here, the insulator 2514 is formed using a positive photosensitive acrylic resin film.

The insulator 2514 is formed to have a curved surface with a curvature at an upper end portion or a lower end portion thereof in order to obtain favorable coverage. For example, in the case of using positive photosensitive acrylic as a material of the insulator 2514, the insulator 2514 is preferably formed to have a curved surface with a curvature radius (0.2 µm to 3 µm) only at the upper end portion. Either a negative resist which becomes insoluble in an etchant by light irradiation or a positive resist which becomes soluble in an etchant by light irradiation can be used as the insulator 2514.

A layer 2516 containing a light emitting substance and an opposite electrode 2517 are formed over the pixel electrode 2513. As long as the layer 2516 containing a light emitting substance is provided with at least a light emitting layer, there is no particular limitation on layers other than the light emitting layer, which can be appropriately selected.

By attaching the sealing substrate 2504 to the substrate 2510 using the sealant 2505, a structure is obtained in which the light emitting element 2528 is provided in the space 2507 surrounded by the substrate 2510, the sealing substrate 2504, and the sealant 2505. Note that there is also a case where the space 2507 is filled with the sealant 2505 other than an inert gas (such as nitrogen or argon).

Note that an epoxy-based resin is preferably used as the sealant 2505. The material preferably allows as little moisture and oxygen as possible to penetrate. As the sealing substrate 2504, a plastic substrate formed of FRP (Fiberglass-Reinforced Plastics), PVF (polyvinyl fluoride), Mylar, polyester, acrylic, or the like can be used other than a glass substrate or a quartz substrate.

Variation in luminance among pixels or fluctuation in luminance of a pixel over time can be suppressed by using and operating any of the pixels described in Embodiment Modes 1 to 7 for the pixel portion 2502, and thus a display device with a higher duty ratio and higher quality can be obtained. In addition, power consumption can be reduced in the present invention because operation is performed with the opposite electrode fixed at a constant potential.

By forming the signal line driver circuit 2501, the pixel portion 2502, the first scan line driver circuit 2503, and the second scan line driver circuit 2506 over the same substrate as shown in FIGS. 25A and 25B, cost of the display device can be reduced. In this case, a manufacturing process can be simplified by using transistors with single polarity for the signal line driver circuit 2501, the pixel portion 2502, the first scan line driver circuit 2503, and the second scan line driver circuit 2506. Accordingly, a further cost reduction can be achieved.

The display device of the present invention can be obtained as described above. Note that the above-described structure is one example and a structure of the display device of the present invention is not limited to this.

Figure 26A:
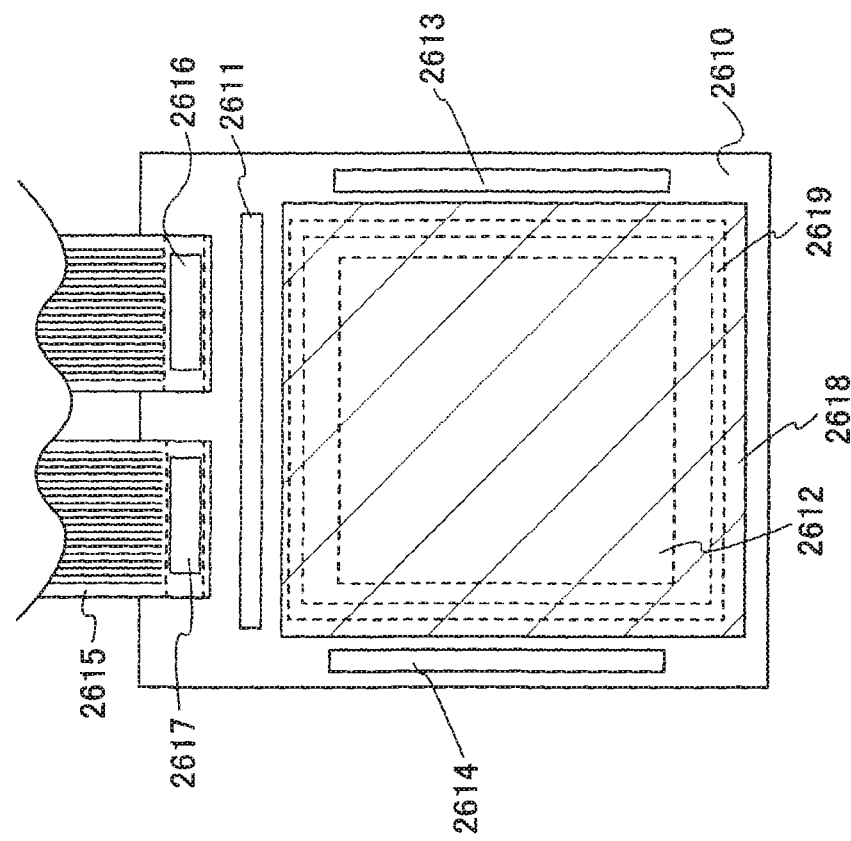
FIGS. 26A and 26B are diagrams illustrating display devices described in Embodiment Mode 9.

Note that the structure of the display device may be that in which a signal line driver circuit 2601 is formed on an IC chip and the IC chip is mounted on a display device by COG or the like as shown in FIG. 26A. Note that a substrate 2600, a pixel portion 2602, a first scan line driver circuit 2603, a second scan line driver circuit 2604, an FPC 2605, an IC chip 2606, an IC chip 2607, a sealing substrate 2608, and a sealant 2609 of FIG. 26A correspond to the substrate 2510, the pixel portion 2502, the first scan line driver circuit 2503, the second scan line driver circuit 2506, the FPC 2509, the IC chip 2518, the IC chip 2519, the sealing substrate 2504, and the sealant 2505 in FIG. 25A, respectively.

In other words, only a signal line driver circuit of which high speed operation is required is formed on an IC chip using a CMOS or the like to reduce power consumption. In addition, higher-speed operation and lower power consumption can be achieved by using a semiconductor chip made of a silicon wafer or the like as the IC chip.

Note that cost reduction can be achieved by forming the first scan line driver circuit 2603 and the second scan line driver circuit 2604 over the same substrate as the pixel portion 2602. A further cost reduction can be achieved by forming the first scan line driver circuit 2603, the second scan line driver circuit 2604, and the pixel portion 2602 using transistors with single polarity. At the time, a decrease in output potential can be prevented by using boot trap circuits for the first scan line driver circuit 2603 and the second scan line driver circuit 2604. In addition, in the case of using amorphous silicon for semiconductor layers of transistors included in the first scan line driver circuit 2603 and the second scan line driver circuit 2604, the threshold voltage of each transistor varies due to deterioration. Therefore, it is preferable to provide a function to correct the variation.

Variations in luminance among pixels or fluctuation in luminance of a pixel over time can be suppressed by using and operating any of the pixels described in Embodiment Modes 1 to 7 for the pixel portion 2602, and thus, a display device with a higher duty ratio and higher quality can be obtained. In addition, power consumption can be reduced in the present invention because operation is performed with an opposite electrode fixed at a constant potential. In addition, a substrate area can be used efficiently by mounting an IC chip provided with a functional circuit (a memory or a buffer) on a connection portion of the FPC 2605 and the substrate 2600.

Figure 26B:
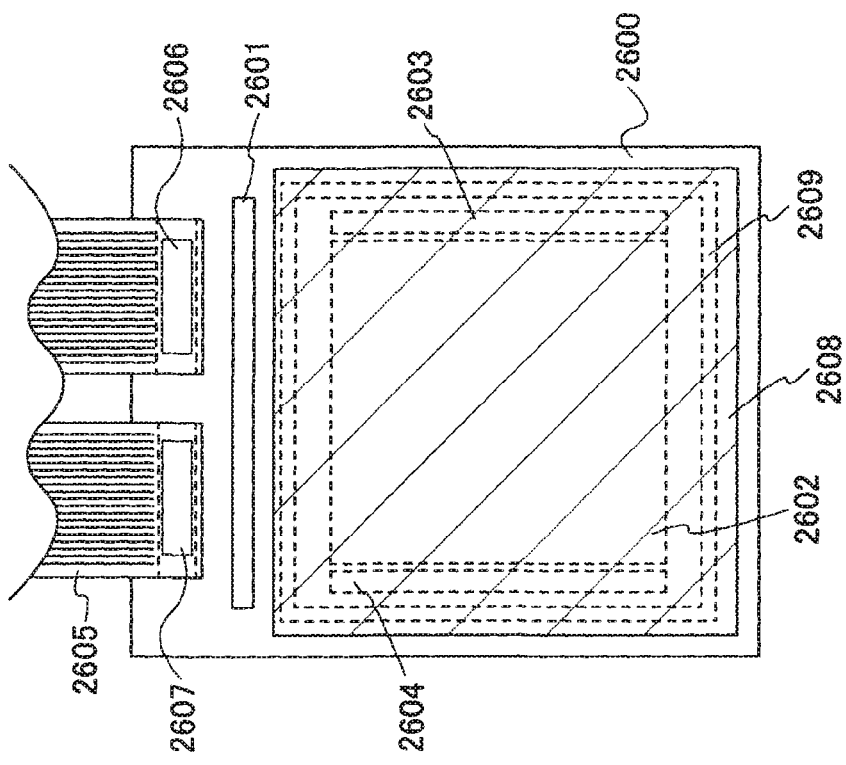

In addition, a structure may be employed in which a signal line driver circuit 2611, a first scan line driver circuit 2613, and a second scan line driver circuit 2614 corresponding to the signal line driver circuit 2501, the first scan line driver circuit 2503, and the second scan line driver circuit 2506 of FIG. 25A are formed on IC chips and the IC chips are mounted on a display device by COG or the like as shown in FIG. 26B. Note that a substrate 2610, a pixel portion 2612, an FPC 2615, an IC chip 2616, an IC chip 2617, a sealing substrate 2618, and a sealant 2619 of FIG. 26B correspond to the substrate 2510, the pixel portion 2502, the FPC 2509, the IC chip 2518, the IC chip 2519, the sealing substrate 2504, and the sealant 2505 of FIG. 25A, respectively.

Cost reduction can be achieved by using a non-crystalline semiconductor film, for example, an amorphous silicon (a-Si:H) film for the semiconductor layer of the transistor of the pixel portion 2612. Further, a large-sized display panel can also be manufactured.

Figure 27A:
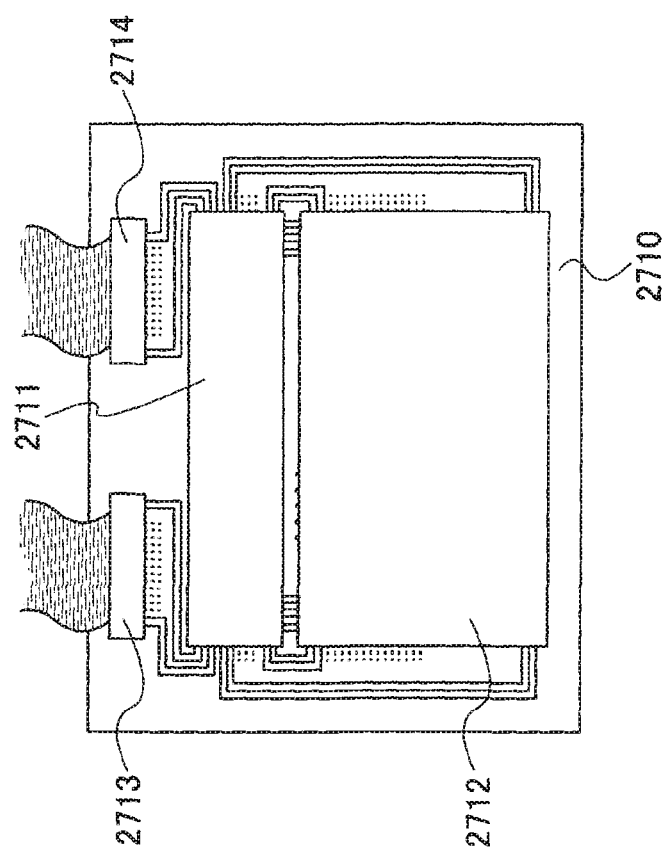
FIGS. 27A and 27B are diagrams illustrating display devices described in Embodiment Mode 9.

Further, the first scan line driver circuit, the second scan line driver circuit, and the signal line driver circuit are not necessarily provided in a row direction and a column direction of the pixels. For example, a peripheral driver circuit 2701 formed on an IC chip as shown in FIG. 27A may have functions of the first scan line driver circuit 2613, the second scan line driver circuit 2614, and the signal line driver circuit 2611 shown in FIG. 26B. Note that a substrate 2700, a pixel portion 2702, an FPC 2704, an IC chip 2705, an IC chip 2706, a sealing substrate 2707, and a sealant 2708 of FIG. 27A correspond to the substrate 2510, the pixel portion 2502, the FPC 2509, the IC chip 2518, the IC chip 2519, the sealing substrate 2504, and the sealant 2505 of FIG. 25A, respectively.

Figure 27B:
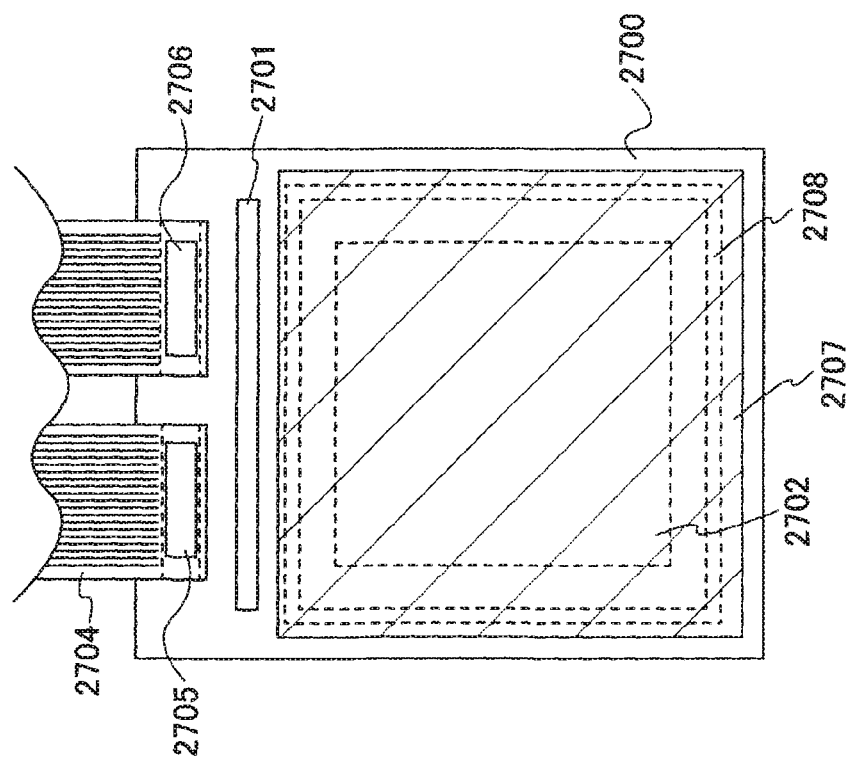

Note that a schematic diagram illustrating the connection of wirings of the display device of FIG. 27A is shown in FIG. 27B. FIG. 27B shows a substrate 2710, a peripheral driver circuit 2711, a pixel portion 2712, an FPC 2713, and an FPC 2714.

The FPC 2713 and the FPC 2714 input a signal and a power supply potential from outside to the peripheral driver circuit 2711. Then, an output from the peripheral driver circuit 2711 is inputted to wirings in a row direction and a column direction connected to pixels included in the pixel portion 2712.

In addition, in the case of using a white light emitting element as the light emitting element, full color display can be realized by providing the sealing substrate with color filters. The present invention can be applied to such a display device. FIG. 28 shows an example of a fragmentary sectional view of a pixel portion.

As shown in FIG. 28, a base film 2802 is formed over a substrate 2800; a transistor 2801 which controls a current value supplied to a light emitting element is formed thereover; and a pixel electrode 2803 is formed in contact with a first electrode of the transistor 2801. A layer 2804 containing a light emitting substance and an opposite electrode 2805 are formed thereover.

Note that a portion where the layer 2804 containing a light emitting substance is sandwiched between the pixel electrode 2803 and the opposite electrode 2805 serves as the light emitting element. Note that white light is emitted in FIG. 28. A red color filter 2806R, a green color filter 2806G and a blue color filter 2806B are provided above the light emitting elements respectively to achieve full-color display. In addition, a black matrix (also referred to as a "BM") 2807 is provided to separate these color filters.

The display device of this embodiment mode can be appropriately combined with the structure described in Embodiment Mode 8 as well as those in Embodiment Modes 1 to 7. In addition, a structure of a display device is not limited to that described above, and the present invention can also be applied to a display device having another structure.

Embodiment Mode 10

The display device of the present invention can be applied to various electronic devices. Specifically, it can be applied to a display portion of an electronic device. Note that examples of electronic devices are as follows: a camera such as a video camera or a digital camera, a goggle type display, a navigation system, an audio-reproducing device (car audio, an audio component, or the like), a computer, a game machine, a portable information terminal (a mobile computer, a mobile phone, a mobile game machine, an electronic book, or the like), an image-reproducing device having a recording medium (specifically, a device for reproducing a recording medium such as a digital versatile disc (DVD) and having a display for displaying the reproduced image), and the like.

Figure 33A:
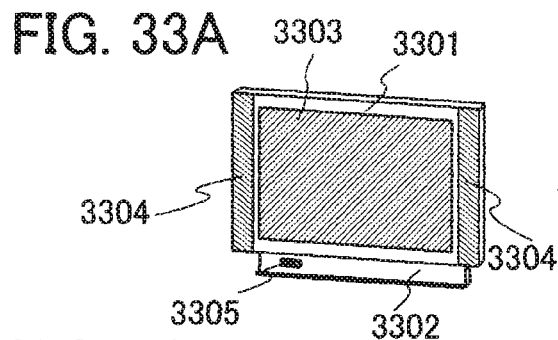
FIGS. 33A to 33H are diagrams illustrating electronic devices to which the present invention can be applied.

FIG. 33A shows a display, which includes a chassis 3301, a support 3302, a display portion 3303, a speaker portion 3304, a video input terminal 3305, and the like.

Note that the pixel described in any of Embodiment Modes 1 to 7 is used for the display portion 3303. According to the present invention, variation in luminance among pixels or fluctuation in luminance of a pixel over time can be suppressed and a display including a display portion with a higher duty ratio and higher quality can be obtained. In addition, power consumption can be reduced in the present invention because operation is performed with an opposite electrode fixed at a constant potential. Note that the display includes in its category all display devices used for displaying information, for example, for a personal computer, for TV broadcast reception, for advertisement display, or the like.

Note that while needs for an increase in display size have been increasing, an increase in price associated with the increase in display size has become an issue. Therefore, it is an essential task to reduce manufacturing cost and set the price of a high-quality product as low as possible.

Since the pixel of the present invention can be manufactured using transistors with single polarity, the number of steps can be reduced and manufacturing cost can be reduced. A process can be simplified and a further cost reduction can be achieved by using a non-crystalline semiconductor film, for example, an amorphous silicon (a-Si:H) film for a semiconductor layer of each transistor included in the pixel. In this case, a driver circuit on the periphery of a pixel portion is preferably formed on an IC chip and the IC chip is mounted on a display panel by COG (Chip On Glass) or the like. Note that a signal line driver circuit with high operation speed may be formed on an IC chip, and a scan line driver circuit with relatively low operation speed may be formed using a circuit including transistors with single polarity over the same substrate as a pixel portion.

Figure 33B:
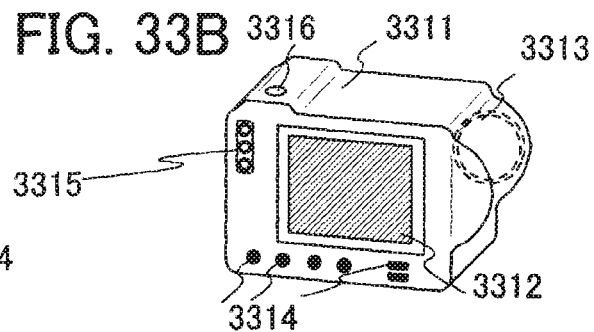

FIG. 33B shows a camera, which includes a main body 3311, a display portion 3312, an image receiving portion 3313, an operation key 3314, an external connection port 3315, a shutter 3316, and the like.

Note that the pixel described in any of Embodiment Modes 1 to 7 is used for the display portion 3312. According to the present invention, variation in luminance among pixels or fluctuation in luminance of a pixel over time can be suppressed, and a camera including a display portion with a higher duty ratio and higher quality can be obtained.

In addition, power consumption can be reduced in the present invention because operation is performed with an opposite electrode fixed at a constant potential.

In addition, competitive manufacturing of a digital camera or the like has been intensified with an improvement in performance. Therefore, it is vital to set the price of a high-performance product as low as possible.

Since the pixel of the present invention can be manufactured using transistors with single polarity, the number of steps can be reduced and manufacturing cost can be reduced. A process can be simplified and a further cost reduction can be achieved by using a non-crystalline semiconductor film, for example, an amorphous silicon (a-Si:H) film for a semiconductor layer of each transistor included in the pixel. In this case, a driver circuit on the periphery of a pixel portion is preferably formed on an IC chip and the IC chip is mounted on a display panel by COG or the like. Note that a signal line driver circuit with high operation speed may be formed on an IC chip, and a scan line driver circuit with relatively low operation speed may be formed using a circuit including transistors with single polarity over the same substrate as a pixel portion.

Figure 33C:
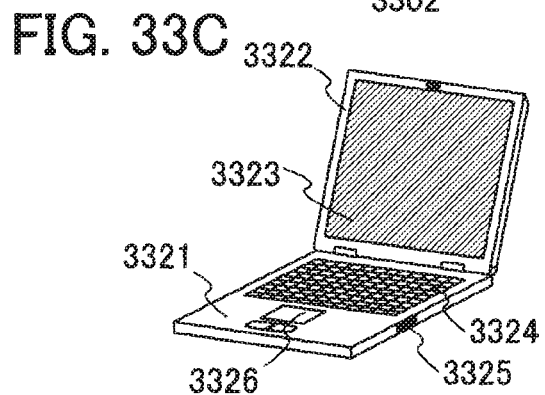

FIG. 33C shows a computer, which includes a main body 3321, a chassis 3322, a display portion 3323, a keyboard 3324, an external connection port 3325, a pointing mouse 3326, and the like. Note that the pixel described in any of Embodiment Modes 1 to 7 is used for the display portion 3323. According to the present invention, variation in luminance among pixels or fluctuation in luminance of a pixel over time can be suppressed and a computer including a display portion with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

Figure 33D:
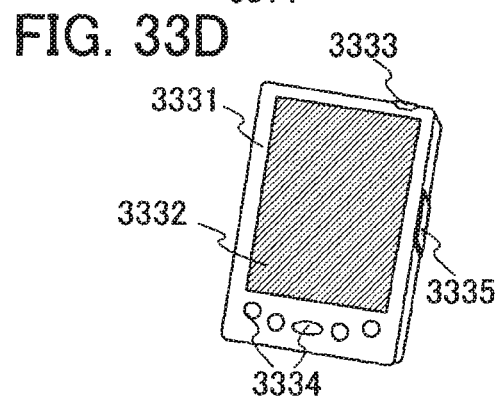

FIG. 33D shows a mobile computer, which includes a main body 3331, a display portion 3332, a switch 3333, an operation key 3334, an infrared port 3335, and the like. Note that the pixel described in any of Embodiment Modes 1 to 7 is used for the display portion 3332. According to the present invention, variation in luminance among pixels or fluctuation in luminance of a pixel over time can be suppressed and a mobile computer including a display portion with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

Figure 33E:
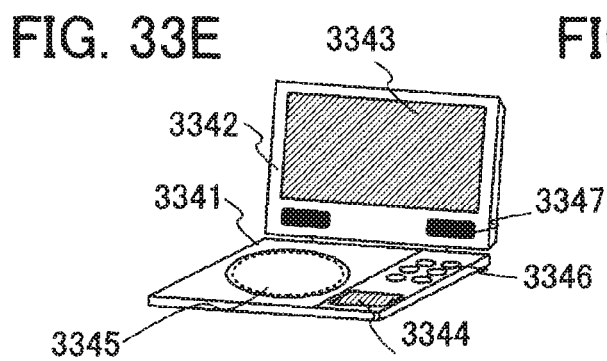

FIG. 33E shows a portable image reproducing device provided with a recording medium (specifically, a DVD player), which includes a main body 3341, a chassis 3342, a display portion A 3343, a display portion B 3344, a recording medium (DVD or the like) reading portion 3345, an operation key 3346, a speaker portion 3347, and the like. The display portion A 3343 mainly displays image information, and the display portion B 3344 mainly displays character information. Note that the pixel described in any of Embodiment Modes 1 to 7 is used for the display portion A 3343 and the display portion B 3344. According to the present invention, variation in luminance among pixels or fluctuation in luminance of a pixel over time can be suppressed and an image reproducing device including a display portion with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

Figure 33F:
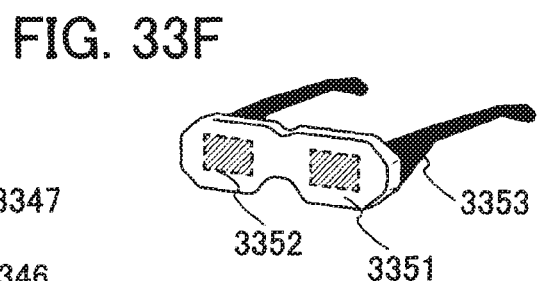

FIG. 33F shows a goggle type display, which includes a main body 3351, a display portion 3352, an arm portion 3353, and the like. Note that the pixel described in any of Embodiment Modes 1 to 7 is used for the display portion 3352. According to the present invention, variation in luminance among pixels or fluctuation in luminance of a pixel over time can be suppressed and a goggle type display including a display portion with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

Figure 33G:
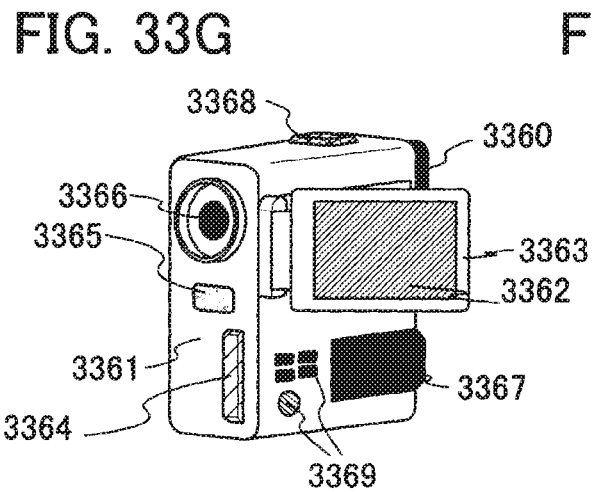

FIG. 33G shows a video camera, which includes a main body 3361, a display portion 3362, a chassis 3363, an external connection port 3364, a remote control receiving portion 3365, an image receiving portion 3366, a battery 3367, an audio input portion 3368, an operation key 3369, an eye piece portion 3360, and the like. Note that the pixel described in any of Embodiment Modes 1 to 7 is used for the display portion 3362. According to the present invention, variation in luminance among pixels or fluctuation in luminance of a pixel over time can be suppressed and a video camera including a display portion with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

Figure 33H:
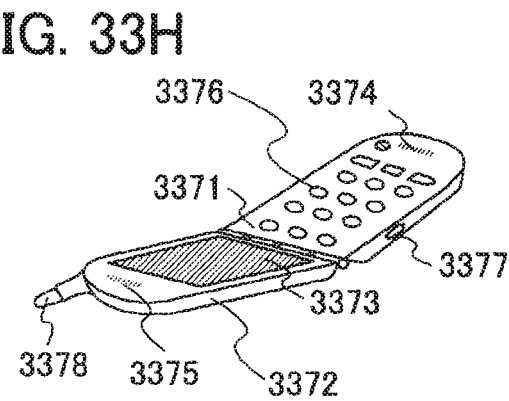

FIG. 33H shows a mobile phone, which includes a main body 3371, a chassis 3372, a display portion 3373, an audio input portion 3374, an audio output portion 3375, an operation key 3376, an external connection port 3377, an antenna 3378, and the like. Note that the pixel described in any of Embodiment Modes 1 to 7 is used for the display portion 3373. According to the present invention, variation in luminance among pixels or fluctuation in luminance of a pixel over time can be suppressed and a mobile phone including a display portion with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

As described above, the present invention can be applied to all electronic devices.

Embodiment Mode 11

Figure 34:
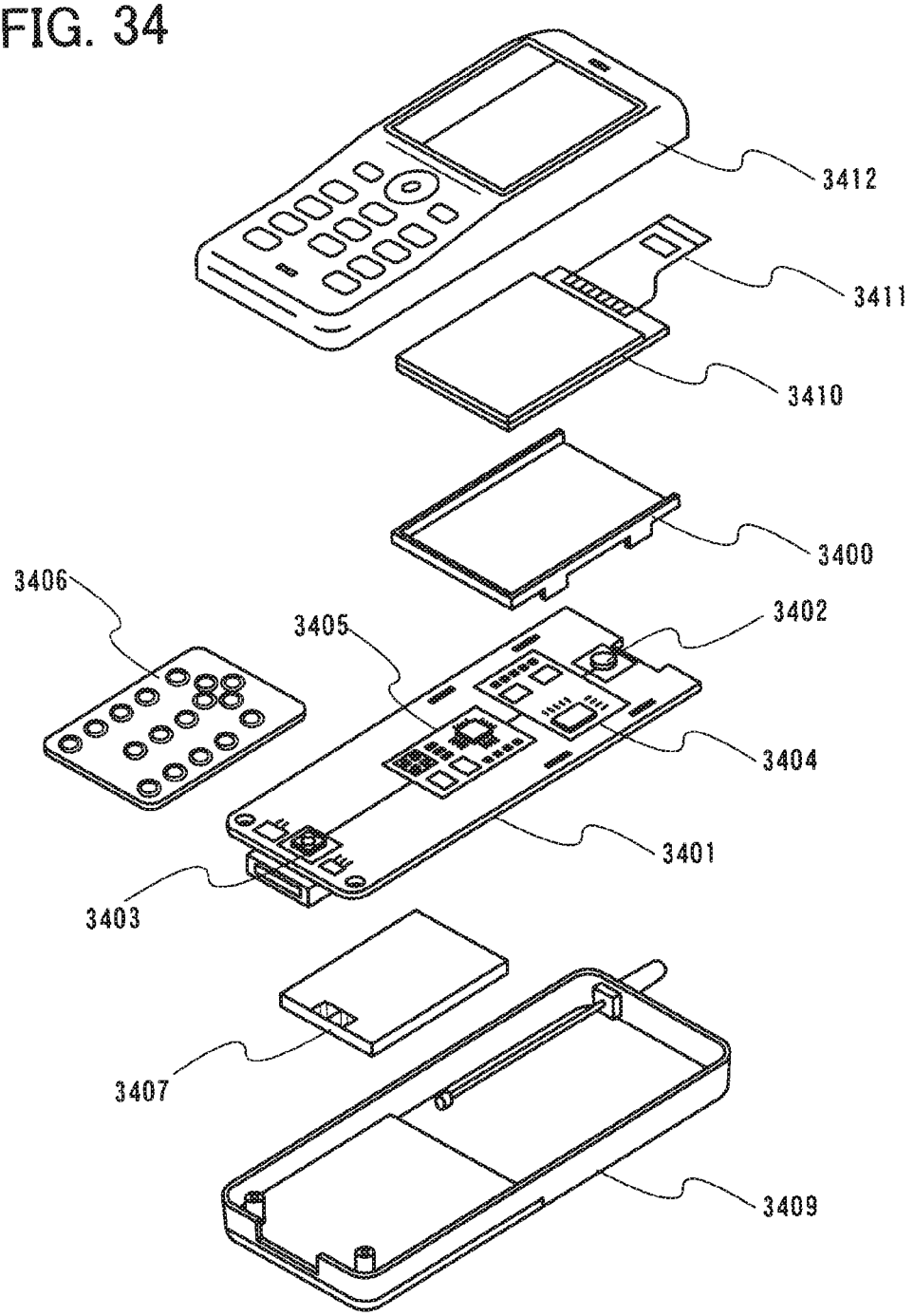
FIG. 34 is a diagram showing a configuration example of a cellular phone.

In this embodiment mode, an exemplary structure of a mobile phone including the display device of the present invention in a display portion is explained with reference to FIG. 34.

A display panel 3410 is incorporated in a housing 3400 so as to be detachable. The shape and size of the housing 3400 can be appropriately changed in accordance with the size of the display panel 3410. The housing 3400 to which the display panel 3410 is fixed is fitted in a printed circuit board 3401 and assembled as a module.

The display panel 3410 is connected to the printed circuit board 3401 through an FPC 3411. The printed circuit board 3401 is provided with a speaker 3402, a microphone 3403, a transmitting/receiving circuit 3404, and a signal processing circuit 3405 including a CPU, a controller, and the like. Such a module, an input means 3406, and a buttery 3407 are combined and stored in a chassis 3409 and a chassis 3412. Note that a pixel portion of the display panel 3410 is arranged so as to be seen from a window formed in the chassis 3412.

In the display panel 3410, the pixel portion and a part of peripheral driver circuits (a driver circuit having a low operation frequency among a plurality of driver circuits) may be formed using transistors over the same substrate, and another part of the peripheral driver circuits (a driver circuit having a high operation frequency among the plurality of driver circuits) may be formed on an IC chip. The IC chip may be mounted on the display panel 3410 by COG (Chip On Glass). The IC chip may alternatively be connected to a glass substrate using TAB (Tape Automated Bonding) or a printed circuit board. Further, all of the peripheral driver circuits may be formed on an IC chip and the IC chip may be mounted on a display panel by COG or the like.

Note that the pixel described in any of Embodiment Modes 1 to 7 is used for the pixel portion. According to the present invention, variation in luminance among pixels or fluctuation in luminance of a pixel over time can be suppressed and the display panel 3410 including a display portion with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

The structure of a mobile phone described in this embodiment mode is one example, and the display device of the invention can be applied not only to the mobile phone having the above-described structure but also to mobile phones having various kinds of structures.

Embodiment Mode 12

In this embodiment mode, an EL module obtained by combining a display panle and a circuit board is explained with reference to FIGS. 35 and 36.

Figure 35:
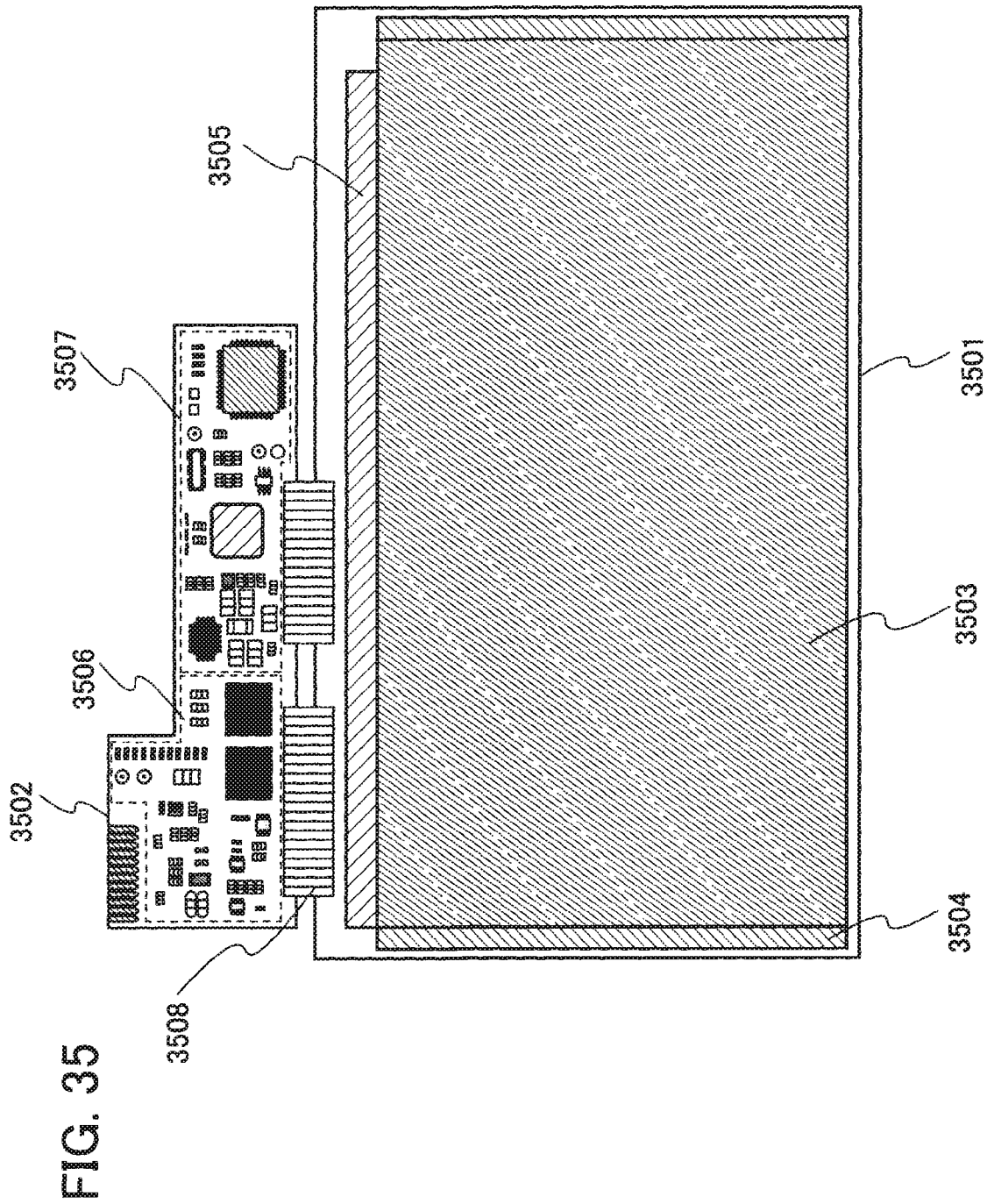
FIG. 35 is a diagram showing an example of an EL module.
Figure 36:
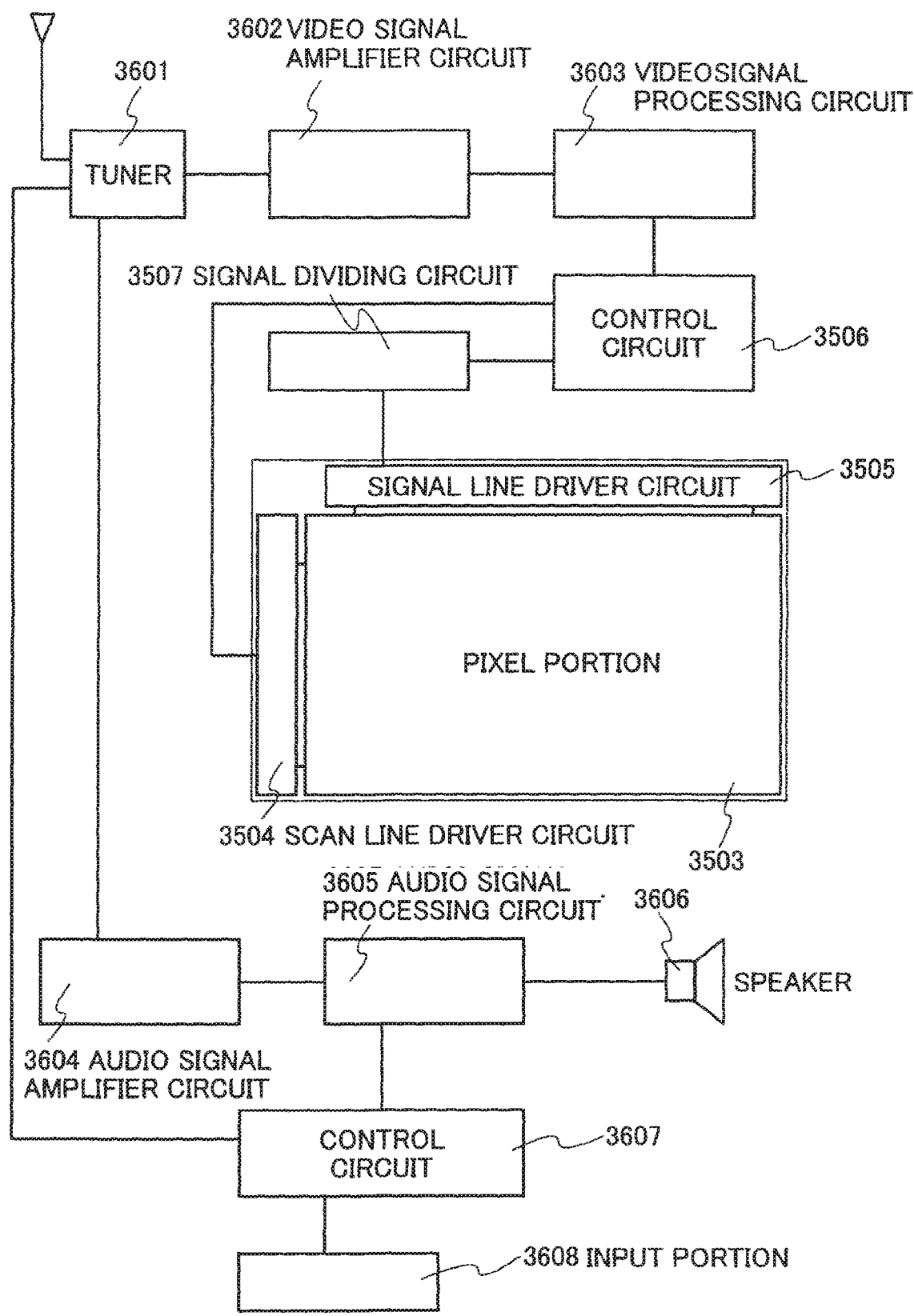
FIG. 36 is a block diagram showing main components of an EL television receiver.

As shown in FIG. 35, a display panel 3501 includes a pixel portion 3503, a scan line driver circuit 3504, and a signal line driver circuit 3505. Over a circuit board 3502, for example, a control circuit 3506, a signal dividing circuit 3507, and the like are formed. Note that the display panel 3501 and the circuit board 3502 are connected to each other by a connection wiring 3508. As the connection wiring 3508, an FPC or the like can be used.

In the display panel 3501, the pixel portion and a part of peripheral driver circuits (a driver circuit having a low operation frequency among a plurality of driver circuits) may be formed using transistors over the same substrate, and another part of the peripheral driver circuits (a driver circuit having a high operation frequency among the plurality of driver circuits) may be formed on an IC chip. The IC chip may be mounted on the display panel 3501 by COG (Chip On Glass). The IC chip may alternatively be connected to a glass substrate using TAB (Tape Automated Bonding) or a printed circuit board. Further, all of the peripheral driver circuits may be formed on an IC chip and the IC chip may be mounted on a display panel by COG or the like.

Note that the pixel described in any of Embodiment Modes 1 to 7 is used for the pixel portion. According to the present invention, variation in luminance among pixels or fluctuation in luminance of a pixel over time can be suppressed and the display panel 3501 with a higher duty ratio and higher quality can be obtained. In addition, power consumption can be reduced in the present invention because operation is performed with an opposite electrode fixed at a constant potential. A cost reduction can be achieved by using transistors with single polarity for transistors included in the pixel portion and a non-crystalline semiconductor film for semiconductor layers of the transistors.

An EL TV receiver can be completed with this EL module. FIG. 36 is a block diagram showing the main structure of an EL TV receiver. A tuner 3601 receives a video signal and an audio signal. The video signal is processed by a video signal amplifier circuit 3602, a video signal processing circuit 3603 for converting a signal outputted from the video signal amplifier circuit 3602 into a color signal corresponding to each color of red, green and blue, and a control circuit 3506 for converting the video signal into a signal which meets the input specification of a driver circuit. The control circuit 3506 outputs respective signals to a scan line side and a signal line side. In the case of performing a digital drive, it is possible to adopt a structure in which the signal dividing circuit 3507 is provided on the signal line side to supply an input digital signal divided into m pieces.

The audio signal among the signals received by the tuner 3601 is transmitted to an audio signal amplifier circuit 3604, the output of which is supplied to a speaker 3606 through an audio signal processing circuit 3605. A control circuit 3607 receives control information of a receiving station (reception frequency) or sound volume from an input portion 3608 and transmits signals to the tuner 3601 and the audio signal processing circuit 3605.

By incorporating the EL module in FIG. 35 into the chassis 3301 of FIG. 33A described in Embodiment Mode 10, a TV receiver can be completed.

Naturally, the present invention is not limited to the TV receiver, and can be applied to various uses particularly as a large-sized display medium such as an information display board at a train station, an airport, or the like, or an advertisement display board on the street, as well as a monitor of a personal computer.

This application is based on Japanese Patent Application serial no. 2005-349165 filed in Japan Patent Office on Dec. 2, 2005, the contents of which are hereby incorporated by reference.

What is claimed is:

1. A display device comprising:
   a pixel comprising:
      a first transistor;
      a second transistor;
      a third transistor;
      a fourth transistor;
      a capacitor; and
      a light emitting element comprising a pixel electrode,
   wherein one of a source and a drain of the first transistor is directly connected to the light emitting element,
   wherein one of a source and a drain of the second transistor is directly connected to a gate of the first transistor,
   wherein one of a source and a drain of the third transistor is directly connected to the pixel electrode of the light emitting element,
   wherein one of a source and a drain of the fourth transistor is directly connected to the gate of the first transistor,
   wherein a first electrode of the capacitor is directly connected to the gate of the first transistor,
   wherein a second electrode of the capacitor is directly connected to the one of the source and the drain of the first transistor,
   wherein the other of the source and the drain of the first transistor is directly connected to a power supply line,
   wherein the other of the source and the drain of the second transistor is electrically connected to a signal line,
   wherein a gate of the second transistor is directly connected to a scan line,
   wherein the power supply line is parallel to the scan line,
   wherein the first transistor comprises a semiconductor layer over a substrate and a gate electrode over the semiconductor layer,
   wherein the light emitting element comprises a pixel electrode over an insulating film between the first transistor and the light emitting element,
   wherein the third transistor comprises a gate electrode,
   wherein the gate electrode of the third transistor and the pixel electrode do not overlap each other,
   wherein the first transistor is an n-channel transistor, and
   wherein the semiconductor layer comprises polysilicon.

2. The display device according to claim 1,
   wherein the other of the source and the drain of the second transistor is directly connected to the signal line.

3. The display device according to claim 1,
   wherein the other of the source and the drain of the third transistor is directly connected to a potential supply line.

4. The display device according to claim 1,
   wherein the other of the source and the drain of the fourth transistor is directly connected to the power supply line.

5. A display device comprising:
a pixel comprising:
   a first transistor;
   a second transistor;
   a third transistor;
   a fourth transistor;
   a capacitor; and
   a light emitting element comprising a pixel electrode,
wherein one of a source and a drain of the first transistor is directly connected to the light emitting element,
wherein one of a source and a drain of the second transistor is directly connected to a gate of the first transistor,
wherein one of a source and a drain of the third transistor is directly connected to the pixel electrode of the light emitting element,
wherein one of a source and a drain of the fourth transistor is directly connected to the gate of the first transistor,
wherein a first electrode of the capacitor is directly connected to the gate of the first transistor,
wherein a second electrode of the capacitor is directly connected to the one of the source and the drain of the first transistor,
wherein the other of the source and the drain of the first transistor is directly connected to a power supply line,
wherein the other of the source and the drain of the second transistor is electrically connected to a signal line,
wherein a gate of the second transistor is directly connected to a scan line,
wherein the power supply line is parallel to the scan line,
wherein the first transistor comprises a semiconductor layer over a substrate and a gate electrode over the semiconductor layer,
wherein the light emitting element comprises a pixel electrode over an insulating film between the first transistor and the light emitting element,
wherein the third transistor comprises a gate electrode,
wherein the gate electrode of the third transistor and the pixel electrode do not overlap each other,
wherein the first transistor is an n-channel transistor,
wherein the semiconductor layer comprises polysilicon, and
wherein a color filter is over the light emitting element.

6. The display device according to claim 5,
wherein the other of the source and the drain of the second transistor is directly connected to the signal line.

7. The display device according to claim 5,
wherein the other of the source and the drain of the third transistor is directly connected to a potential supply line.

8. The display device according to claim 5,
wherein the other of the source and the drain of the fourth transistor is directly connected to the power supply line.

9. A display device comprising:
a pixel comprising:
   a first transistor;
   a second transistor;
   a third transistor;
   a fourth transistor;
   a capacitor; and
   a light emitting element,
wherein one of a source and a drain of the first transistor is directly connected to the light emitting element,
wherein one of a source and a drain of the second transistor is directly connected to a gate of the first transistor,
wherein one of a source and a drain of the third transistor is directly connected to the light emitting element,
wherein one of a source and a drain of the fourth transistor is directly connected to the gate of the first transistor,
wherein a first electrode of the capacitor is directly connected to the gate of the first transistor,
wherein a second electrode of the capacitor is directly connected to the one of the source and the drain of the first transistor,
wherein the other of the source and the drain of the first transistor is directly connected to a power supply line,
wherein the other of the source and the drain of the second transistor is electrically connected to a signal line,
wherein the other of the source and the drain of the fourth transistor is directly connected to the power supply line,
wherein a gate of the second transistor is directly connected to a scan line,
wherein the power supply line is parallel to the scan line,
wherein the first transistor comprises a semiconductor layer over a substrate and a gate electrode over the semiconductor layer,
wherein the light emitting element comprises a pixel electrode over an insulating film between the first transistor and the light emitting element,
wherein the first transistor is an n-channel transistor,
wherein the semiconductor layer comprises polysilicon,
wherein the first electrode of the capacitor comprises a same material as the gate electrode of the first transistor, and
wherein the second electrode of the capacitor comprises a same material as the semiconductor layer.

10. The display device according to claim 9,
wherein the other of the source and the drain of the second transistor is directly connected to the signal line.

11. The display device according to claim 9,
wherein the other of the source and the drain of the third transistor is directly connected to a potential supply line.

* * * * *